United States Patent
Wakaiki et al.

(10) Patent No.: US 11,658,089 B2
(45) Date of Patent: May 23, 2023

(54) SEMICONDUCTOR DEVICE

(71) Applicant: Mitsubishi Electric Corporation, Tokyo (JP)

(72) Inventors: Shuji Wakaiki, Tokyo (JP); Shota Sato, Tokyo (JP); Kenta Fujii, Tokyo (JP); Takashi Kumagai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 228 days.

(21) Appl. No.: 16/770,025

(22) PCT Filed: Dec. 11, 2018

(86) PCT No.: PCT/JP2018/045379
§ 371 (c)(1),
(2) Date: Jun. 4, 2020

(87) PCT Pub. No.: WO2019/117107
PCT Pub. Date: Jun. 20, 2019

(65) Prior Publication Data
US 2020/0388550 A1 Dec. 10, 2020

(30) Foreign Application Priority Data
Dec. 14, 2017 (JP) .............................. JP2017-239520

(51) Int. Cl.
*H01L 23/367* (2006.01)
*H01L 21/48* (2006.01)

(52) U.S. Cl.
CPC ...... *H01L 23/3672* (2013.01); *H01L 21/4882* (2013.01)

(58) Field of Classification Search
CPC .................................................. H01L 23/3672
See application file for complete search history.

(56) References Cited

U.S. PATENT DOCUMENTS 5,258,887 A    11/1993   Fortune
5,708,566 A *   1/1998   Hunninghaus ....... H05K 1/0206
                                                                                          361/720
(Continued)

FOREIGN PATENT DOCUMENTS

DE       4107312 A1    9/1992
DE    60034014 T2   12/2007
(Continued)

OTHER PUBLICATIONS

International Search Report (with English Translation) and Written Opinion issued in corresponding International Patent Application No. PCT/JP2018/045379, 12 pages (dated Feb. 26, 2019).
(Continued)

*Primary Examiner* — Peniel M Gumedzoe
(74) *Attorney, Agent, or Firm* — Buchanan Ingersoll & Rooney PC

(57) ABSTRACT

The present invention relates to a semiconductor device including a printed circuit board, an electronic component, and a heat diffusion part. The printed circuit board includes an insulation layer, first and second conductor layers disposed respectively on first and second main faces of the insulation layer, a plurality of heat radiation vias penetrating from the first conductor layer to the second conductor layer on the insulation layer, and a conductor film covering inner side walls of the heat radiation vias. The heat radiation vias are provided at positions overlapping the electronic component and the heat radiation part in plan view viewed from the first main face of the printed circuit board. The heat diffusion part is disposed overlapping at least some of the heat radiation vias in plan view viewed from the second main face of the printed circuit board.

15 Claims, 57 Drawing Sheets

(56) References Cited

U.S. PATENT DOCUMENTS

| | | | | |
|---|---|---|---|---|
| 6,058,013 | A | * | 5/2000 | Christopher ........ H01L 23/3677 174/16.3 |
| 2011/0156244 | A1 | * | 6/2011 | Lou ....................... H01L 23/367 257/713 |
| 2014/0080940 | A1 | | 3/2014 | Lee et al. |
| 2015/0181739 | A1 | | 6/2015 | Fukuda et al. |
| 2018/0343736 | A1 | | 11/2018 | Sato et al. |

FOREIGN PATENT DOCUMENTS

| | | |
|---|---|---|
| DE | 112016005508 T5 | 9/2018 |
| EP | 1113495 B1 | 3/2007 |
| EP | 2129197 A1 | 2/2009 |
| JP | H03250794 A | 11/1991 |
| JP | H05326761 A | 12/1993 |
| JP | H0677679 A | 3/1994 |
| JP | H11345921 A | 12/1999 |
| JP | 2004006791 A | 1/2004 |
| JP | 2014027121 A | 2/2014 |
| WO | 2014020787 A1 | 2/2014 |
| WO | 2017094670 A1 | 6/2017 |
| WO | 2017208802 A1 | 12/2017 |

OTHER PUBLICATIONS

Office Action dated Apr. 29, 2021, in corresponding German Patent Application No. 112018006370.4 and English translation of the Office Action. (14 pages).

Office Action dated Jan. 5, 2021, issued in corresponding Japanese Patent Application No. 2019559639, 10 pages including 5 pages of English translation.

Chinese Office Action issued CN Application No. 201880073690.X; dated Mar. 9, 2023. 18 Pages (with English Translation).

* cited by examiner

F I G. 4 2
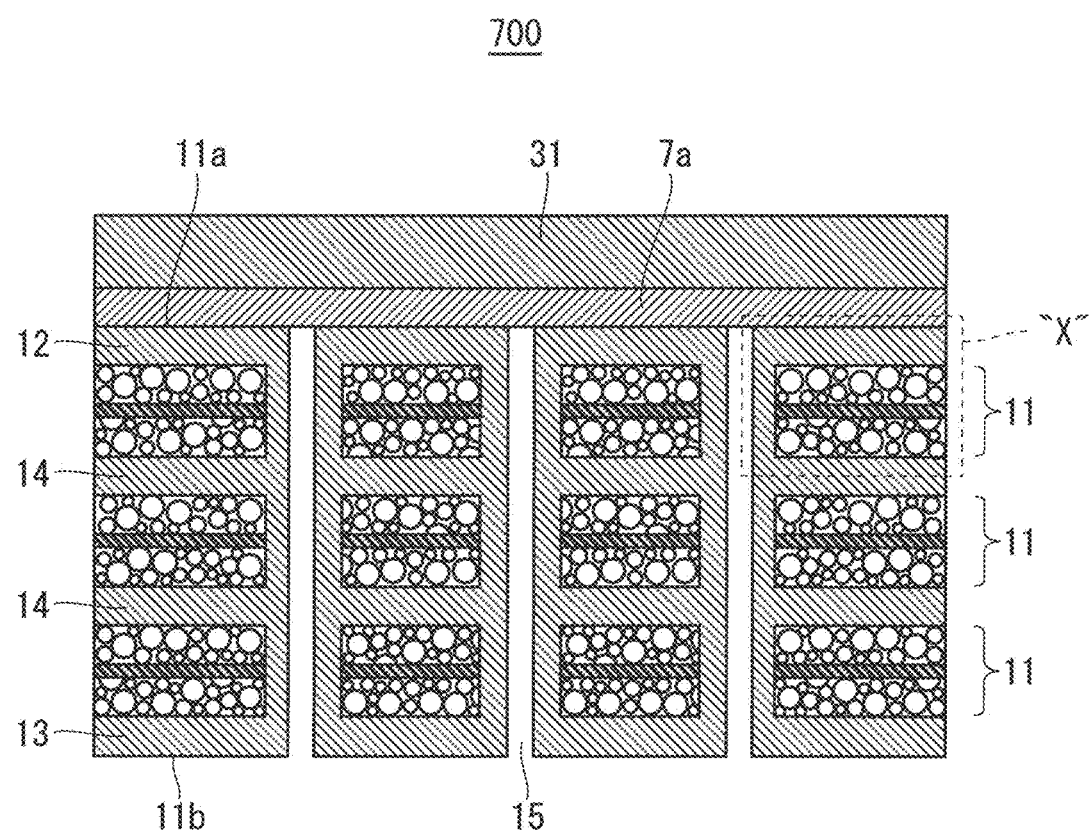

SEMICONDUCTOR DEVICE

TECHNICAL FIELD

The present invention relates to a semiconductor device, and in particular to a semiconductor device with an improved capability of radiating heat generated by electronic components configuring the semiconductor device.

BACKGROUND ART

Vehicle-mounted semiconductor devices mounted on vehicles such as automobiles and industrial construction machines, semiconductor devices for vehicles mounted on railway vehicles or the like, semiconductor devices for industrial equipment mounted on equipment such as processing machines, robots, and industrial inverters, and semiconductor devices used in household electronic equipment are hereinafter collectively referred to as "semiconductor devices." These semiconductor devices are strongly required to have higher power and become smaller in size and thicknesses. Due to this, the heating values per unit volume of electronic components mounted on the semiconductor devices tend to rise sharply, and there is strong demand for semiconductor devices with high heat radiation capabilities.

For example, Patent Documents 1 and 2 disclose semiconductor devices that radiate heat generated by electronic components. Configurations according to these patent documents are such that an electronic component is mounted on the upper face of a printed circuit board, and a heatsink is bonded to the lower face of the printed circuit board. The printed circuit board includes a heat-conduction channel that penetrates from the upper to the lower face of the printed circuit board. With this heat-conduction channel, the heat generated by the electronic component is conducted via the heat-conduction channel to the heatsink and radiated from the heatsink to the outside.

In the semiconductor device disclosed in Patent Document 1, the printed circuit board has a heat-conduction channel only in a portion away from directly below the electronic component. In the semiconductor device disclosed in Patent Document 2, the printed circuit board has a hole for heat conduction only in a portion directly below the electronic component. Therefore, in either of these cases, the printed circuit board has a small-area region capable of heat conduction and can conduct only a small amount of heat from the electronic component, which results in an insufficient heat radiation capability in a region ranging from the electronic component to the heatsink located therebelow. Besides, in the semiconductor device disclosed in Patent Document 1, which is mounted on the printed circuit board with a fastening plate, fasteners such as screws are used for mounting, and an air space may be created between the printed circuit board and the heatsink. Therefore, the semiconductor device may have an unsatisfactory heat radiation capability.

According to Patent Document 3, holes for heat conduction are also provided in portions other than directly below an electronic component, but most of the heat generated by the electronic component is conducted through holes for heat conduction provided directly below the electronic component. Therefore, the printed circuit board has high heat resistance and accordingly has an insufficient heat radiation capability.

PRIOR ART DOCUMENTS

Patent Documents

Patent Document 1: Japanese Patent Application Laid-Open No. 6-77679
Patent Document 2: Japanese Patent Application Laid-Open No. 11-345921
Patent Document 3: International Publication No. 2017/094670

SUMMARY

Problem to be Solved by the Invention

As described above, conventional semiconductor devices hardly have sufficient heat radiation capabilities. The present invention has been made in order to solve problems as described above, and it is an object of the present invention to provide a semiconductor device with an improved capability of radiating heat generated by electronic components configuring the semiconductor device.

Means to Solve the Problem

The semiconductor device according to the present invention includes a printed circuit board, a heat diffusion part bonded to a first main face of the printed circuit board with a first bonding material, an electronic component including a heat radiator plate bonded to the heat diffusion part with a second bonding material, and a heat radiation part disposed on a second main face of the printed circuit board. The printed circuit board includes an insulation layer, first and second conductor layers disposed respectively on first and second main faces of the insulation layer, a plurality of heat radiation vias penetrating from the first conductor layer to the second conductor layer on the insulation layer, and a conductor film covering inner walls of the plurality of heat radiation vias. The plurality of heat radiation vias is provided at positions overlapping the heat diffusion part and the electronic component in plan view viewed from the first main face of the printed circuit board. The heat radiation part is disposed overlapping at least some of the plurality of heat radiation vias in plan view viewed from the second main face of the printed circuit board, and includes a heat radiation member having electrical insulating properties and thermal conductivity; and a coolant having thermal conductivity. The heat radiation member and the coolant are disposed on the second conductor layer of the printed circuit board.

Effects of Invention

According to the semiconductor device of the present invention, the heat generated by the electronic component can be diffused by the heat diffusion part and can be radiated directly below the electronic component through the heat radiation vias that overlap the electronic component. Accordingly, it is possible to improve the capability of radiating heat generated by the electronic component.

BRIEF DESCRIPTION OF DRAWINGS

FIG. 42 is a partial sectional view illustrating a configuration of a semiconductor device according to Embodiment 7 of the present invention;

DESCRIPTION OF EMBODIMENTS

Figure 1:
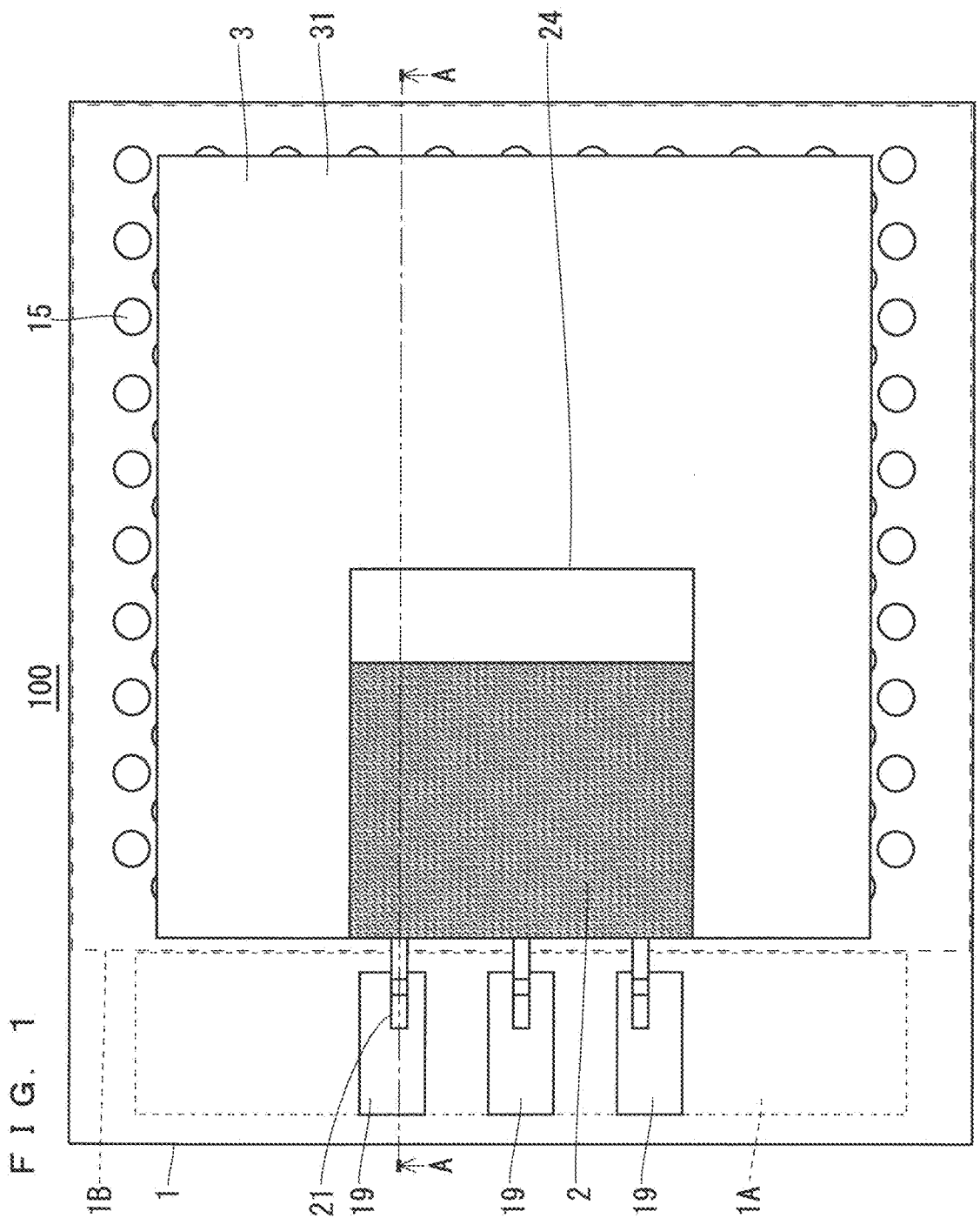
FIG. 1 is a plan view illustrating a configuration of a semiconductor device according to Embodiment 1 of the present invention.

Embodiments of the present invention will be described hereinafter with reference to the drawings. In FIG. 1 onward, identical or corresponding parts are given the same reference signs, and redundant descriptions thereof will not be given. Each drawing is a schematic view and does not reflect the precise dimensions or the like of illustrated constituent elements.

Embodiment 1

Device Configuration

Figure 2:
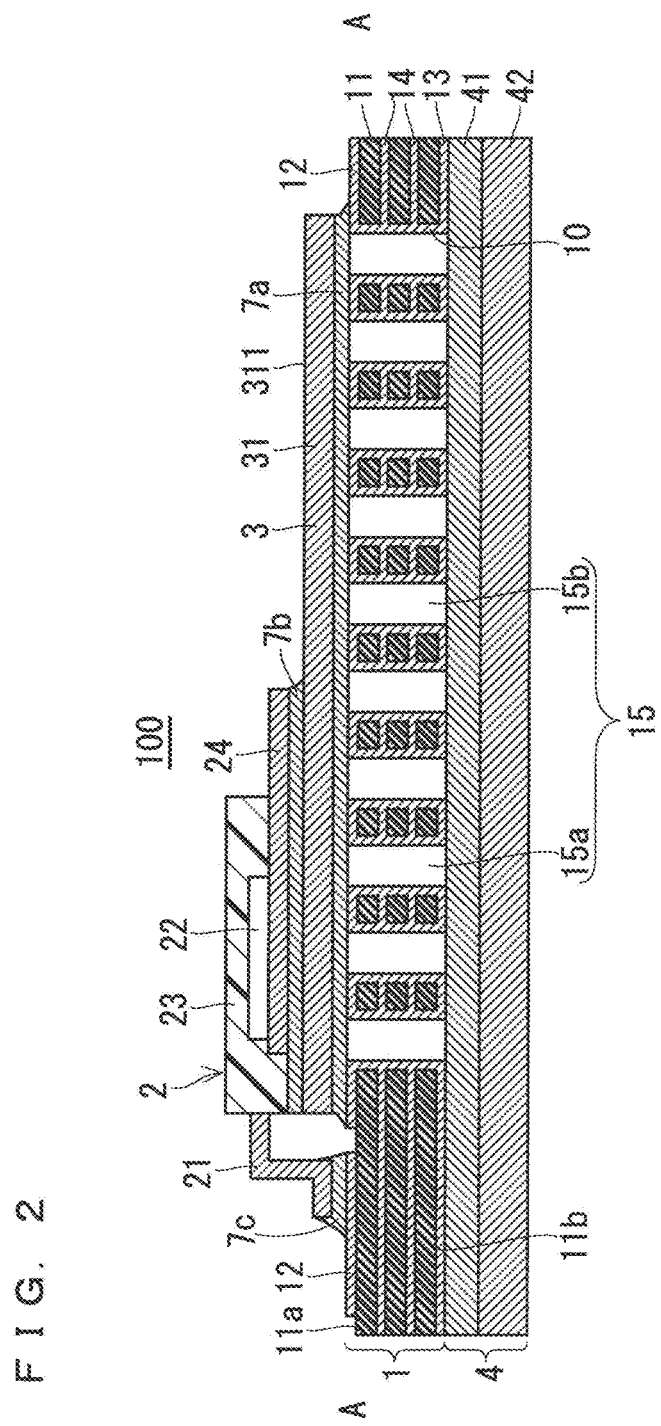
FIG. 2 is a sectional view illustrating the configuration of the semiconductor device according to Embodiment 1 of the present invention.

FIG. 1 is a plan view illustrating a configuration of a semiconductor device 100 according to Embodiment 1 of the present invention and a top view of the semiconductor device 100, viewed from above. FIG. 2 is a sectional view taken along arrows A-A in FIG. 1. In the following description, the face of a printed circuit board 1 on which an electronic component 2 is mounted is referred to as an upper face, and the face on the opposite side thereof as a lower face, and the upper side of the semiconductor device 100 is referred to as the upper face side on which the electronic component 2 is mounted.

FIGS. 1 and 2 illustrate a characteristic part of the semiconductor device 100, and this characteristic part does not necessarily have to be an overall configuration of the semiconductor device 100, but it is also possible to configure the semiconductor device 100 of only this characteristic part.

The semiconductor device 100 illustrated in FIGS. 1 and 2 can be used in power converters mounted on hybrid automobiles, electric automobiles, electrical appliances, industrial equipment, and other equipment. The same applies to the semiconductor devices described in the other embodiments.

As illustrated in FIGS. 1 and 2, the semiconductor device 100 includes the electronic component 2 mounted on a heat diffusion part 3 provided on the upper face side of the printed circuit board 1, and a heat radiation part 4 provided on the lower face side of the printed circuit board 1.

In the semiconductor device 100, heat generated by the electronic component 2 is diffused by the heat diffusion part 3 located directly therebelow, conducted to the heat radiation part 4 provided on the lower face side of the printed circuit board 1 through a plurality of heat radiation vias 15 penetrating the printed circuit board 1 in the thickness direction, and radiated from the heat radiation part 4 to the outside.

The configuration of the semiconductor device 100 will be described hereinafter in detail with reference to FIGS. 1 and 2. First, the printed circuit board 1 will be described.

The printed circuit board 1 is, for example, a flat plate-like member having a rectangular shape in plan view and serves as a foundation of the semiconductor device 100 as a whole. As illustrated in FIG. 2, the printed circuit board 1 has a hierarchical structure of a plurality of conductor layers and an insulation layer 11 sandwiched between the conductor layers, the conductor layers including an upper conductor layer 12 (first conductor layer), a lower conductor layer 13 (second conductor layer), and internal conductor layers 14. That is, the upper conductor layer 12 is provided on the upper face of the printed circuit board 1, and the lower conductor layer 13 is provided on the lower face of the printed circuit board 1. Inside the printed circuit board 1, the internal conductor layers 14 are hierarchically provided at intervals in the up-down direction, and the insulation layer 11 is provided between the upper conductor layer 12 and one of the internal conductor layers 14, between two internal conductor layers 14, and between one of the internal conductor layers 14 and the lower conductor layer 13. Also, a conductor film 10 is provided on the inner walls of the heat radiation vias 15, so that the end faces of the upper conductor layer 12, the lower conductor layer 13, and the internal conductor layers 14 that are exposed to the inner walls of the heat radiation vias 15 are covered with the conductor film 10 and are thermally conducting with one another. In this way, the printed circuit board 1 includes the internal conductor layers 14 that are thermally conducting with one another via the conductor film 10 and that are also thermally conducting with the upper conductor layer 12 and the lower conductor layer 13. This improves the thermal conductivity of the printed circuit board 1.

The insulation layer 11 serves as a base material for the printed circuit board 1 as a whole, has a flat rectangular plate-like shape in plan view according to the present embodiment, and is formed of glass fibers and an epoxy resin, for example. The insulation layer 11 is, however, not limited to this example and may be formed of an aramid resin and an epoxy resin.

In the printed circuit board 1, the upper conductor layer 12 is provided on an upper main face 11a (first main face) of the insulation layer 11 serving as a base material, and the lower conductor layer 13 is provided on a lower main face 11b (second main face) of the insulation layer 11. Note that the uppermost face of the printed circuit board 1 may be referred to as the upper main face 11a of the printed circuit board 1, and the lowermost face of the printed circuit board 1 may be referred to as the lower main face 11b of the printed circuit board 1.

The internal conductor layers 14 are disposed opposing and almost in parallel with the upper conductor layer 12 and the lower conductor layer 13. That is, the internal conductor layers 14 are disposed opposing and almost in parallel with the upper main face 11a and lower main face 11b of the insulation layer 11. FIG. 2 shows an example in which two internal conductor layers 14 are disposed, but the number of internal conductor layers 14 is not limited to this example. For example, a larger or smaller number of internal conductor layers 14 may be disposed, or the internal conductor layers 14 may not be disposed. However, the internal conductor layers 14 have higher thermal conductivity than the insulation layer 11, and therefore the presence of the internal conductor layers 14 can improve the thermal conductivity of the printed circuit board 1 as a whole, as compared to the case where the internal conductor layers 14 are not provided.

The upper conductor layer 12, the lower conductor layer 13, and the internal conductor layers 14 are all provided almost in parallel with the upper main face 11a and lower main face 11b of the printed circuit board 1, formed of materials with excellent thermal conductivity, such as copper, and have thicknesses in the range of greater than or equal to 15 μm and less than or equal to 500 μm. Note that the printed circuit board 1 can also be defined as including a plurality of insulation layers 11 sectioned by the upper conductor layer 12, the lower conductor layer 13, and the internal conductor layers 14.

As described above, the printed circuit board 1 illustrated in FIG. 2 includes four conductor layers including the upper conductor layer 12, the lower conductor layer 13, and the two internal conductor layers 14 in total as the plurality of conductor layers, but the structure of the printed circuit board 1 is not limited to this example, and may not include the internal conductor layers 14. The same applies to the embodiments described below.

The heat radiation vias 15 are through holes provided extending from the upper main face 11a of the printed circuit board 1 to the lower main face 11b thereof. In plan view viewed from the upper main face 11a of the printed circuit board 1, the heat radiation vias 15 are provided at intervals in a region that overlaps the electronic component 2 and in a region that does not overlap the electronic component 2 but overlaps the heat diffusion part 3.

Here, a region in which the heat radiation vias 15 are provided is divided into first and second regions. That is, the first region is a region that overlaps the electronic component 2 in plan view, and the second region is a region around the first region, i.e., a region outside the first region in plan view. This division classifies the heat radiation vias 15 into a plurality of first heat radiation vias 15a provided in the first region and a plurality of second heat radiation vias 15b provided in the second region. That is, the heat radiation vias 15 are classified into the first heat radiation vias 15a that overlap the electronic component 2 in plan view, and the second heat radiation vias 15b that do not overlap the electronic component 2 and overlap the heat diffusion part 3 in plan view.

The first heat radiation vias 15a and the second heat radiation vias 15b may include both the holes penetrating the insulation layers 11 and the conductor film 10 provided on the inner walls of the holes, or may include only either the holes or the conductor film 10, as the case may be.

FIG. 2 illustrates the first heat radiation vias 15a and the second heat radiation vias 15b as holes (hollow portions) surrounded by the conductor film 10, but these holes may be filled with a material with excellent thermal conductivity, such as solder or a conductive adhesive mixed with silver fillers. In this case, the member used to fill the holes, such as a conductive adhesive, may be included in the constituent elements of the heat radiation vias 15.

The heat radiation vias 15 filled with a material such as a conductive adhesive have improved heat radiation capabilities, as compared to the case where the heat radiation vias 15 are hollow holes. This is because the conductive member such as a conductive adhesive has higher thermal conductivity than air. Such a semiconductor device in which the holes of the heat radiation vias 15 are filled with solder will be described later as Embodiment 3.

The holes of the heat radiation vias 15 have, for example, a circular cylindrical shape having a circular opening with a diameter of 0.6 mm in plan view, and the conductor film 10 on the inner wall faces of the holes has a thickness of, for example, 0.05 mm. It is, however, noted that the shape of the holes are not limited to the circular cylindrical shape, and for example, may be a quadrangular prism shape, or the opening may have a polygonal shape in plan view.

The first heat radiation vias 15a and the second heat radiation vias 15b cross the upper main face 11a and lower main face 11b of the printed circuit board 1 so as to be orthogonal thereto. The upper conductor layer 12, the lower conductor layer 13, and the internal conductor layers 14 are all disposed extending in a planar manner in the first and second regions of the printed circuit board 1, along the upper main face 11a and lower main face 11b of the printed circuit board 1 (i.e., almost in parallel with the upper main face 11a and lower main face 11b). Thus, all of the first heat radiation vias 15a and the second heat radiation vias 15b are cross-connected to the upper conductor layer 12, the lower conductor layer 13, and the internal conductor layers 14. In other words, the upper conductor layer 12, the lower conductor layer 13, and the internal conductor layers 14 are cross-connected to the heat radiation vias 15. More specifically, the conductor film 10 provided on the inner wall faces of the holes of the heat radiation vias 15 is cross-connected to the upper conductor layer 12, the lower conductor layer 13, and the internal conductor layers 14. The term "cross-connection" as used herein refers to a condition in which conductors are both electrically and thermally connected to each other.

The upper conductor layer 12, the lower conductor layer 13, and the internal conductor layers 14 may be provided extending in a planer manner on a region that overlaps the printed circuit board 1, and more correctly on the entire printed circuit board 1, except the holes of the heat radiation vias 15.

Moreover, it is sufficient for the upper conductor layer 12, the lower conductor layer 13, and the internal conductor layers 14 to be provided on regions where the heat radiation vias 15 are provided, out of the first and second regions, and more correctly at least on regions sandwiched between adjacent heat radiation vias 15, and to be cross-connected to the heat radiation vias 15. That is, the conductor layers may not be provided on regions where the heat radiation vias 15 are not formed, e.g., a region 1A in FIG. 1, and may be provided only on regions where the heat radiation vias 15 are provided, and more correctly only on regions sandwiched between adjacent heat radiation vias 15.

Here, the region 1A on the upper main face 11a of the printed circuit board 1 is a region where wiring (not shown) for connecting lead terminals 21 of the electronic component 2 is provided, and this wiring is for establishing electrical connection between the electronic component 2 and other components. In the region 1A, a plurality of electrodes 19 formed as the same conductor layer as the upper conductor layer 12 is provided. These electrodes 19 are bonded to the lead terminals 21 of the electronic component 2 with a bonding material 7c such as solder. The term "bonding" as used herein refers to joining a plurality of members together with solder or other materials.

Figure 3:
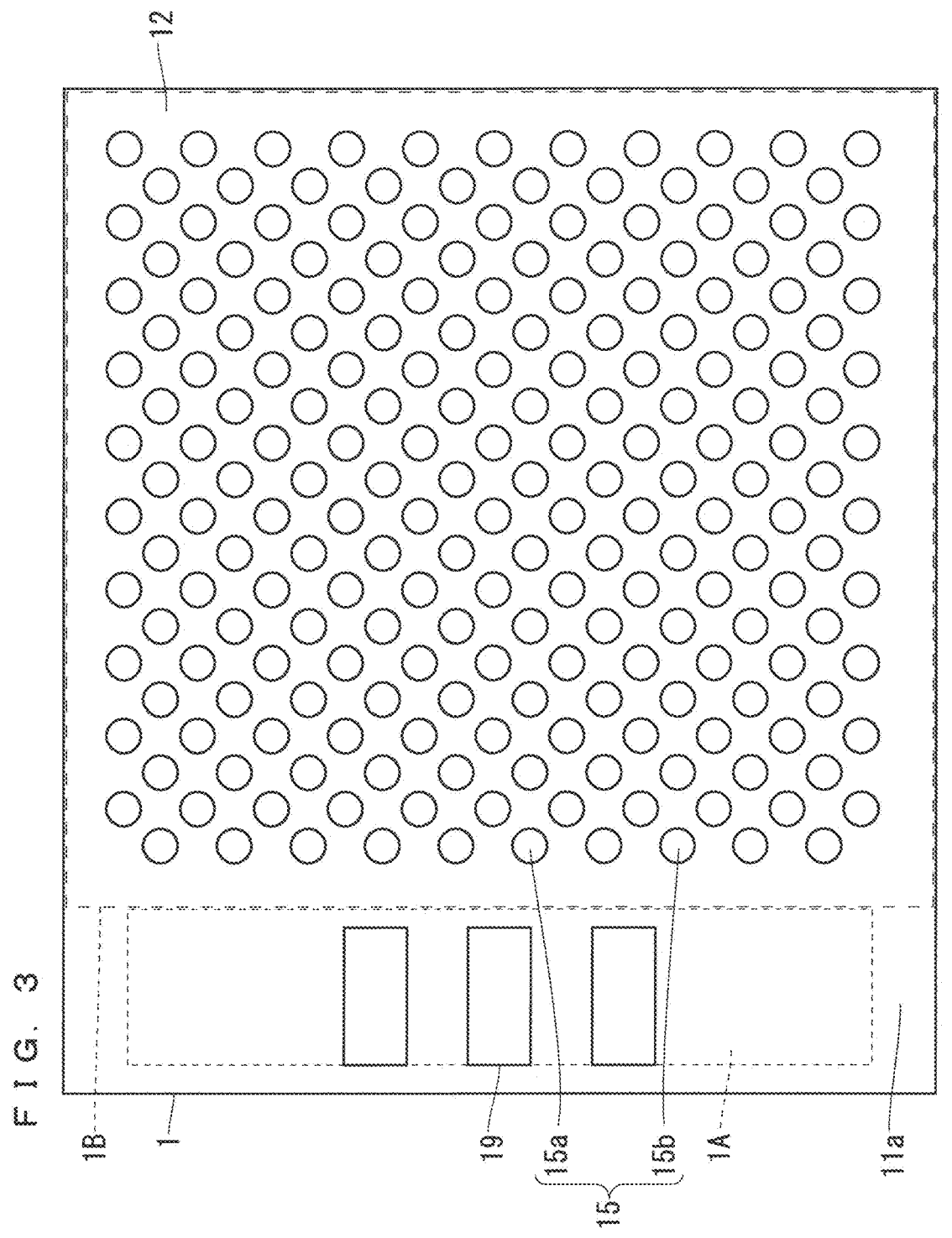
FIG. 3 is a plan view illustrating a configuration of a printed circuit board according to Embodiment 1 of the present invention.

FIG. 3 is a plan view of the printed circuit board 1 before the electronic component 2 and the heat diffusion part 3 (described later) are mounted, viewed from above the upper main face 11a. As illustrated in FIG. 3, the heat radiation vias 15 are not formed in the entire region of the printed circuit board 1, and the heat radiation vias 15 are not provided in the region 1A illustrated in FIG. 3, i.e., a region where the lead terminals 21 of the electronic component 2 illustrated in FIG. 1 are connected. However, the upper conductor layer 12 and the lower conductor layer 13 and the internal conductor layers 14, which are not shown, are preferably provided in the region where the heat radiation vias 15 are formed and in its surrounding region, other than the region 1A, i.e., provided extending in a planar manner in a region 1B enclosed by the broken line. This increases the effect of diffusing the heat generated by the electronic component 2 through each conductor layer.

Referring back to the description using FIGS. 1 and 2, the electronic component 2 and the heat diffusion part 3 will be described. The electronic component 2 is a package in which a semiconductor chip 22 including any one or more components selected from the group of, for example, a metal oxide semiconductor field effect transistor (MOSFET), an insulated gate bipolar transistor (IGBT), a PNP transistor, an NPN transistor, a diode, and a control integrated circuit (IC) is sealed by a resin molding part 23.

For example, the electronic component 2 has a rectangular shape in plan view and has a considerably high heating value because it includes the semiconductor chip 22. Thus, in many cases, the electronic component 2 is configured to include a heat radiator plate 24 as illustrated in FIG. 2. This heat radiator plate 24 is bonded to a main face 311 of the heat diffusion plate 31 with a metal bonding material 7b such as solder. This configuration allows the heat generated by the semiconductor chip 22 of the electronic component 2 to be efficiently radiated via the heat radiator plate 24. In this way, the electronic component 2 includes the lead terminals 21, the semiconductor chip 22, the resin molding part 23, and the heat radiator plate 24.

Figure 4:
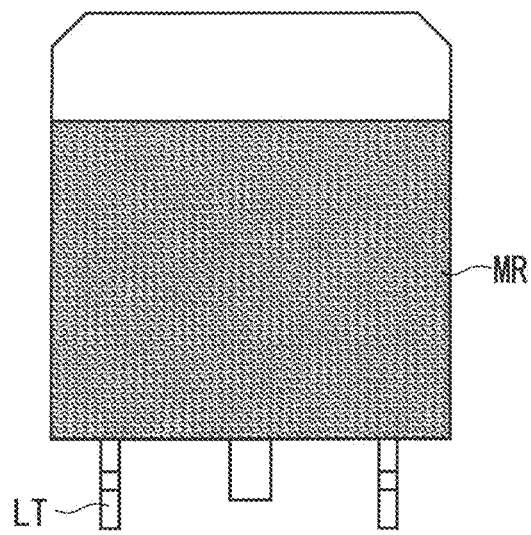
FIG. 4 is a plan view showing an example of an electronic component.

Here, as a specific example of the electronic component 2, TO-263 is exemplified as the package of an MOSFET or other devices. FIG. 4 is a plan view of the TO-263, viewed from the upper face side. This package is of a surface-mounted type in which a heat radiator plate is disposed on the lower face side, and lead terminals LT project from one side face of a resin molding part MR and bends down on the lower face side. Since the lead terminals LT have such a length that can only reach the same plane as the heat radiator plate, the lengths of the lead terminals are increased so as to reach the printed circuit board 1 in the configuration as in the present embodiment in which the heat radiator plate 24 is bonded to the heat diffusion plate 31, and the lead terminals 21 are bonded to the printed circuit board 1.

Figure 5:
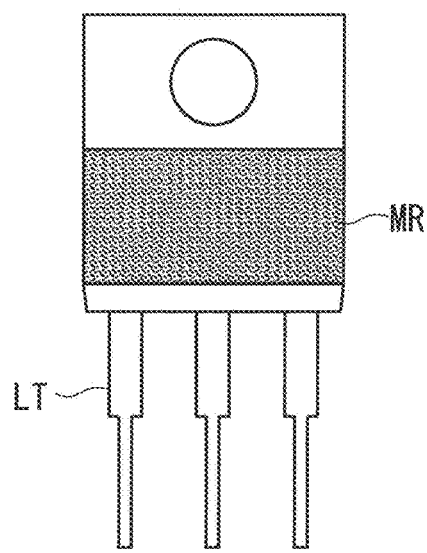
FIG. 5 is a plan view showing an example of the electronic component.

On the other hand, a through-hole-mounted type package, like TO-220 illustrated in FIG. 5, that includes long lead terminals LT, can bend and process the lead terminals LT and is thus compatible with the configuration as in the present embodiment in which the heat radiator plate 24 is bonded to the heat diffusion plate 31. This enables using a general-purpose product and accordingly reduces the manufacturing cost.

Refer back again to the description using FIG. 2. As illustrated in FIG. 2, part of the upper face of the heat radiator plate 24 and the side face thereof on the side facing the lead terminals 21 are covered with the resin molding part 23. Thus, the heat radiator plate 24 is fixed to the resin molding part 23. This is, however, merely one example, and the present embodiment is not limited to this example. For example, the heat radiator plate 24 as a whole, except the lower face thereof, may be covered with the resin molding part 23.

The presence of the heat radiator plate 24, which is electrically and thermally connected to some terminals of the semiconductor chip 22, in the electronic component 2 facilitates bonding to the heat diffusion plate 31. For example, in the case where the electronic component 2 is a bare-chip component that includes only the semiconductor chip 22 and does not include the heat radiator plate 24 and is bonded to the heat diffusion plate 31, wire bonding or the like has to be performed to establish electrical connection with some of the terminals such as a gate terminal, a source terminal, and a drain terminal. Since the steps of mounting the printed circuit board ordinarily do not include a wire bonding step, another step becomes necessary for connection of bonding wires or the like, which results in an increase in cost. Besides, in the case where the semiconductor chip 22 is disposed directly on the heat diffusion plate 31 and if the heat diffusion plate 31 does not have high surface flatness, the chip 22 may be inclined and more often cause failures. Moreover, in the case where heat is directly diffused from the semiconductor chip 22 to the heat diffusion plate 31 without a step of diffusing the heat generated by the semiconductor chip 22 first to the heat radiator plate 24 and then to the heat diffusion plate 31, even a slight void between the semiconductor chip 22 and the heat diffusion plate 31 can cause a significant decrease in heat conduction performance. Therefore, in terms of the reliability of mounting, it is desirable that the electronic component 2 includes the semiconductor chip 22 and the heat radiator plate 24, and the heat radiator plate 24 is bonded to the heat diffusion plate 31.

The resin molding part 23 is difficult to be bonded with a bonding material, such as solder, and is thus configured to come into intimate contact with the bonding material. If the resin molding part 23 of the electronic component 2 is at least in contact with the bonding material, it is possible to ensure a certain degree of heat radiation from the resin molding part 23 toward the printed circuit board. The term "intimate contact" as used herein refers to a condition in which a plurality of members is in contact with one another and each member exerts adsorptive power weaker than bonding power on the other members. The heat radiator plate 24 and the heat diffusion plate 31 are bonded together with the bonding material 7b. Note that the resin molding part 23 does not necessarily have to be in intimate contact with the bonding material 7b.

The heat diffusion part 3 has a function of radially diffusing the heat generated by the electronic component 2 to the outside in plan view. Thus, the electronic component 2 is disposed leaning to the left side of the heat diffusion part 3 so that heat is diffused in directions toward the three side faces of the heat diffusion part 3, other than the side face on the side facing the lead terminals 21 of the rectangular electronic component 2, i.e., on the left side in FIG. 1. Disposing the electronic component 2 in this way improves the efficiency of the heat diffusion part 3 radially diffusing the heat generated by the electronic component 2. Note that the location of the electronic component 2 is not limited to this example, and the shape of the heat diffusion part 3 in plan view is also not limited to the rectangular shape.

The heat diffusion part 3 includes the heat diffusion plate 31 and is preferably formed of copper, for example. This improves the thermal conductivity, i.e., heat radiation capability, of the heat diffusion plate 31. The heat diffusion plate 31 may be formed of a ceramic material with excellent thermal conductivity, such as aluminum oxide or aluminum nitride, that includes a metal film such as copper formed on the surface.

Alternatively, the heat diffusion plate 31 may be formed of a metal material obtained by forming a nickel or gold plating film on a surface of any alloy material selected from the group of, for example, a copper alloy, an aluminum alloy, and a magnesium alloy. This heat diffusion plate 31 is bonded to the upper conductor layer 12 provided on the upper main face 11*a* of the printed circuit board 1 with a bonding material 7*a* (first bonding material) such as solder.

The electronic component 2 and the heat diffusion plate 31 of the heat diffusion part 3 are bonded together with the bonding material 7*b* (second bonding material) such as solder. More specifically, the heat radiator plate 24 of the electronic component 2 and the heat diffusion plate 31 of the heat diffusion part 3 are bonded together with the bonding material 7*b*. In the case where current flows from the lower face of the semiconductor chip 22 in the electronic component 2 toward the heat radiator plate 24 and if the heat diffusion plate 31 is formed of a conductive material such as a metal material, electricity flows through the heat diffusion plate 31, which is bonded to the electronic component 2 with the bonding material 7*b* such as solder, and therefore electrical resistance in the upper conductor layer 12 of the printed circuit board 1 can be reduced. Accordingly, the heat diffusion plate 31 not only can diffuse the heat generated by the electronic component 2, but also can reduce continuity losses in the upper conductor layer 12 and other layers provided in the printed circuit board 1.

The heat diffusion plate 31 may use a conductor bus bar as electric wiring. The bus bar is often formed of a material such as copper and has high electric conductivity and high thermal conductivity. Thus, a general-purpose bus bar can be used as the heat diffusion plate 31. The bus bar can be used not only as a heat diffusion plate, but also can be applied in the case of connecting printed circuit boards together.

As described above, the heat diffusion part 3 is bonded to the electronic component 2 with the bonding material 7*b* such as solder, and is also bonded to the upper main face 11*a* of the printed circuit board 1 with the bonding material 7*a* such as solder. This allows the heat generated by the electronic component 2 to be radially conducted to the heat diffusion part 3 via the bonding materials 7*a* and 7*b* and to be diffused in the direction toward the upper main face 11*a*. Therefore, after the heat is diffused from the electronic component 2 to the heat diffusion part 3, this heat can be conducted from the heat diffusion part 3 to the heat radiation part 4 located therebelow.

The heat diffusion plate 31 is bonded to the upper main face 11*a* of the printed circuit board 1 with the bonding material 7*a* so as to cover the holes of the heat radiation vias 15 in the printed circuit board 1. Meanwhile, the heat radiator plate 24 of the electronic component 2 is bonded to the main face 311 of the heat diffusion plate 31 with the bonding material 7*b*.

Note that the heat diffusion plate 31 is not formed in the region 1A in FIGS. 1 and 2 because the heat radiation vias 15 are not formed in that region, but the heat diffusion plate 31 may be disposed in the region 1A if it is possible to avoid electrical contact with the electrodes 19 or the like.

In the case where solder is used as the bonding materials for bonding conductor members, an intermetallic compound is formed at the interfaces of bonding between the bonding materials and each of the electronic component 2, the upper conductor layer 12, and the heat diffusion plate 31, which are bonded to the bonding materials, and reduces contact heat resistance at the interfaces of bonding. Therefore, it is preferable to use solder as the bonding materials, but the bonding materials may be different materials with excellent thermal conductivity other than solder, such as a conductive adhesive or a nano silver paste.

The heat diffusion part 3 preferably has higher flexural rigidity, i.e., a larger product of the Young's modulus and the secondary moment of a section, than the printed circuit board 1. In this case, it is possible to improve the rigidity of a structure configured of the printed circuit board 1 and the heat diffusion plate 31 in the semiconductor device 100, to make the printed circuit board 1 less deformable due to external force such as fixation and vibrations, to reduce the resistance of the surface-mounted type printed circuit board 1 and a failure rate that may increase due to cracking of capacitors or other components, and to improve reliability.

If the heat diffusion plate 31 has a smaller thickness, it has lower thermal conductivity and an insufficient capability of radiating the heat generated by the electronic component 2. On the other hand, if the heat diffusion plate 31 has a larger thickness, it becomes difficult to use the same mounter as the device (mounter) used to mount the electronic component 2 on the printed circuit board 1 when mounting the heat diffusion plate 31 on the printed circuit board 1. This is because the thickness of the heat diffusion plate 31 exceeds an upper-limit value of the thickness of components that can be mounted with the mounter. In this case, the mounting cost will increase because the heat diffusion plate 31 cannot be mounted automatically using the same mounter. Accordingly, the thickness of the heat diffusion plate 31 is preferably greater than or equal to 0.1 mm and less than or equal to 100 mm, and for example, preferably approximately 0.5 mm.

The heat diffusion plate 31 may have a block-like shape, instead of a plate-like shape. The heat diffusion part 3 may be configured by overlaying a plurality of heat diffusion plates 31. If the heat diffusion part 3 is formed by overlaying general-purpose metal plates and bonding them together with a metal material, it is possible to reduce the manufacturing cost of the heat diffusion part 3 and to improve the heat radiation capability of the heat diffusion part 3.

Next, the heat radiation part 4 will be described. The heat radiation part 4 is provided, for example, across the entire lower main face 11*b* of the printed circuit board 1 and includes a heat radiation member 41 and a coolant 42. For example, the printed circuit board 1 and the heat radiation part 4 may be bonded together with a bonding material, or may simply come in intimate contact with each other. In the semiconductor device 100 in FIG. 2, as one example, the electronic component 2, the heat diffusion part 3, the printed circuit board 1, the heat radiation member 41, and the coolant 42 are disposed in order from the upper side to the lower side in FIG. 2. In this case, the coolant 42 is in many cases electrically connected to devices outside the semiconductor device 100, so that the coolant 42 and the lower conductor layer 13 are preferably isolated from each other via the heat radiation member 41. However, in the case where the coolant 42 and the heat radiation member 41 are disposed in order from the upper side to the lower side in FIG. 2, the coolant 42 and the lower conductor layer 13 do not necessarily have to be isolated from each other.

In the case where the heat radiation part 4 is provided across the entire lower main face 11b of the printed circuit board 1, the heat radiation part 4 is disposed so as to overlap all of the first heat radiation vias 15a and the second heat radiation vias 15b of the printed circuit board 1 in plan view. Alternatively, a configuration is also possible in which at least some of the heat radiation vias 15 overlap the heat radiation part 4 in plan view. In other words, the heat radiation part 4 may be configured to overlap at least part of the lower main face 11b of the printed circuit board 1. For example, the heat radiation part 4 may be configured to come into intimate contact with only a region of the lower main face 11b that corresponds to a region overlapping the electronic component 2 and adjacent regions in plan view.

The heat radiation member 41 preferably has electrical insulating properties and is formed of a material with excellent thermal conductivity. Specifically, the heat radiation member 41 is preferably formed of a sheet obtained by mixing particles of, for example, aluminum oxide or aluminum nitride in a silicone resin. Aluminum oxide and aluminum nitride have excellent thermal conductivity and have electrical insulating properties. Alternatively, the heat radiation member 41 may be silicone grease or a silicone adhesive, instead of having the aforementioned configuration. In this case, the heat radiation member 41 may be a non-silicone material if the material has high thermal conductivity.

The heat radiation member 41 may be configured of a conductor layer with excellent thermal conductivity and an electrical insulating layer. The heat radiation member 41 diffuses the heat generated by the electronic component 2 to the outside of the electronic component 2 via the thermal diffusion plate 31 and conducts the diffused heat through the heat radiation vias 15 to the lower conductor layer 13 in the printed circuit board 1. If the heat radiation member 41 includes a conductor layer capable of heat diffusion, the heat can be further radially diffused through the conductor layer in plan view.

The coolant 42 is, for example, a flat plate-like member having a rectangular shape in plan view and formed of a metal material with excellent thermal conductivity. Specifically, the coolant 42 is preferably formed of aluminum, but may be composed of any other material such as copper, an aluminum alloy, or a magnesium alloy. The coolant 42 is disposed directly below or directly above the heat radiation member 41. In FIG. 2, the coolant 42 is thermally connected to the printed circuit board 1 via the heat radiation member 41. In other words, it can be said that the heat radiation member 41 is in intimate contact with or bonded to the upper or lower main face of the coolant 42. Note that the coolant 42 may be a case.

Although not shown, a water- or air-cooling mechanism, e.g., a water cooling pipe or cooling fins, is disposed in contact on the underside of the coolant 42.

Manufacturing Method

Next, a method of manufacturing the semiconductor device 100 will be described with reference to FIGS. 6 to 10, i.e., sectional views illustrating manufacturing steps, focusing on the steps of mounting the electronic component 2 and the heat diffusion part 3.

Figure 6:
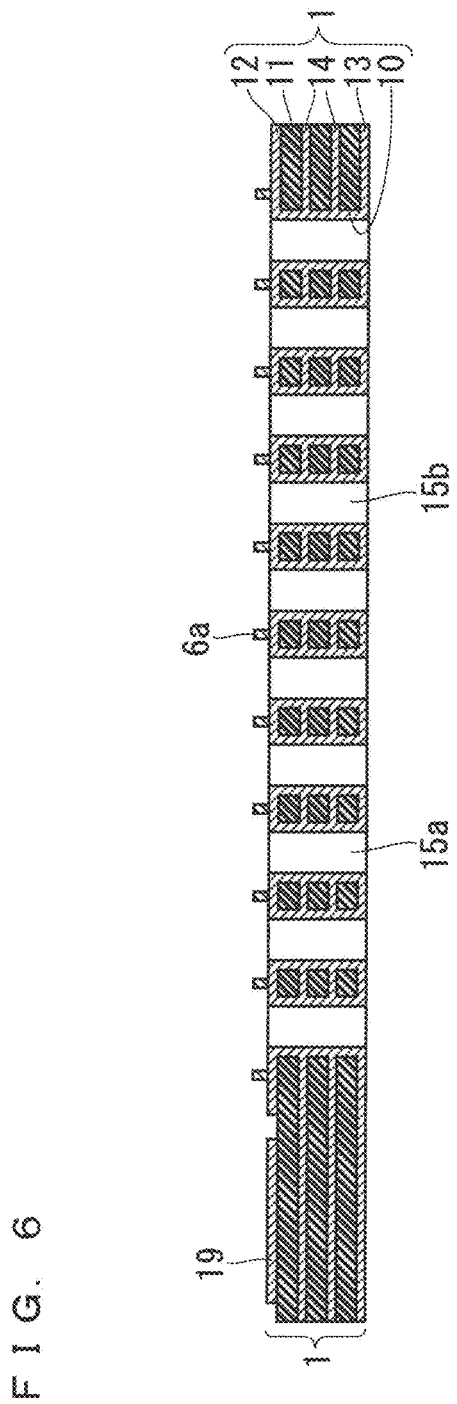
FIG. 6 is a sectional view illustrating a step of manufacturing the semiconductor device according to Embodiment 1 of the present invention.

In the step illustrated in FIG. 6, the printed circuit board 1 is prepared, which forms a hierarchical structure of a plurality of conductor layers including the upper conductor layer 12, the lower conductor layer 13, and the internal conductor layers 14, and the insulation layers 11 sandwiched between the conductor layers, and includes a plurality of heat radiation vias 15 penetrating the hierarchical structure in the thickness direction. For the manufacture of this printed circuit board 1, well-known techniques can be used, and therefore a description thereof will not be given.

As illustrated in FIG. 6, solder paste 6a is deposited on the upper main face 11a of the printed circuit board 1, i.e., on the upper conductor layer 12. For example, the solder paste 6a is preferably supplied in dots in plan view on portions of the upper conductor layer 12 that are located between adjacent heat radiation vias 15 provided in the printed circuit board 1. More specifically, the solder paste 6a is preferably deposited at positions that are 100 μm or more away from the outer edges of the holes of the heat radiation vias 15 in a direction along the upper main face 11a of the printed circuit board 1 by printing using a metal mask through a well-known solder print process.

Then, the heat diffusion plate 31 configuring the heat diffusion part 3 is mounted on the solder paste 6a, and well-known reflow heat treatment is performed in this state. Note that the step of mounting the heat diffusion part 3 is automatically performed by the previously described mounter.

If the printed circuit board 1 is configured to have projections formed entirely or partly around the location where the heat diffusion plate 31 is disposed so as to restrict the movement of the heat diffusion plate 31, it is possible to reduce the movement of the heat diffusion plate 31 during transport or reflow heat treatment and to reduce failures in mounting. The projections may be formed of a solder resist used in well-known resist printing. Alternatively, the projections may be formed of a resin or a metal such as copper used in well-known silk printing or symbol printing. If these materials are used, the projections can be formed by a general printed-circuit-board manufacturing process and accordingly can be manufactured at low cost without requiring special steps. Instead of using the aforementioned print process, the projections may be formed by attaching a resin sheet having a pattern of projections to the printed circuit board 1, or may be formed by appropriately combining these forming methods. The material for the projections may be a material that is not likely to get wet with the solder bonding material 7a.

Figure 7:
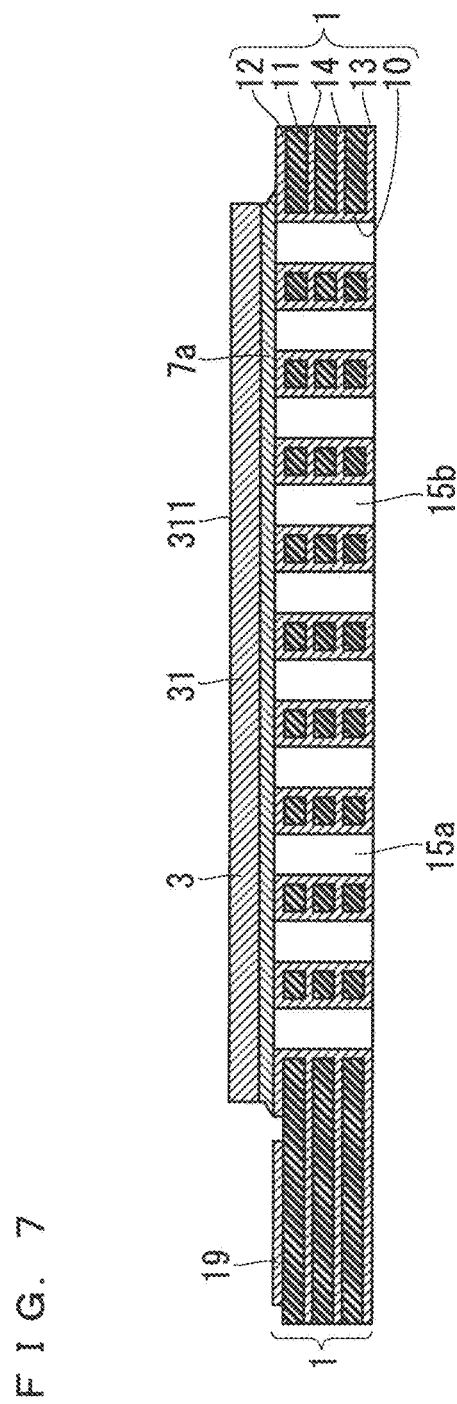
FIG. 7 is a sectional view illustrating a step of manufacturing the semiconductor device according to Embodiment 1 of the present invention.

Through the reflow heat treatment, the solder paste 6a melts and flows along the surface of the upper conductor layer 12, i.e., the upper main face 11a, thereby forming the laminar bonding material 7a as illustrated in FIG. 7. In this case, the molten and flowing bonding material 7a does not flow into the first heat radiation vias 15a and the second heat radiation vias 15b. This is because, as described previously, the solder paste 6a is printed on the regions away from the outer edges of the holes of the first heat radiation vias 15a and the second heat radiation vias 15b, and is also because the amount of the solder paste 6a is appropriately calculated. After bonding using the bonding material 7a is completed, an appearance inspection is conducted to inspect the mounting condition.

Figure 8:
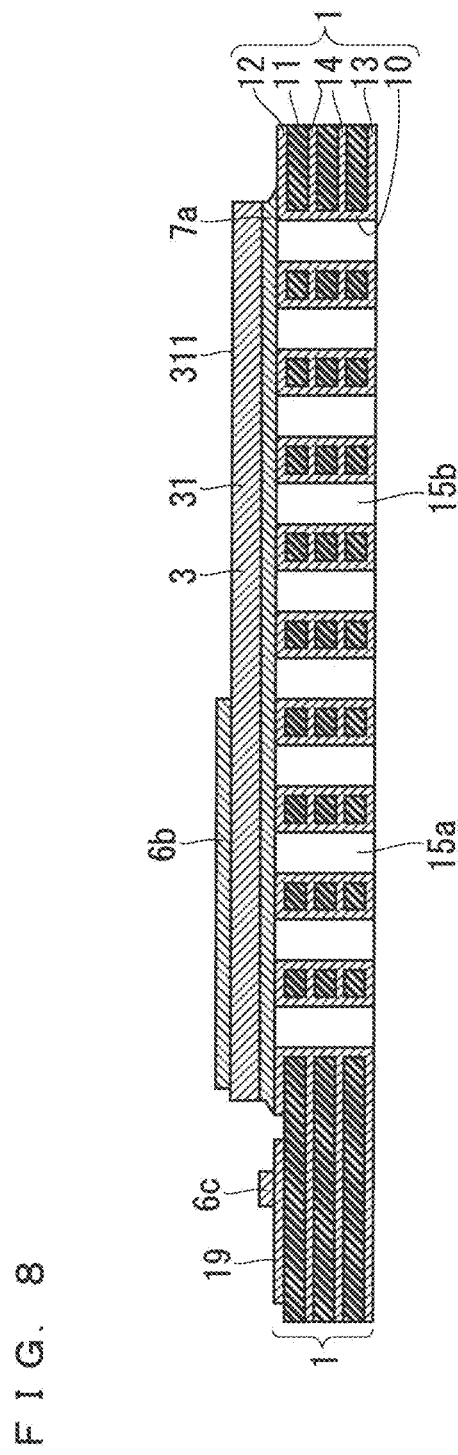
FIG. 8 is a sectional view illustrating a step of manufacturing the semiconductor device according to Embodiment 1 of the present invention.

Next, in the step illustrated in FIG. 8, solder paste 6b is deposited on the heat diffusion plate 31, and solder paste 6c is deposited on the electrodes 19 provided on the upper main face 11a of the printed circuit board 1. The solder paste 6b and the solder paste 6c are preferably deposited by printing using a metal mask through a well-known solder print process.

Next, the electronic component 2 is mounted on the solder paste 6b so that the lead terminals 21 of the electronic component 2 come into contact with the solder paste 6c. In this state, well-known reflow heat treatment is performed. Note that the step of mounting the electronic component 2 is automatically performed by the previously described mounter.

Figure 9:
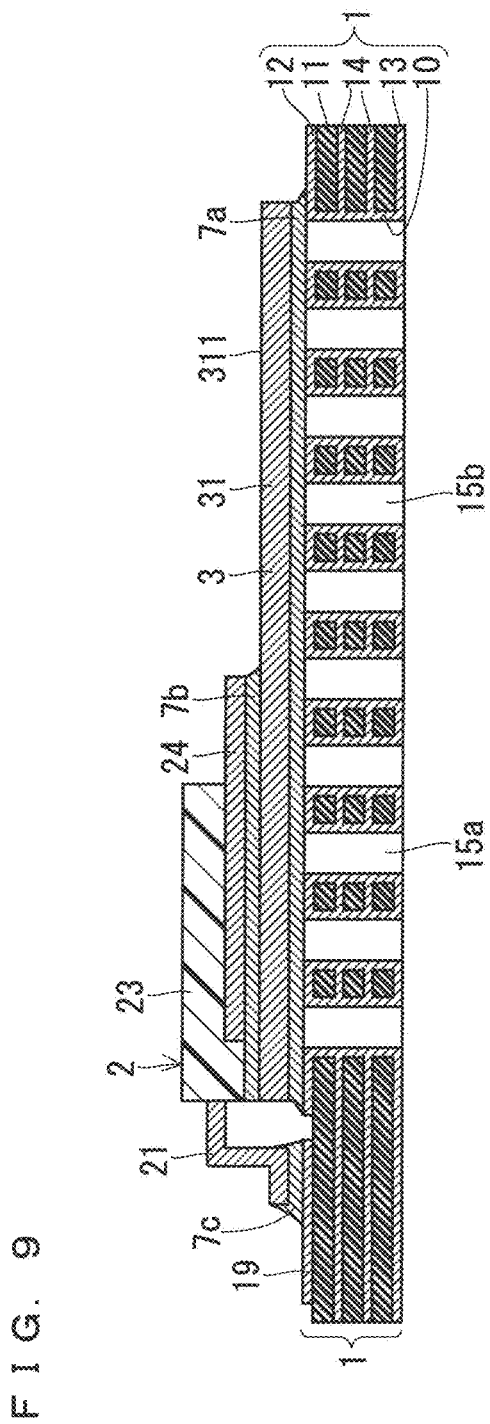
FIG. 9 is a sectional view illustrating a step of manufacturing the semiconductor device according to Embodiment 1 of the present invention.

Through the reflow heat treatment, the solder paste 6b melts and flows along the upper main face on the heat diffusion plate 31, thereby forming the laminar bonding material 7a as illustrated in FIG. 9. Note that the bonding material 7b also flows into the underside of the resin molding part 23 of the electronic component 2, but is not bonded to the resin material. Thus, the bonding material 7b simply comes in intimate contact with the resin molding part 23.

In the reflow heat treatment, the solder paste 6c also melts into the laminar bonding material 7c at the same time and bonds the lead terminals 21 and the electrodes 19 together. After bonding using the bonding materials 7a and 7c is completed, an appearance inspection step is performed to inspect the mounting condition. By in this way using the surface-mounted type electronic component 2 in the printed circuit board 1, which is a surface-mounted substrate, it is possible to automatically mount the electronic component 2 on the printed circuit board 1, using the mounter.

Figure 10:
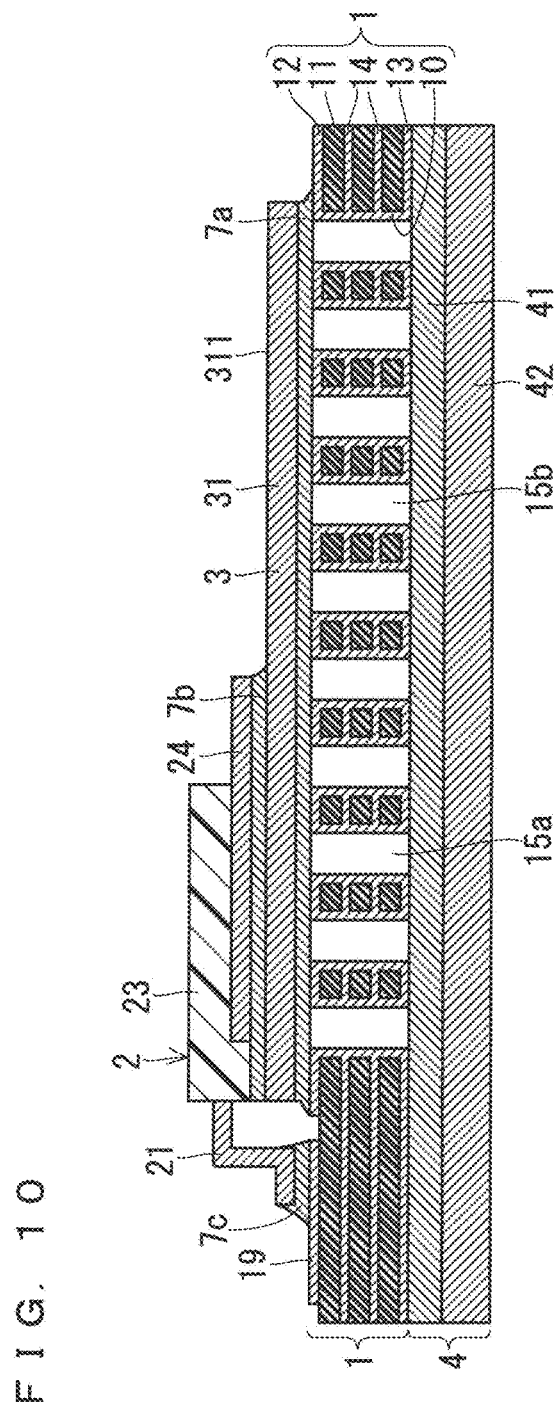
FIG. 10 is a sectional view illustrating a step of manufacturing the semiconductor device according to Embodiment 1 of the present invention.

Next, in the step illustrated in FIG. 10, the heat radiation member 41 is disposed in contact with the lower conductor layer 13 in the printed circuit board 1, and the coolant 42 is disposed in contact with the heat radiation member 41. Then, the heat radiation member 41 and the coolant 42 are brought into intimate contact with each other so as to form the heat radiation part 4. Contrary to the way described above, the coolant 42 may be disposed in contact with the lower conductor layer 13 and the heat radiation member 41 may be disposed on the underside of the coolant 42 in order to form the heat radiation part 4. Note that the printed circuit board 1 and each member of the heat radiation part 4 may be bonded together with a bonding material such as solder. Through the above-described steps, the semiconductor device 100 illustrated in FIG. 2 is obtained.

Next, another method of manufacturing the semiconductor device 100 will be described with reference to FIGS. 11 to 13, i.e., sectional views illustrating manufacturing steps, focusing on the steps of mounting the electronic component 2 and the heat diffusion part 3.

Figure 11:
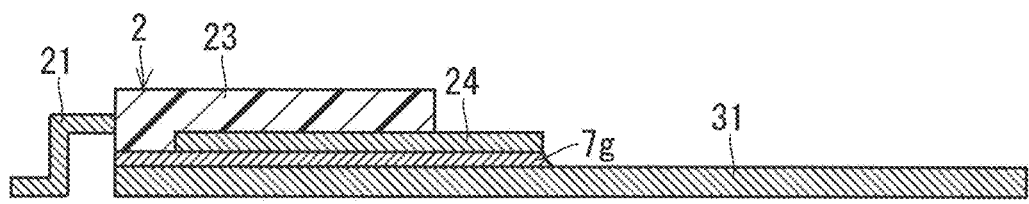
FIG. 11 is a sectional view illustrating another step of manufacturing the semiconductor device according to Embodiment 1 of the present invention.

In the step illustrated in FIG. 11, the heat diffusion plate 31 with the electronic component 2 bonded thereto is prepared. Solder paste used to bond the electronic component 2 to the heat diffusion plate 31 has a higher melting point than solder paste used in subsequent steps, and a bonding material 7g that bonds the heat diffusion plate 31 and the electronic component 2 together will not re-melt in subsequent reflow heat treatment.

Figure 12:
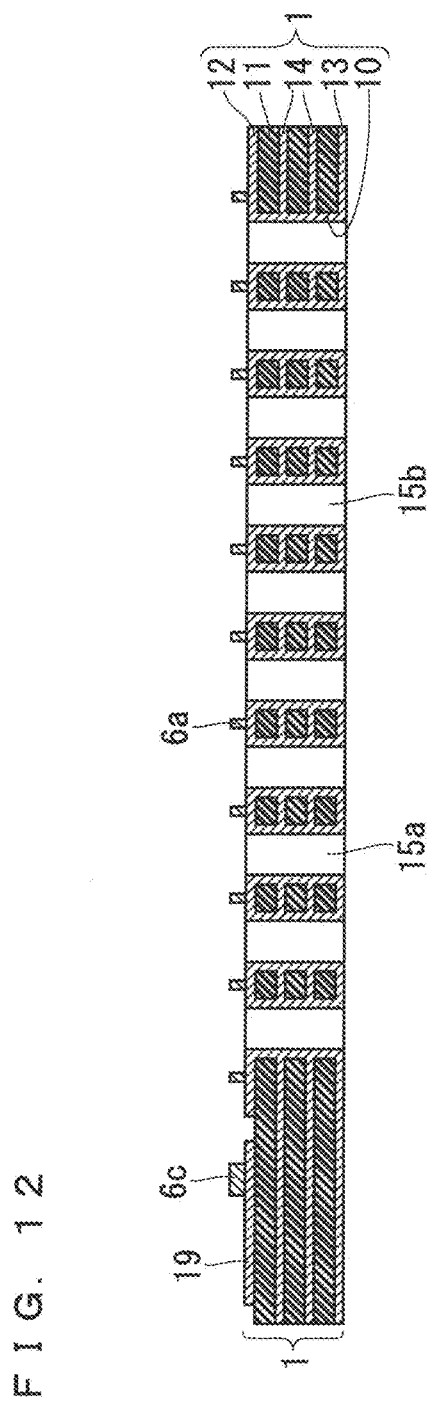
FIG. 12 is a sectional view illustrating another step of manufacturing the semiconductor device according to Embodiment 1 of the present invention.

Next, in the step illustrated in FIG. 12, the printed circuit board 1 is prepared, which forms a hierarchical structure of a plurality of conductor layers including the upper conductor layer 12, the lower conductor layer 13, and the internal conductor layers 14 and the insulation layers 11 sandwiched between the conductor layers, and includes a plurality of heat radiation vias 15 penetrating the hierarchical structure in the thickness direction.

As illustrated in FIG. 12, solder paste 6a is deposited on the upper main face 11a of the printed circuit board 1, i.e., on the upper conductor layer 12. For example, the solder paste 6a is preferably supplied in dots in plan view on portions of the upper conductor layer 12 that are located between adjacent heat radiation vias 15 provided in the printed circuit board 1. More specifically, the solder paste 6a is preferably deposited at positions that are 100 μm or more away from the outer edges of the holes of the heat radiation vias 15 in a direction along the upper main face 11a of the printed circuit board 1 by printing using a metal mask through a well-known solder print process. Solder paste 6c is also deposited on the electrodes 19 provided on the upper main face 11a of the printed circuit board 1. For example, the solder paste 6c is preferably deposited by printing using a metal mask through a well-known solder print process.

Figure 13:
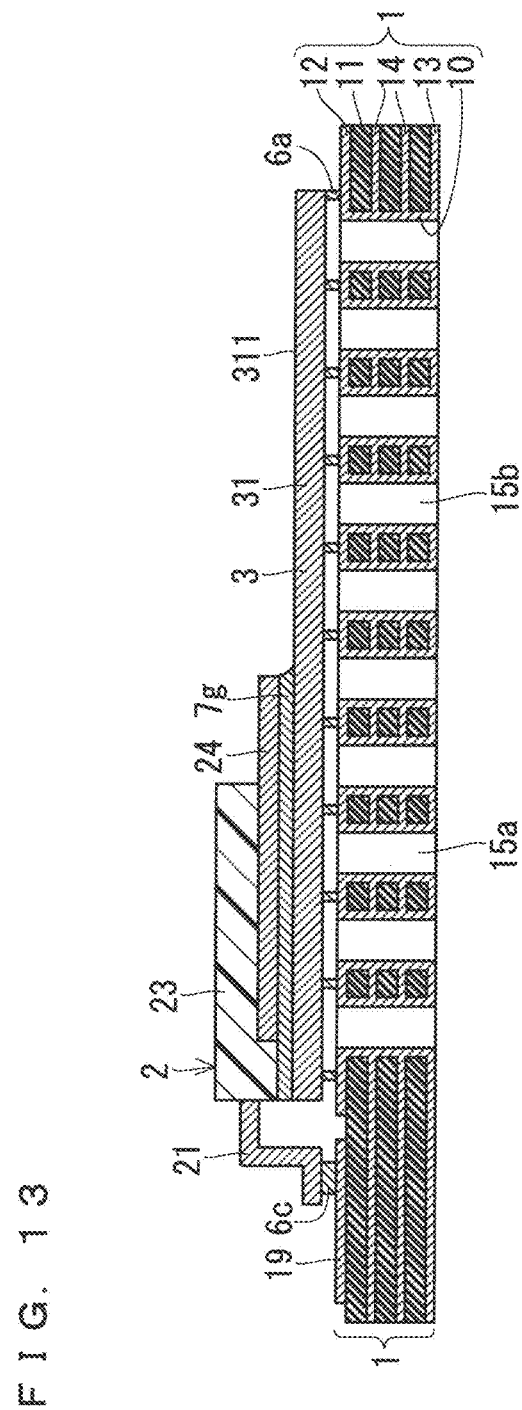
FIG. 13 is a sectional view illustrating another step of manufacturing the semiconductor device according to Embodiment 1 of the present invention.

Next, in the step illustrated in FIG. 13, the heat diffusion plate 31 bonded to the electronic component 2 is mounted on the solder paste 6a. In this case, the lead terminals 21 of the electronic component 2 come into contact with the solder paste 6c. In this state, well-known reflow heat treatment is performed. Note that the step of mounting the heat diffusion plate 31 bonded to the electronic component 2 is automatically performed by the previously described mounter.

Through the reflow heat treatment, the solder paste 6a melts and flows along the surface of the upper conductor layer 12, i.e., the upper main face 11a, thereby forming the laminar bonding material 7a as illustrated in FIG. 2. In this case, the molten and flowing bonding material 7a does not flow into the first heat radiation vias 15a and the second heat radiation vias 15b. This is because, as described previously, the solder paste 6a is printed on the regions away from the outer edges of the holes of the first heat radiation vias 15a and the second heat radiation vias 15b, and is also because the amount of the solder paste 6a is appropriately calculated.

In the reflow heat treatment, the solder paste 6c also melts into the laminar bonding material 7c at the same time as illustrated in FIG. 2, and bonds the lead terminals 21 and the electrodes 19 together. After bonding using the bonding materials 7a and 7c is completed, an appearance inspection step is performed to inspect the mounting condition.

Note that the bonding material 7g, which bonds the electronic component 2 and the heat diffusion plate 31 together, does not re-melt in the reflow heat treatment. This is because the solder paste used to bond the electronic component 2 to the heat diffusion plate 31 has a higher melting point than the solder paste 6a, and is also because the temperature during the reflow heat treatment is set to a temperature that is higher than the melting point of the solder paste 6a and that does not melt the bonding material 7g.

In the case of adopting the above-described manufacturing method, the manufacturing process requires only one reflow heating step. This improves the efficiency of manufacture and reduces the manufacturing cost.

Actions and Effects

Figure 14:
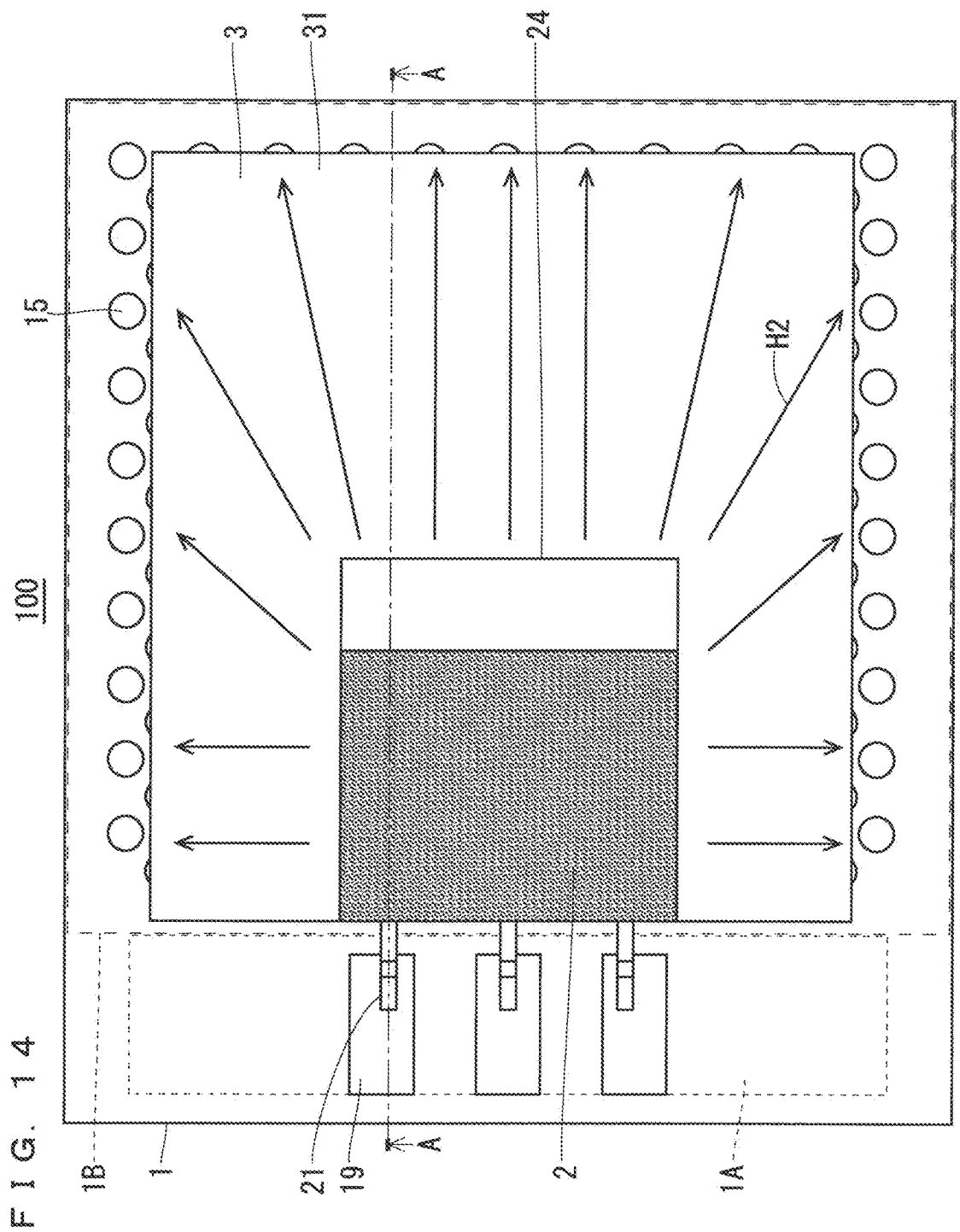
FIG. 14 is a plan view illustrating heat conduction paths from the electronic component in the semiconductor device according to Embodiment 1 of the present invention.
Figure 15:
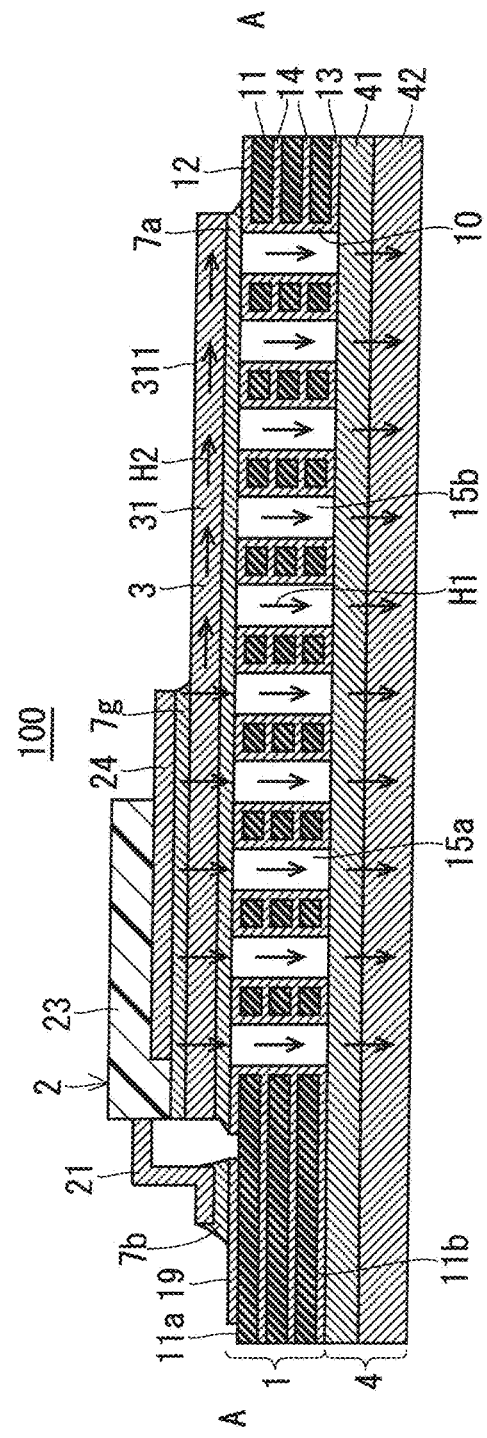
FIG. 15 is a sectional view illustrating heat conduction paths from the electronic component in the semiconductor device according to Embodiment 1 of the present invention.

Next, actions and effects of the present embodiment will be described with reference to FIGS. 14 to 19. FIG. 14 is a plan view of the semiconductor device 100, viewed from above, and schematically illustrates heat conduction paths by arrows. FIG. 15 is a sectional view taken along arrows A-A in FIG. 14 and schematically illustrates the heat conduction paths by arrows.

As illustrated in FIG. 15, part of the heat generated by the electronic component 2 is conducted through the heat diffusion plate 31 located below the electronic component 2 and the first heat radiation vias 15a provided in the printed circuit board 1 toward the heat radiation part 4 located below, as exemplified by heat H1 indicated by arrows in FIG. 15. Simultaneously with this, the heat H1 is radially diffused to the surroundings (outside) of the electronic component 2 by passing through the heat diffusion plate 31, the upper conductor layer 12, the lower conductor layer 13, and the internal conductor layers 14.

Also, part of the heat generated by the electronic component 2 is conducted through the heat diffusion plate 31 in the direction along the main face of the printed circuit board 1 and radially diffused toward the outside of the electronic component 2, as exemplified by heat H2 indicated by arrows in FIGS. 14 and 15. This is because the bonding material 7a, which bonds the electronic component 2 and the heat diffusion plate 31 together, is a conductive member such as solder and has excellent thermal conductivity. The heat conducted to the heat diffusion plate 31 is conducted through the second heat radiation vias 15b formed in the printed circuit board 1 located below toward the heat radiation part 4 located below. Part of the heat H2 that has passed through the second heat radiation vias 15b is also radially diffused toward the surroundings (outside) of the electronic component 2 by passing through the upper conductor layer 12, the lower conductor layer 13, and the internal conductor layers 14.

In this way, according to the present embodiment, the heat generated by the electronic component 2 can be conducted via the two routes, namely the route for conducting the heat through the first heat radiation vias 15a toward the heat radiation part 4 located below and the route for conducting the heat through the second heat radiation vias 15b toward the outside. This heat conduction via the two routes can be achieved because since the heat diffusion plate 31 is bonded to the upper main face 11a in the same manner as the electronic component 2, the heat generated by the electronic component 2 can be conducted with high efficiency through the heat diffusion plate 31 via the bonding materials 7a and 7b and then conducted to the heat radiation part 4 with high efficiency. Another reason is that the first heat radiation vias 15a and the second heat radiation vias 15b, which extend in the direction intersecting with the main face of the printed circuit board 1, are cross-connected to the upper conductor layer 12, the lower conductor layer 13, and the internal conductor layers 14, which are provided along the main face of the printed circuit board 1.

This effect is further enhanced by the presence of the heat diffusion plate 31 and the heat radiation part 4 disposed on the lower main face 11b of the printed circuit board 1.

The heat H1 and the heat H2 conducted downward in the printed circuit board 1 reach the lower conductor layer 13 that corresponds to a region directly below the electronic component 2 and the heat diffusion plate 31 and a region outside that region. The heat H1 and the heat H2 are then conducted to the coolant 42 through the heat radiation member 41 located below the lower conductor layer 13. The heat H1 and the heat H2 conducted to the coolant 42 are cooled by a water- or air-cooling mechanism (not shown).

As described above, the semiconductor device 100 according to the present embodiment has a configuration capable of radiating heat via the route passing through the first heat radiation vias 15a and the route passing through the second heat radiation vias 15b. This significantly improves the efficiency of radiating heat downward, as compared to the case where heat can be radiated only through the first heat radiation vias 15a located below the electronic component 2 or the case where heat can be radiated only through the second heat radiation vias 15b away from the electronic component 2.

In the case where the heat diffusion plate 31 is not located on the upper main face 11a of the printed circuit board 1 and disposed on only the lower main face 11b of the printed circuit board 1, if the printed circuit board 1 has low heat resistance down to the lower main face 11b, the heat diffusion plate 31 can produce a good effect. However, the heat resistance will increase because the route for conducting heat to the heat radiation part 4 only through the first heat radiation vias 15a located below the electronic component 2 becomes a main route for conducting heat to the heat diffusion plate 31.

In particular, the presence of the heat diffusion plate 31 contributes greatly to the effect of improving the efficiency of heat radiation through the second heat radiation vias 15b in the semiconductor device 100 according to the present embodiment. The presence of the heat diffusion plate 31, as compared to the absence thereof, improves the efficiency of radiating heat to the coolant 42 via the heat radiation member 41.

In the semiconductor device 100 according to the present embodiment, the heat radiation vias 15 are provided not only in the region directly below the heat diffusion plate 31 but also outside the heat diffusion plate 31 as illustrated in, for example, FIGS. 1 and 14. Accordingly, not only the heat generated by the electronic component 2 can be conducted downward through the heat radiation vias 15 in the region directly below the heat diffusion plate 31, but also the heat diffused to the outside of the heat diffusion plate 31 can be conducted downward through the heat radiation vias 15.

As described previously, like the heat diffusion plate 31, the upper conductor layer 12, the lower conductor layer 13, and the internal conductor layers 14 can radially diffuse the heat generated by the electronic component 2 toward the outer periphery. However, the upper conductor layer 12, the lower conductor layer 13, and the internal conductor layers 14 with thicknesses of approximately 35 μm have high heat resistance and cannot radially diffuse a sufficient amount of heat. In view of this, it is also conceivable to increase the thicknesses of the upper conductor layer 12, the lower conductor layer 13, and the internal conductor layers 14 to approximately 500 μm, but this increases the manufacturing cost and causes difficulty in miniaturization of a wiring pattern. The use of the heat diffusion plate 31, however, allows the upper conductor layer 12, the lower conductor layer 13, and the internal conductor layers 14 to have thicknesses of approximately 35 μm, and makes it also possible to achieve design that reduces the manufacturing cost, and miniaturization of a wiring pattern.

If the area of a region capable of heat radiation is increased, the effect of improving the heat radiation capability is further enhanced. Therefore, the heat radiation capability can be further improved by further increasing the area of contact between the printed circuit board 1 and the coolant 42 for heat radiation.

Figure 16:
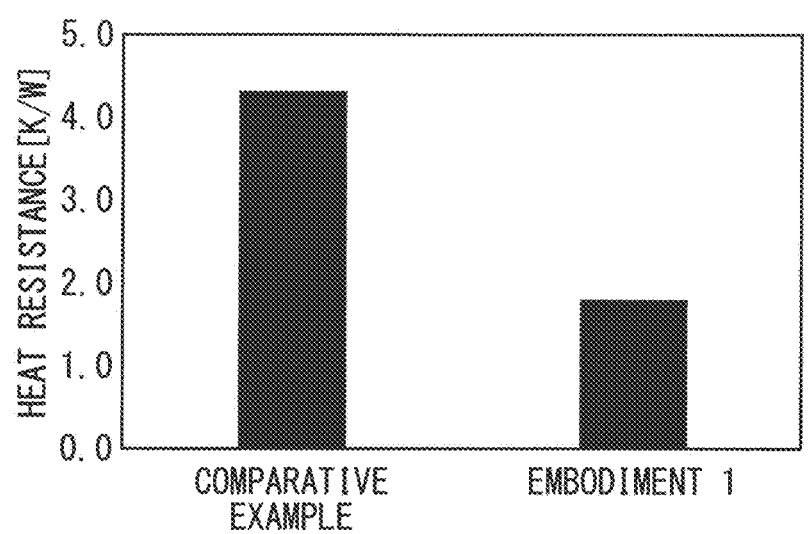
FIG. 16 illustrates a result of comparing the heat resistance values of the semiconductor device according to Embodiment 1 of the present invention and a semiconductor device according to a comparative example.

Next, how much the heat radiation efficiency can be improved by the presence of the heat radiation vias 15 and the heat diffusion plate 31, as compared to the case where only the heat radiation vias 15 are provided, will be described with reference to FIG. 16. Specifically, FIG. 16 illustrates the results of considering heat radiation resistance during heat conduction by using heat resistance values, for a configuration in which both the heat radiation vias 15 and the heat diffusion plate 31 are provided as in the semiconductor device 100 and for a configuration as a comparative example in which only the first heat radiation vias 15a are provided and the second heat radiation vias 15b and the heat diffusion plate 31 are not provided.

The term "heat resistance" as used herein is an indicator indicating the unlikelihood of conducting temperature and is defined by a temperature-rise value per unit heating value. In the semiconductor device 100 according to the present embodiment, heat resistance (Rth) in a region ranging from the electronic component 2 to a case 33 in the up-down direction is expressed by Expression (1) below. In Expression (1), Si(m²) is the area of heat conduction of each member, li(m) is the thickness of each member, λi(W/(m·K)) is the thermal conductivity of each member, Q(W) is the amount of passing heat, and Thi(K) and Tli(K) are respectively the temperature on the high temperature side and the temperature on the low temperature side.

Expression 1

$$R_{th} = \sum \frac{l_i}{\lambda_i S i} = \sum \frac{Th_i - Tl_i}{Q} \quad (1)$$

Here, a model used in the calculation of heat resistance will be described. The printed circuit board 1 has dimensions of 25×25 mm in plan view and a thickness of 1.65 mm. The electronic component 2 has dimensions of 10×10 mm in plan view and is assumed to be disposed in the central portion of the printed circuit board 1. That is, the spacing between each of the four edges of the electronic component 2 viewed from above and each of the four edges of the printed circuit board 1 viewed from above is almost equal. The upper conductor layer 12, the lower conductor layer 13, and the internal conductor layers 14 all have a thickness of 105 μm and have a four-layer structure as illustrated in FIG. 2. In the printed circuit board 1, 25 first heat radiation vias 15a are provided at equal intervals in a portion that overlaps the electronic component 2 in plan view viewed from above, and 63 second heat radiation vias 15b are provided at equal intervals around the first heat radiation vias 15a. The heat radiation vias 15 have a circular cylindrical shape and have a diameter of 0.6 mm when their holes are viewed from above. The conductor film on the inner wall faces of the holes have a thickness of 0.05 mm.

The heat diffusion plate 31 of the heat diffusion part 3 in the above model has outside dimensions of 20×15 mm in plan view and a thickness of 1 mm, and covers the heat radiation vias 15 from above. The heat radiation member 41 have dimensions of 20×15 mm in plan view and a thickness of 0.4 mm.

The upper conductor layer 12, the lower conductor layer 13, the internal conductor layers 14, the conductor film 10, and the heat diffusion plate 31 in the above model are formed of copper and have thermal conductivity of 398 W/(m·K). The heat radiation member 41 has thermal conductivity of 2.0 W/(m·K).

The model of the semiconductor device 100 according to the present embodiment and the model of the comparative example differ only in that the model of the present embodiment includes the first heat radiation vias 15a and the second heat radiation vias 15b, whereas the model of the comparative example includes only the first heat radiation vias 15a, and that the model of the present embodiment includes the heat diffusion plate 31, whereas the model of the comparative example does not include the heat diffusion plate 31. The other configurations including the aforementioned dimensions are entirely the same.

FIG. 16 illustrates the results of simulating the heat resistance values using the above-described models and thermal analysis software based on Expression (1) for the semiconductor device 100 and the comparative example. In FIG. 16, "Comparative Example" indicates the heat resistance value of the model of the comparative example, and "Embodiment 1" indicates the heat resistance value of the model of the semiconductor device 100 according to the present embodiment. The vertical axis in FIG. 16 indicates the heat resistance.

As illustrated in FIG. 16, the heat resistance can be reduced by about 53% by providing the second heat radiation vias 15b and the heat diffusion plate 31 as in the semiconductor device 100 according to the present embodiment, as compared to the case where the second heat radiation vias 15b and the heat diffusion plate 31 are provided. Since low heat resistance indicates a high heat radiation capability, this result shows that the heat radiation capability can be improved by providing the second heat radiation vias 15b and the heat diffusion plate 31 as in the semiconductor device 100 according to the present embodiment, as compared to the comparative example in which the second heat radiation vias 15b and the heat diffusion plate 31 are not provided.

Figure 17:
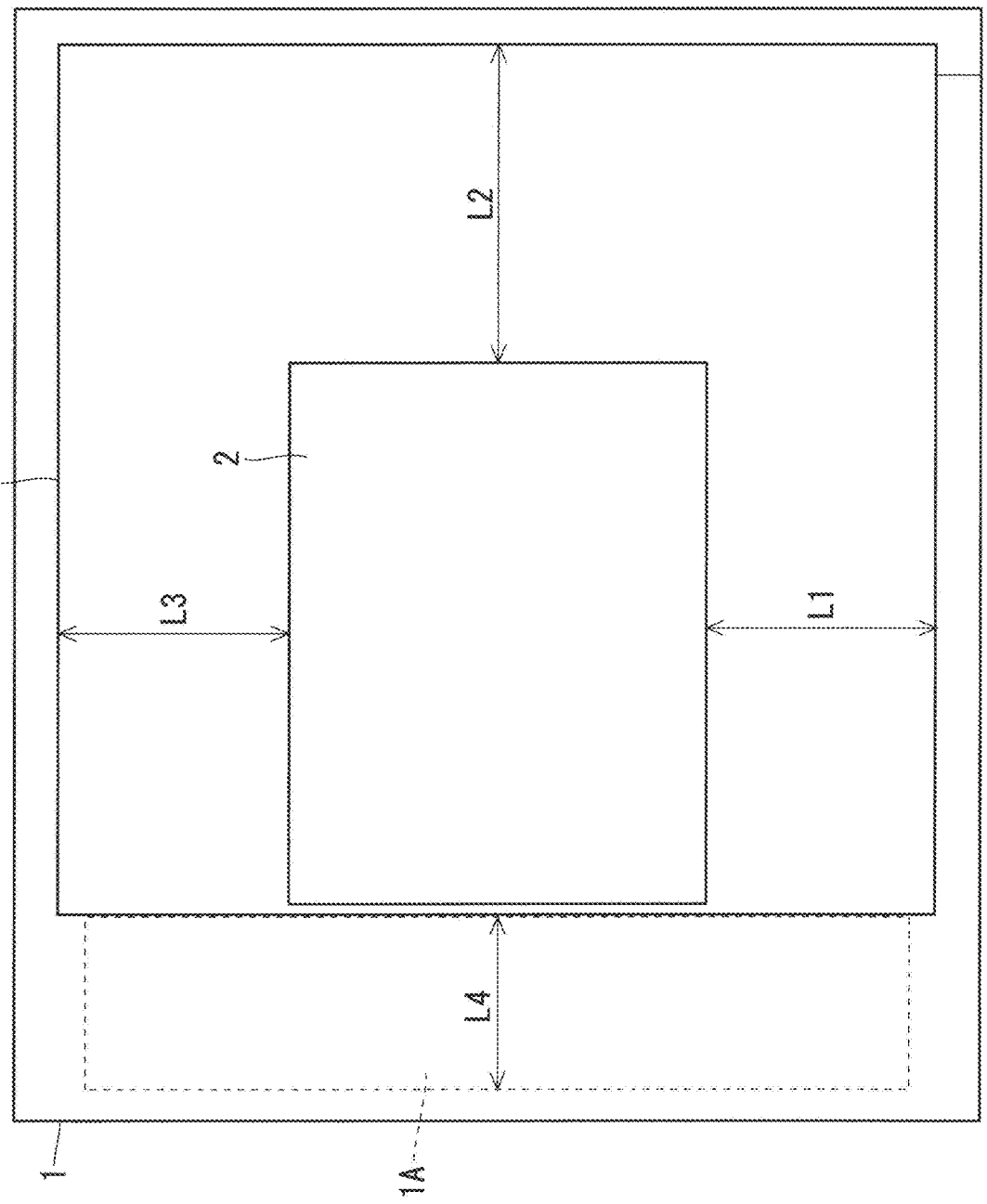
FIG. 17 is a plan view illustrating the dimensions of a model used in the comparison of the heat resistance values.
Figure 18:
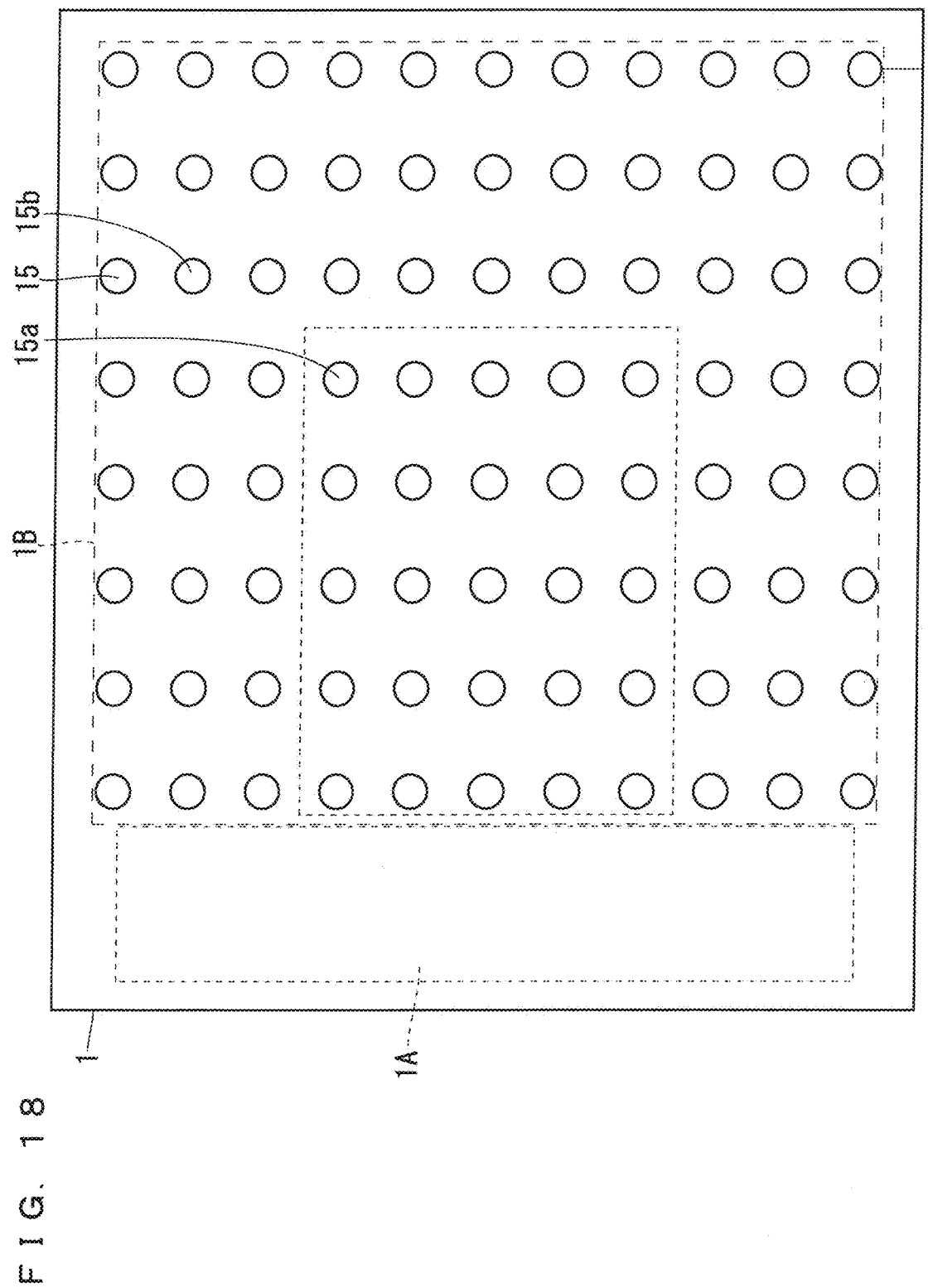
FIG. 18 is a plan view illustrating the model used in the comparison of the heat resistance values.

Next, the result of studying a region where the heat radiation vias 15 bonded to the heat diffusion plate 31 are ought to be disposed will be described with reference to FIGS. 17 to 19. FIGS. 17 and 18 almost embody the model of the semiconductor device 100 according to the present embodiment, used in the aforementioned calculation of the heat resistance. The spacings between each of three edges of the electronic component 2, except the edge on the side facing the region 1A, viewed from above, and each of three edges of the heat diffusion plate 31, except the edge on the side facing the region 1A, viewed from above, are indicated by L1, L2, and L3.

In the above model, the distances between each of the three edges of the electronic component 2 viewed from above and each of the three edges of the heat diffusion plate 31 viewed from above are almost equal, and accordingly the distances L1 to L3 are also almost equal. In the semiconductor device 100, basically the second heat radiation vias 15b are not formed in the region 1A, and therefore the second heat radiation vias 15b do not exist in the region 1A in FIGS. 17 and 18, but the width of the region 1A is indicated by a distance L4 for reference.

Figure 19:
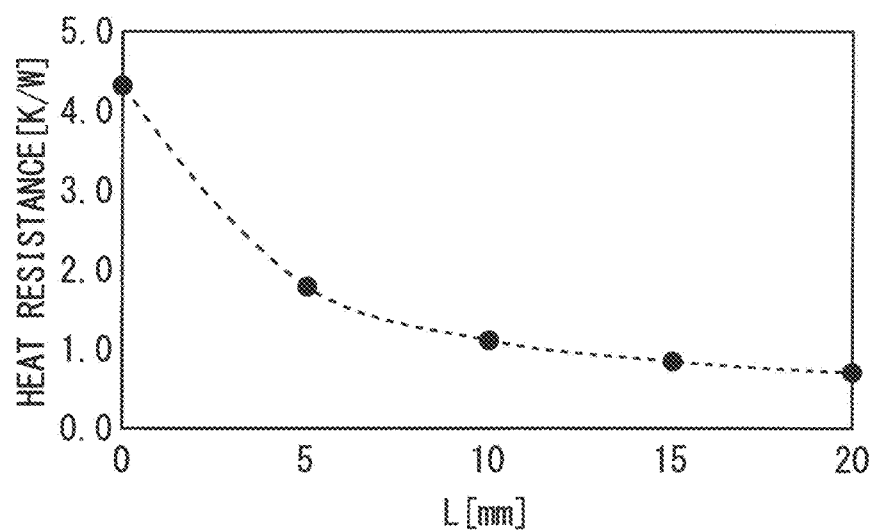
FIG. 19 illustrates a relationship between the heat resistance of the semiconductor device and the spacing between an edge of the electronic component and a heat radiation via in an edge portion of a heat diffusion plate.

In FIG. 19, the horizontal axis indicates the distance L (corresponding to any of L1 to L3) in units of mm between the edge in each direction of the electronic component 2 viewed from above and the edge portion in each direction of the heat diffusion plate 31 viewed from above, and the vertical axis indicates the heat resistance value (in units of K/W) of the semiconductor device 100 with varying distance.

As illustrated in FIG. 19, the heat resistance decreases and the heat radiation efficiency improves as the distance L (corresponding to any of L1 to L3) increases, i.e., as the area of the heat diffusion plate 31, i.e., the region where the second heat radiation vias 15b are provided, increases. However, the reduction in the heat resistance value becomes saturated when the value of the distance L reaches 20 mm. Thus, even if the distance L is further increased from 20 mm and the heat radiation vias 15 and the heat diffusion plate 31 with the distances L1 to L3 greater than or equal to 20 mm are bonded together with the bonding material 7a, the amount of change in the heat resistance value will decrease, as compared to the case where the heat radiation vias 15 and the heat diffusion plate 31 with the distances L1 to L3 less than or equal to 20 mm are bonded together with the bonding material 7a.

From this, it can be said that the heat diffusion plate 31 is preferably configured to have the above distances L1 to L3 falling within the range of 20 mm and to be bonded to the second heat radiation vias 15b.

In the present embodiment, the second heat radiation vias 15b are provided in the second region of the printed circuit board 1 around the first region where the first heat radiation vias 15a are provided. Thus, the printed circuit board 1 has lower mechanical rigidity than in the case where the second heat radiation vias 15b are not provided. However, by bonding the heat diffusion plate 31 to the upper conductor layer 12 on the upper main face 11a of the printed circuit board 1 with the bonding material 7a, the structure configured of the printed circuit board 1 and the heat diffusion plate 31 has higher flexural rigidity than the printed circuit board 1 alone. Accordingly, the deformation of the printed circuit board 1 can be suppressed.

The configuration of the semiconductor device disclosed in Patent Document 3 includes an electronic component, a printed circuit board, a heat diffusion plate, and a heat radiation part in order from above, and the heat diffusion plate is disposed on the underside of the printed circuit board. This configuration reduces heat resistance by 25%, as compared to the case where the heat diffusion plate is not provided. Meanwhile, the semiconductor device 100 according to the present embodiment can reduce heat resistance by approximately 53%, as compared to the case where the heat diffusion plate is not provided, and has heat resistance less than or equal to a half of the heat resistance of the semiconductor device disclosed in Patent Document 3. Accordingly, the semiconductor device 100 can have a considerably high heat radiation capability.

With a high heat radiation capability, it is possible to reduce the size or number of heat radiation parts and thereby to reduce the cost of parts. In the configuration of the semiconductor device disclosed in Patent Document 3, the electronic component is disposed on the upper main face of the printed circuit board, and the heat diffusion plate is disposed on the lower main face thereof. This configuration requires two reflow heat treatment steps at a minimum during the manufacturing process and may increase the manufacturing cost. In contrast, the manufacturing method according to the present embodiment can be implemented by only a single reflow heat treatment step and therefore can reduce the manufacturing cost.

Embodiment 2

Device Configuration

Figure 20:
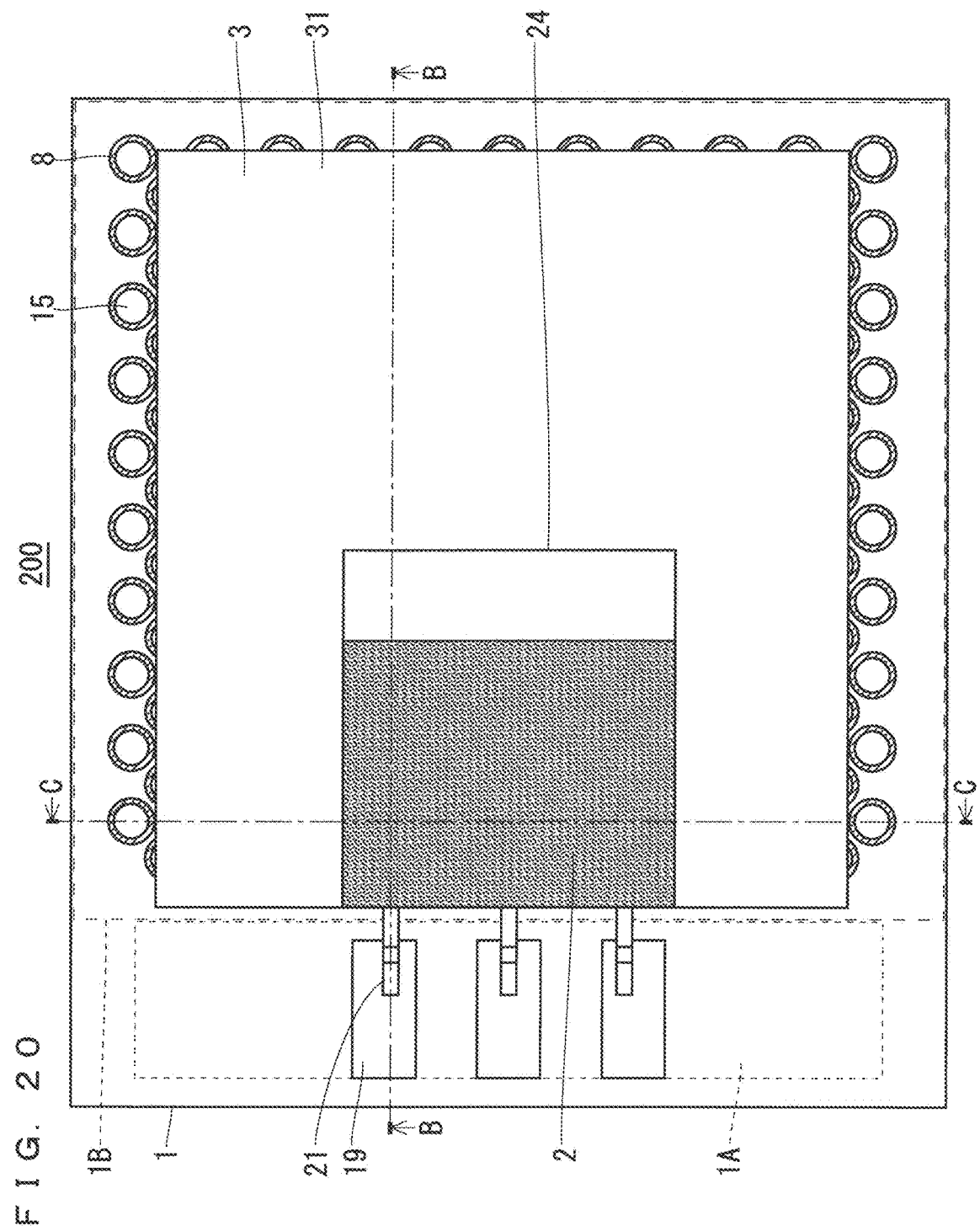
FIG. 20 is a plan view illustrating a configuration of a semiconductor device according to Embodiment 2 of the present invention.
Figure 21:
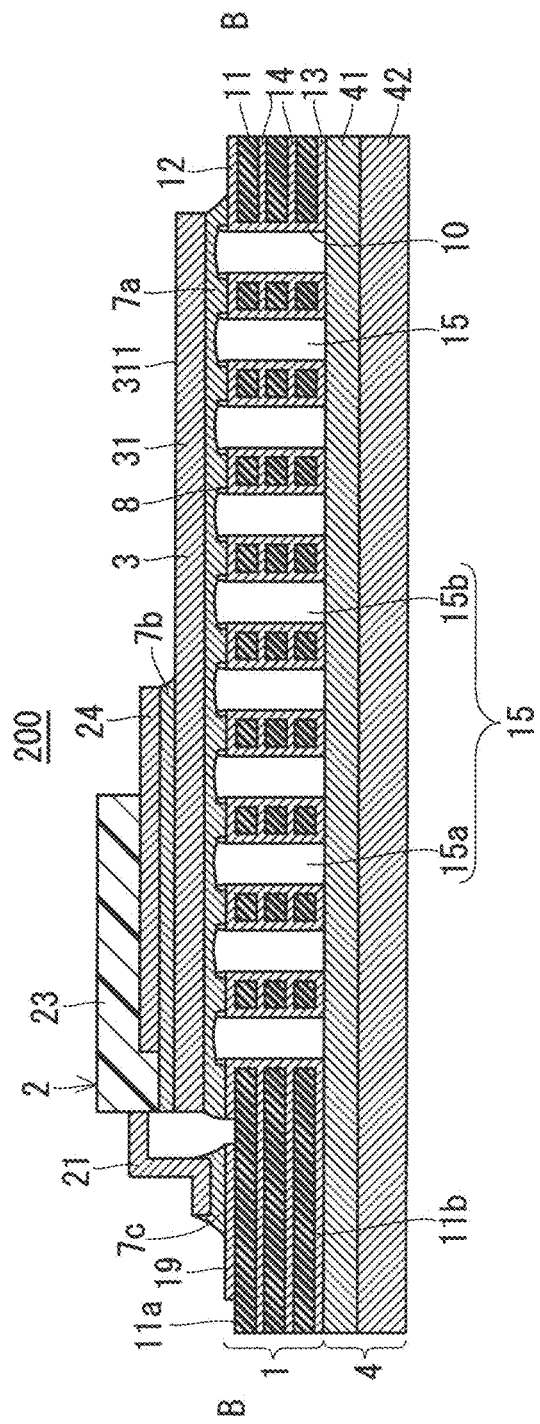
FIG. 21 is a sectional view illustrating the configuration of the semiconductor device according to Embodiment 2 of the present invention.

FIG. 20 is a plan view illustrating a configuration of a semiconductor device 200 according to Embodiment 2 of the present invention and a top view of the semiconductor device 100, viewed from above. FIG. 21 is a sectional view taken along arrows B-B in FIG. 20. In the following description, the face of the printed circuit board 1 on which the electronic component 2 is mounted is referred to as an upper face, and the face on the opposite side thereof as a lower face, and the upper side of the semiconductor device 200 is referred to as the upper face side on which the electronic component 2 is mounted.

FIGS. 20 and 21 illustrate a characteristic part of the semiconductor device 200, and this characteristic part does not necessarily have to be an overall configuration of the semiconductor device 200, but it is also possible to configure the semiconductor device 200 of only this characteristic part.

In FIGS. 20 and 21, constituent elements identical to those of the semiconductor device 100 according to Embodiment 1 described with reference to FIGS. 1 and 2 are given the same reference signs, and redundant descriptions thereof will not be given.

As illustrated in FIGS. 20 and 21, in the semiconductor device 200, the electronic component 2 is mounted on the heat diffusion part 3 provided on the upper face side of the printed circuit board 1, and the heat radiation part 4 is provided on the lower face side of the printed circuit board 1. On regions of the upper conductor layer 12 that are adjacent to the first heat radiation vias 15a and the second heat radiation vias 15b in plan view, for example circular projections 8 are formed so as to surround the holes of the first heat radiation vias 15a and the second heat radiation vias 15b in plan view. The semiconductor device 200 differs from the semiconductor device 100 according to Embodiment 1 in the presence of these projections 8.

For example, the projections 8 are formed of a solder resist and have a shape protruding upward from the upper face of the upper conductor layer 12. In this way, the projections 8 are provided on the upper main face 11a of the printed circuit board 1, and the electronic component 2 and the heat diffusion part 3 are disposed so as to overlap the projections 8 in plan view viewed from above the printed circuit board 1. The projections 8 illustrated in FIG. 21 have a trapezoidal cross-sectional shape, but this is merely one example, and the cross-sectional shape may be a semi-circular shape, a semi-ellipsoidal shape, or a rectangular shape, or may be any shape other than these shapes.

Manufacturing Method

Next, a method of manufacturing the semiconductor device 200 will be described with reference to FIGS. 22 and 23, focusing on the step of manufacturing the projections 8.

For example, the projections 8 can be formed of a solder resist used in well-known resist printing in the step of manufacturing the printed circuit board, but may be formed of a resin or a metal such as copper used in well-known silk printing or symbol printing. If these materials are used, the projections 8 can be formed in a general printed-circuit-board manufacturing step and accordingly can be manufactured at low cost without requiring special steps. Instead of using the aforementioned print process, the projections 8 may be formed by attaching a resin sheet having a pattern of the projections 8 to the printed circuit board 1, or may be formed by appropriately combining these forming methods. The material for the projections 8 may be a material that is not likely to get wet with the solder bonding material 7a.

Figure 22:
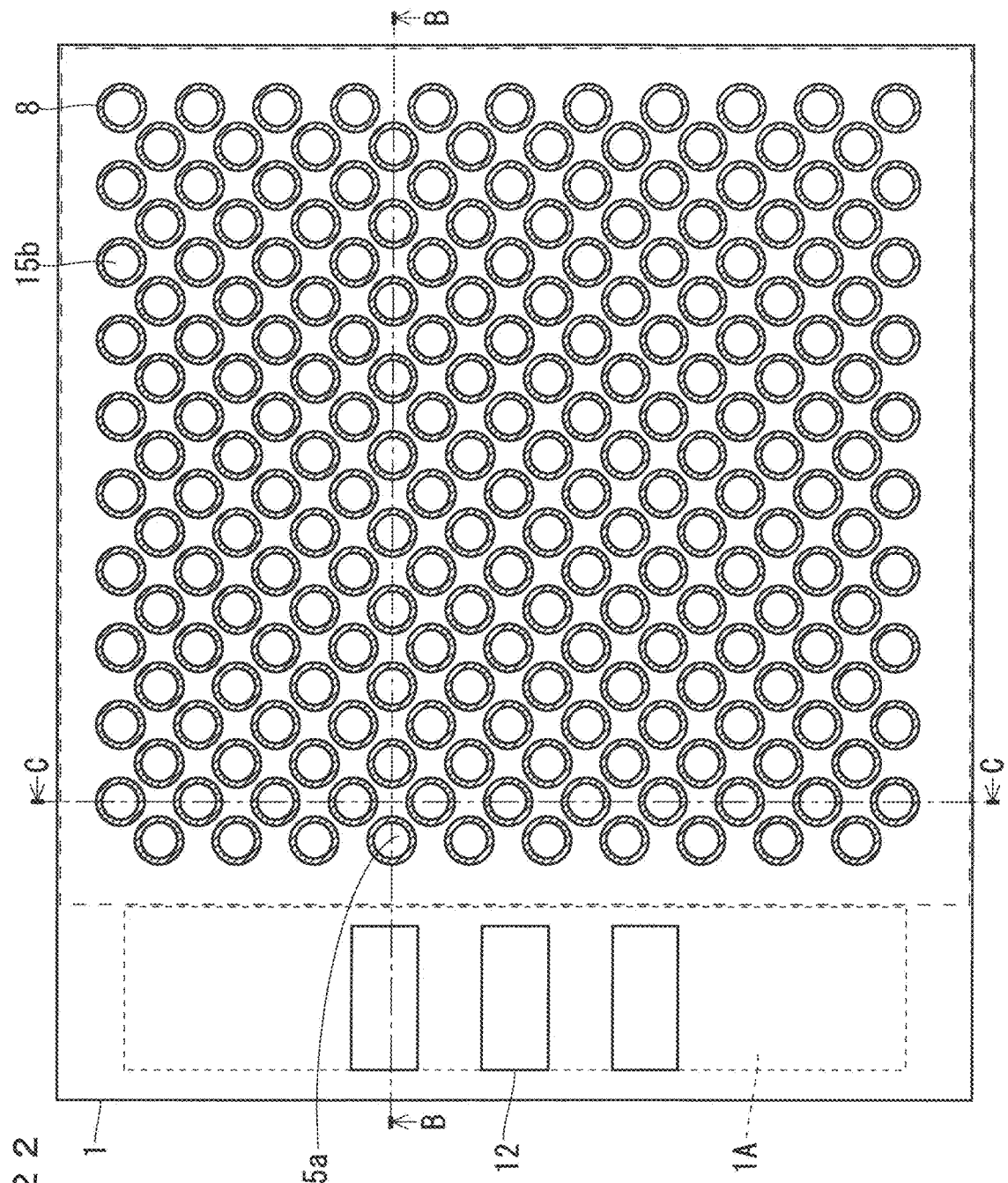
FIG. 22 is a plan view illustrating a configuration of a printed circuit board according to Embodiment 2 of the present invention.

FIG. 22 is a top view of the printed circuit board 1, viewed from above, with the projections 8 formed on the upper main face 11a of the printed circuit board 1 using the manufacturing method and the material described above, and FIG. 23 is a sectional view taken along arrows B-B in FIG. 22.

Figure 23:
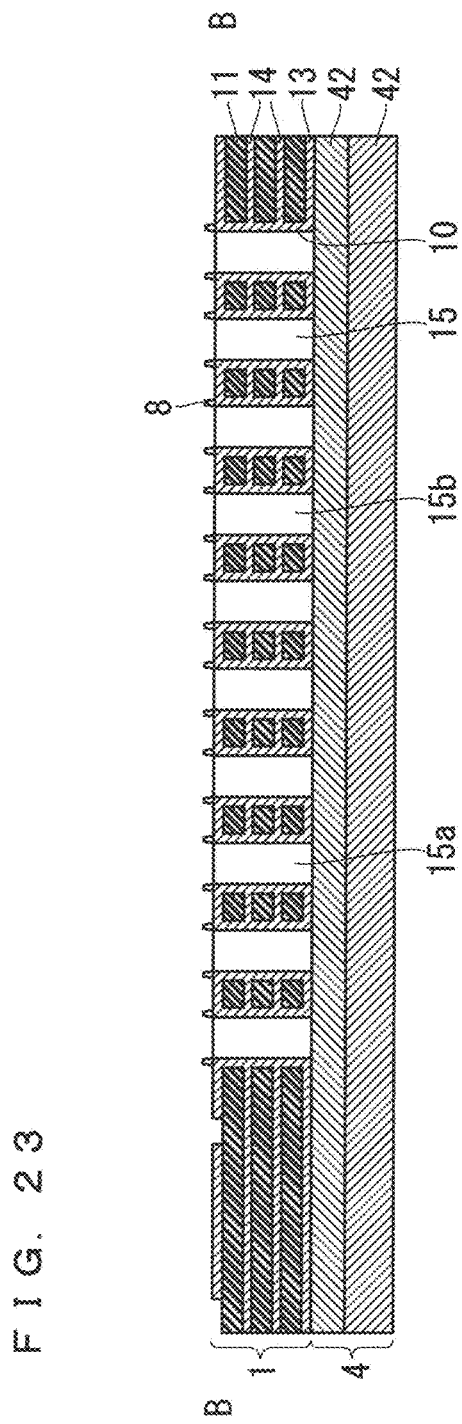
FIG. 23 is a sectional view illustrating the configuration of the printed circuit board according to Embodiment 2 of the present invention.

As illustrated in FIGS. 22 and 23, the circular projections 8 are provided on the upper main face 11a of the printed circuit board 1 so as to surround the holes of all the first heat radiation vias 15a and the second heat radiation vias 15b in plan view.

The electronic component 2 and the heat diffusion plate 31 are mounted and bonded together, overlapping the projections 8 on the upper main face 11a of the printed circuit board 1 provided with the projections 8. Accordingly, the semiconductor device 200 illustrated in FIGS. 20 and 21 is obtained. The method of manufacturing the semiconductor device 200 is identical to the manufacturing method according to Embodiment 1 described with reference to FIGS. 6 to 10 and FIGS. 11 to 13, except the step of preparing the printed circuit board 1 including the projections 8.

Actions and Effects

Next, actions and effects of the present embodiment will be described. The present embodiment achieves actions and effects described below, in addition to the effects similar to those of Embodiment 1.

In the case where the circular projections 8 are provided so as to surround the holes of the first heat radiation vias 15a and the second heat radiation vias 15b and if reflow heat treatment is performed after the solder paste 6a is deposited on the upper conductor layer 12 and the heat diffusion plate 31 is mounted thereon as illustrated in FIG. 6, the projections 8 have the effect of suppressing the entry of the molten solder paste 6a into the holes of the first heat radiation vias 15a and the second heat radiation vias 15b.

That is, the presence of the projections 8 increases the spacing in the up-down direction between the upper conductor layer 12 and the heat diffusion plate 31 by an amount corresponding to the height of the projections 8 protruding from the upper conductor layer 12, and thereby increases the spacing in the up-down direction between the upper conductor layer 12 and the heat radiator plate 24. Accordingly, the bonding material 7a formed of the molten solder paste 6a is bonded to the heat diffusion plate 31 while being subjected to stresses so as to be pulled upward, i.e., toward the heat radiator plate 24 and the heat diffusion plate 31. As a result, the bonding material 7a has an arch-like cross-sectional shape above the holes of the heat radiation vias 15 as illustrated in FIG. 21.

This reduces the possibility that, in the region between the upper conductor layer 12 and the heat diffusion plate 31, the bonding material 7a may flow into the heat radiation vias 15 and flow along the inner wall faces of the heat radiation vias 15. As a result, it is possible to reduce the possibility that the bonding material 7a may be electrically short-circuited with the upper conductor layer 12 and the coolant 42 located directly below and thereby to improve the reliability of the semiconductor device 200 as a whole.

Also, the spacings in the up-down direction between the upper conductor layer 12 and each of the heat radiator plate 24 and the heat diffusion plate 31 can be easily controlled by mounting the heat diffusion plate 31 so as to overlap the projections 8 on the upper conductor layer 12. That is, the spacing between the lower face of the heat diffusion plate 31 bonded to the printed circuit board 1 and the upper face of the upper conductor layer 12 can be controlled by changing the print thickness or print position of a solder resist or the like that configures the projections 8. As a result, it is possible to manage the thickness of the bonding material 7a on the upper conductor layer 12 and to improve the quality of soldering using the bonding material 7a.

As described previously, the bonding material 7a spreads along the main face of the heat diffusion plate 31 in the region between the upper conductor layer 12 and the heat diffusion plate 31, but does not flow into the heat radiation vias 15 and does not reach the lower conductor layer 13. Therefore, the bonding material 7a allows the joint between the printed circuit board 1 and the heat diffusion plate 31 of the heat diffusion part 3 to form a favorable fillet. As a result, whether the bonding condition with the bonding material 7a is good or bad can be easily determined by an appearance inspection, and in particular in the case where the electronic component 2 and other components are mounted by an auto mechanism such as a mounter, the efficiency of the appearance inspection for inspecting the mounting condition can be considerably improved.

If the projections 8 with a small diameter are formed of a solder resist so as to surround the heat radiation vias 15 in the regions of the upper conductor layer 12 that are adjacent to the heat radiation vias 15, the projections 8 exert water and oil repellency. This is because such a resist does not get wet with solder, as compared to the heat radiator plate 24, the heat diffusion plate 31, and the upper conductor layer 12 that have favorable solder wettability against the bonding material 7a. The projections 8 that surround the heat radiation vias 15 and do not get wet with solder can suppress the entry of the bonding material 7a, which is molten solder, into the heat radiation vias 15. This suppresses an electrical short-circuit with the coolant 42 via solder. If the projections 8 remain around the holes of the heat radiation vias 15, it is possible to smoothly exhaust a flux gas contained in the bonding material 7a from the heat radiation vias 15 to the outside. Accordingly, the occurrence of voids due to the flux gas in the bonding material 7a can be suppressed.

Note that the projections 8 may be not only formed adjacent to the heat radiation vias 15, but also formed at, for example, arbitrary positions between the heat diffusion plate 31 and the upper conductor layer 12. In this case, the height of the heat diffusion part 3 mounted on the printed circuit board 1 can be kept constant relative to the printed circuit board 1.

If the projections 8 are provided as symbols at the four corners of a region where the heat diffusion part 3 is mounted in plan view of the printed circuit board 1, viewed from above the upper main face 11a, the heat diffusion part 3 can be mounted such that the main faces of the heat diffusion plate 31 and the upper conductor layer 12 of the printed circuit board 1 are disposed almost in parallel with each other. The projections 8 can also be used as alignment marks that become important in disposing the heat diffusion plate 31.

In the case where the projections 8 are formed of a solder resist or a resin, the projections 8 have lower thermal conductivity than the bonding material 7a, but the heat diffusion plate 31 and the upper conductor layer 12 are not affected by the projections 8 in terms of heat conduction because they are metal-bonded together with the bonding material 7a.

Embodiment 3

Device Configuration

Figure 24:
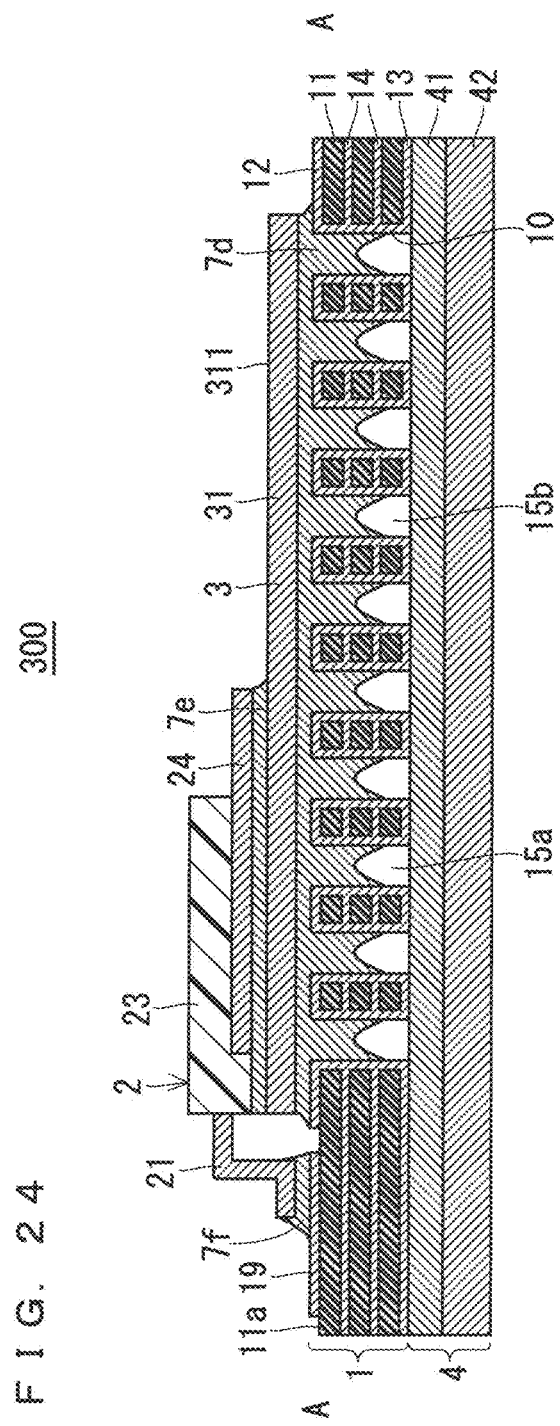
FIG. 24 is a sectional view illustrating a configuration of a semiconductor device according to Embodiment 3 of the present invention.

FIG. 24 is a sectional view illustrating a configuration of a semiconductor device 300 according to Embodiment 3 of the present invention. A top view of the semiconductor device 300, viewed from above, is identical to that of the semiconductor device 100 illustrated in FIG. 1, and FIG. 24 corresponds to the sectional view taken along arrows A-A in FIG. 1.

In the following description, the face of the printed circuit board 1 on which the electronic component 2 is mounted is referred to as an upper face, and the face on the opposite side thereof as a lower face, and the upper side of the semiconductor device 300 is referred to as the upper face side on which the electronic component 2 is mounted.

FIG. 24 illustrates a characteristic part of the semiconductor device 300, and this characteristic part does not necessarily have to be an overall configuration of the semiconductor device 300, but it is also possible to configure the semiconductor device 300 of only this characteristic part.

In FIG. 24, constituent elements identical to those of the semiconductor device 100 according to Embodiment 1 described with reference to FIGS. 1 and 2 are given the same reference signs, and redundant descriptions thereof will not be given.

As illustrated in FIG. 24, in the semiconductor device 300 according to Embodiment 3, a bonding material 7d is provided on the insides of at least some of the first heat radiation vias 15a overlapping the electronic component 2 and the second heat radiation vias 15b overlapping the heat diffusion plate 31 so as to occupy approximately one third of the volumes of the insides of the heat radiation vias 15. Note that the bonding material 7d may also be provided similarly on the inside of the second heat radiation vias 15b that do not overlap any of the electronic component 2 and the heat diffusion plate 31. The semiconductor device 300 differs from the semiconductor device 100 according to Embodiment 1 in that the bonding material 7d is provided on the inside of the heat radiation vias 15.

Manufacturing Method

Next, a method of manufacturing the semiconductor device 300 will be described with reference to FIGS. 25 to 27, i.e., sectional views illustrating manufacturing steps, focusing on the steps of mounting the electronic component 2 and the heat diffusion part 3.

Figure 25:
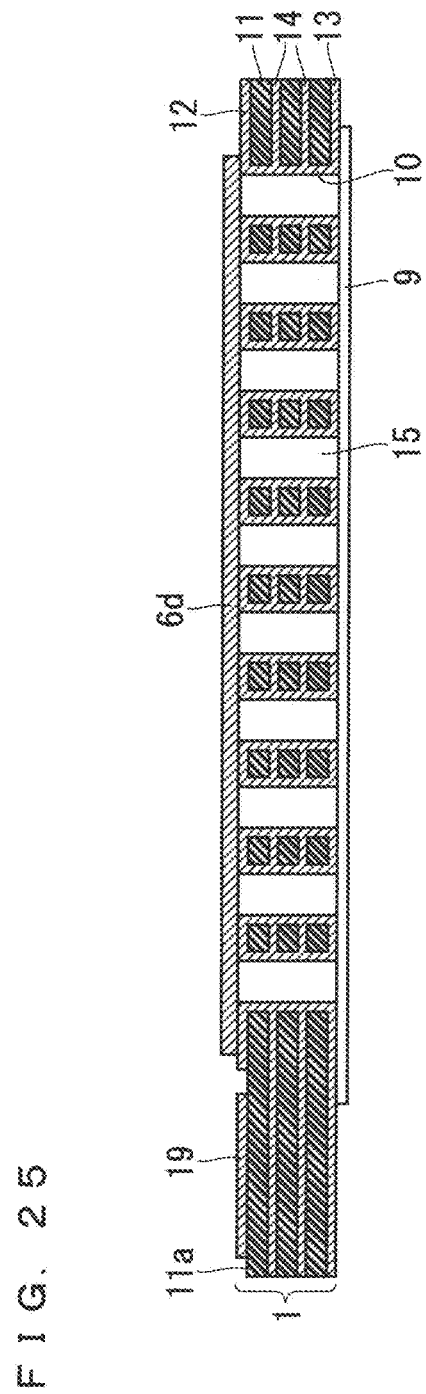
FIG. 25 is a sectional view illustrating a step of manufacturing the semiconductor device according to Embodiment 3 of the present invention.

In the step illustrated in FIG. 25, the printed circuit board 1 is prepared, which forms a hierarchical structure of a plurality of conductor layers including the upper conductor layer 12, the lower conductor layer 13, and the internal conductor layers 14 and the insulation layers 11 sandwiched between the conductor layers, and includes a plurality of heat radiation vias 15 penetrating the hierarchical structure in the thickness direction.

Then, as illustrated in FIG. 25, a solder plate 6d is placed on the upper main face 11a of the printed circuit board 1, i.e., on the upper conductor layer 12, via flux (not shown) used to remove a solder oxide film. By placing the solder plate 6d, the heat radiation vias 15 are covered from directly above. Note that the solder plate 6d has a size that can cover at least part of the first and second regions of the printed circuit board 1.

Also, a heat-resistant tape 9 such as polyimide is attached to the lower conductor layer 13 that corresponds to at least the first and second regions of the printed circuit board 1. The heat-resistant tape 9 is attached so as to block at least the holes of the heat radiation vias 15 from the side of the lower main face 11b.

Next, the heat diffusion plate 31 configuring the heat diffusion part 3 is mounted on the solder plate 6d, and well-known reflow heat treatment is performed in this state. Note that the step of mounting the heat diffusion part 3 is automatically performed by the previously described mounter.

Figure 26:
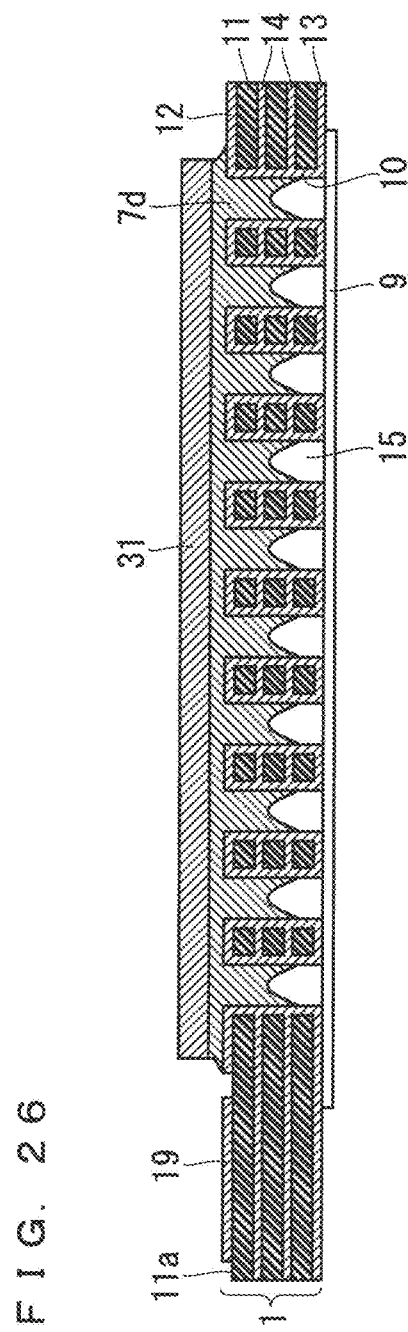
FIG. 26 is a sectional view illustrating a step of manufacturing the semiconductor device according to Embodiment 3 of the present invention.

Through the reflow heat treatment, the solder plate 6d melts, flows along the surface of the upper conductor layer 12, i.e., the upper main face 11a, and enters the heat radiation vias 15 as illustrated in FIG. 26, thereby forming a bonding material 7b. This is because, since the solder plate 6d is disposed so as to cover the holes of the heat radiation vias 15, the solder plate 6d on the holes melts and enters the heat radiation vias 15. On the other hand, since the heat-resistant tape 9 is attached to t the lower conductor layer 13 in the first and second regions, the molten solder plate 6d does not leak out of the heat-resistant tape 9, and the bonding material 7d remains inside the heat radiation vias 15. Note that the heat radiation vias 15 as a whole may be filled with the bonding material 7d, but as illustrated in FIG. 26, approximately one third of the volume of the insides of the heat radiation vias 15 is preferably filled with the bonding material 7d.

Here, in the reflow heat treatment for melting the solder plate 6d, if the solder plate 6d melts due to heating of the printed circuit board 1, the molten solder flows along the inner wall faces of the heat radiation vias 15, turns into bulk solder after the heating, and blocks the heat radiation vias 15. If the solder is supplied in a small amount, the ratio of the solder in the heat radiation vias 15 decreases, and therefore the volume of the bonding material 7d inside the heat radiation vias 15 can be adjusted by adjusting the thickness of the solder plate 6d.

Next, a solder plate 6e is placed on the heat diffusion plate 31. Also, a solder plate 6f is placed on the electrodes 19 on the upper main face 11a of the printed circuit board 1 via flux (not shown) used to remove a solder oxide film. Then, the electronic component 2 is mounted on the solder plate 6e so that the lead terminals 21 of the electronic component 2 come into contact with the solder plate 6f. In this state, well-known reflow heat treatment is performed. Note that the step of mounting the electronic component 2 is automatically performed by the previously described mounter.

Through the reflow heat treatment, the solder plate 6e melts and flows along the upper main face of the heat diffusion plate 31, thereby forming a laminar bonding material 7e as illustrated in FIG. 24. Note that the bonding material 7e also flows into the underside of the resin molding part 23 of the electronic component 2, but is not bonded to the resin material. Thus, the bonding material 7e simply comes in intimate contact with the resin molding part 23.

In the reflow heat treatment, the solder plate 6f also melts into the laminar bonding material 7f at the same time and bonds the lead terminals 21 and the electrodes 19 together. After bonding using the bonding materials 7d to 7f is completed, an appearance inspection step is performed to inspect the mounting condition.

After the solder in the heat radiation vias 15 has been fixed, the heat-resistant tape 9 is removed. Thereafter, the heat radiation member 41 is disposed in contact with the lower conductor layer 13 in the printed circuit board 1, and the coolant 42 is disposed in contact with the heat radiation member 41. The heat radiation member 41 and the coolant 42 are then brought into intimate contact with each other so as to form the heat radiation part 4. Note that the printed circuit board 1 and each member of the heat radiation part 4 may be bonded together with a bonding material such as solder. Through the above-described steps, the semiconductor device 300 illustrated in FIG. 24 is obtained.

Actions and Effects

Next, actions and effects of the present embodiment will be described. The present embodiment achieves actions and effects described below, in addition to the effects similar to those of Embodiment 1.

The configuration in which the bonding material 7d is provided inside the heat radiation vias 15 as in the semiconductor device 300 can increase the amount of heat conduction when the heat generated by the electronic component 2 is conducted through the first heat radiation vias 15a and the second heat radiation vias 15b to the heat diffusion plate 31. This is because the heat radiation vias 15 filled with the conductive member such as solder have higher thermal conductivity than the hollow heat radiation vias 15. In particular, it is more effective to provide the bonding material 7d with high thermal conductivity so as to increase the area of the bonding material 7d in a section that intersects with the direction of extension of the heat radiation vias 15. In other words, the amount of heat that can be conducted increases as the volume of portions of the heat radiation vias 15 in which the bonding material 7d has a circular columnar shape increases.

Figure 27:
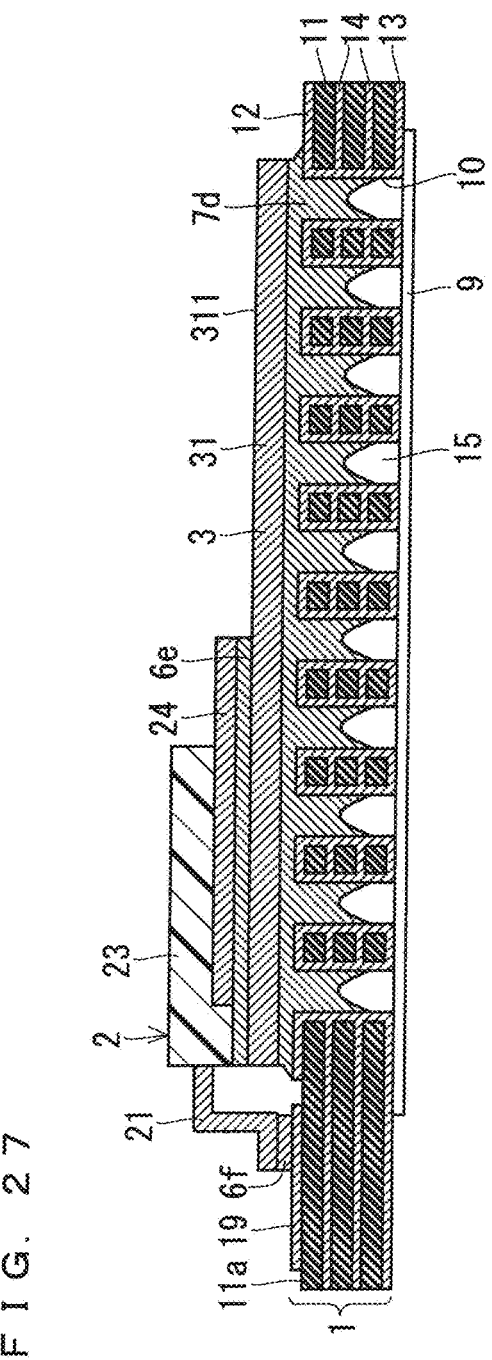
FIG. 27 is a sectional view illustrating a step of manufacturing the semiconductor device according to Embodiment 3 of the present invention.

To describe this in further detail, as illustrated in FIGS. 24 and 27, the bonding material 7*d* that exists at least between the upper conductor layer 12 and the lower conductor layer 13 has a circular columnar shape in portions of the heat radiation vias 15 that are filled with the bonding material 7*d*, and sections that intersect with the direction of extension of the heat radiation vias 15 are formed entirely of solder. This increases thermal conductivity.

To improve thermal conductivity, the length of the portions of the heat radiation vias 15 in which the bonding material 7*d* has a circular columnar shape is preferably one third or more the length of the heat radiation vias 15 in the direction of extension. This applies to both of the case where the portions in which the bonding material 7*d* has a circular columnar shape exist only on either the side of the upper conductor layer 12 or the side of the lower conductor layer 13, and the case where the portions in which the bonding material 7*d* has a circular columnar shape exist on both of the side of the upper conductor layer 12 and the side of the lower conductor layer 13. That is, the portions of the heat radiation vias 15 in which the bonding material 7*d* has a circular columnar shape preferably exist so as to occupy one third or more of the volume of the insides of the heat radiation vias 15.

If the heat radiation vias 15 are completely filled with the bonding material 7*d*, the upper conductor layer 12 and the coolant 42 may be electrically short-circuited. Thus, the reliability of the semiconductor device 300 can be improved by setting the length of the portions of the heat radiation vias 15 in which the bonding material 7*d* has a circular columnar shape to 90% or less of the length of the heat radiation vias 15 in the direction of extension.

Accordingly, the length of the portions of the heat radiation vias 15 in which the bonding material 7*d* has a circular columnar shape is set to 30% or more of the length of the heat radiation vias 15 in the direction of extension in order to improve the heat radiation capability of the semiconductor device 300, or set to 90% or less of the length of the heat radiation vias 15 in the direction of extension in order to improve the reliability of the semiconductor device 300.

In this way, in order to control the length of the portions of the heat radiation vias 15 in which the bonding material 7*d* has a circular columnar shape, it is important to adjust the thickness of the solder plate 6*d* and to block the holes of the heat radiation vias 15 from the lower side with the heat-resistant tape 9. If solder flows into the heat radiation vias 15 with the holes blocked from the lower side by the heat-resistant tape 9, air in the heat radiation vias 15 cannot flow out of the holes from the lower side and is accumulated in the lower portions of the heat radiation vias 15. This prevents the solder from flowing into the lower portions of the holes and reaching the bottoms of the heat radiation vias 15 as illustrated in FIG. 24. This is why the heat-resistant tape 9 is removed after the solder is fixed in the heat radiation vias 15.

Embodiment 4

Device Configuration

Figure 28:
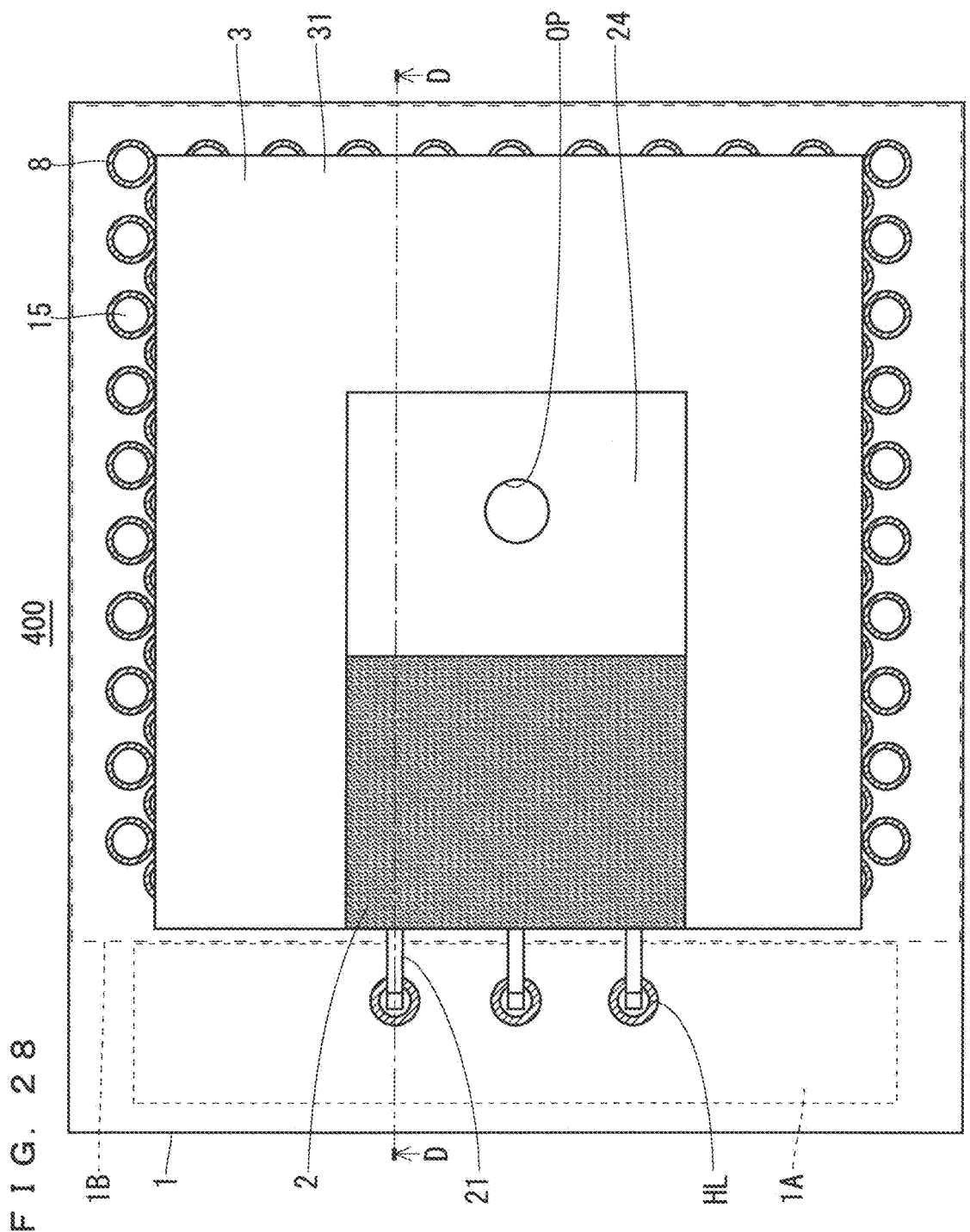
FIG. 28 is a plan view illustrating a configuration of a semiconductor device according to Embodiment 4 of the present invention.
Figure 29:
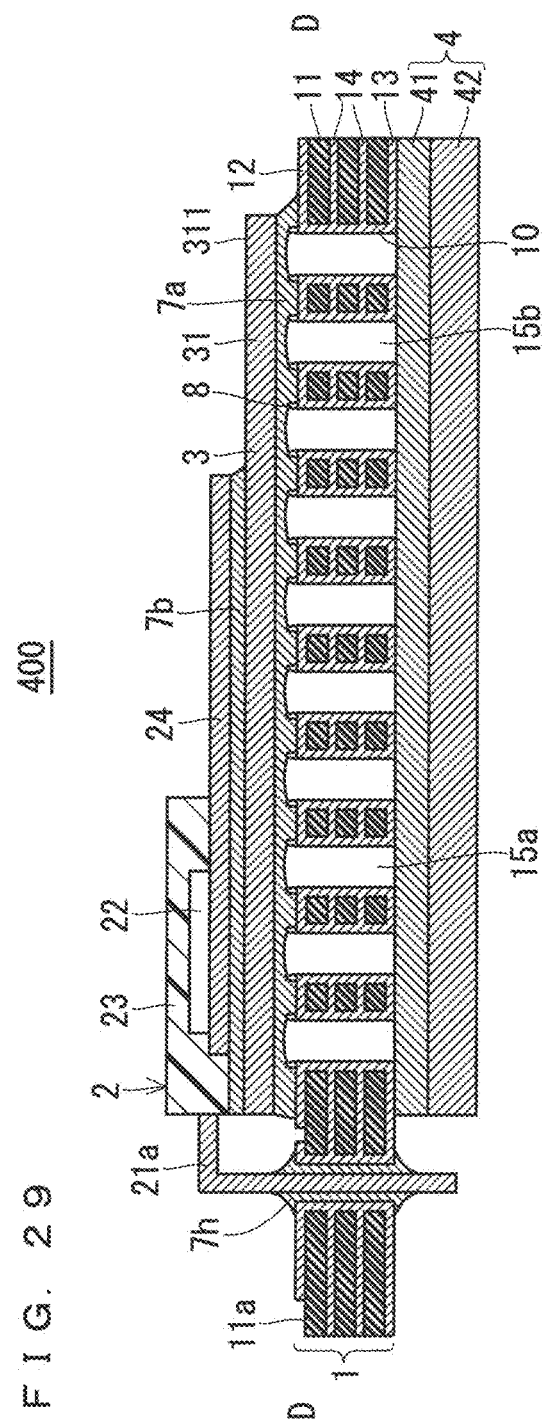
FIG. 29 is a sectional view illustrating the configuration of the semiconductor device according to Embodiment 4 of the present invention.

FIG. 28 is a plan view illustrating a configuration of a semiconductor device 400 according to Embodiment 4 of the present invention and a top view of the semiconductor device 400, viewed from above. FIG. 29 is a sectional view taken along arrows D-D in FIG. 28. In the following description, the face of the printed circuit board 1 on which the electronic component 2 is mounted is referred to as an upper face, and the face on the opposite side thereof as a lower face, and the upper side of the semiconductor device 400 is referred to as the upper face side on which the electronic component 2 is mounted.

FIGS. 28 and 29 illustrate a characteristic part of the semiconductor device 400, and this characteristic part does not necessarily have to be overall configuration of the semiconductor device 400, but it is also possible to configure the semiconductor device 400 of only this characteristic part.

In FIGS. 28 and 29, constituent elements identical to those of the semiconductor device 200 according to Embodiment 2 described with reference to FIGS. 20 and 21 are given the same reference signs, and redundant descriptions thereof will not be given.

As illustrated in FIGS. 28 and 29, in the semiconductor device 400, the lead terminals 21 of the electronic component 2 are inserted into terminal holes HL provided in the printed circuit board 1 and bonded to the insides of the terminal holes HL with the bonding material 7*h*. In this way, the semiconductor device 400 differs from the semiconductor device 200 according to Embodiment 2, which includes a surface-mounted substrate as the printed circuit board 1, in that the printed circuit board 1 is a through-hole-mounted substrate.

The electronic component 2 illustrated in FIGS. 28 and 29 is assumed to be a packaged product of MOSFET, such as TO-220 described with reference to FIG. 5, and the heat radiator plate 24 has an opening OP. In the semiconductor device 200 according to Embodiment 2, reflow heat treatment is performed to mount the lead terminals 21 on the printed circuit board 1, but in the semiconductor device 400 according to the present embodiment, the lead terminals 21 can be mounted on the printed circuit board 1 through processing in the flow.

In the semiconductor device 200, reflow heat treatment is performed to bond the heat diffusion plate 31 to the printed circuit board 1, and another reflow heat treatment is performed to bond the heat radiator plate 24 of the electronic component 2 to the heat diffusion plate 31 and bond the lead terminals 21 to the electrodes 19. At this time, the bonding material 7*a*, which bonds the heat diffusion plate 31 to the printed circuit board 1 together, may re-melt and cause misalignment between the heat diffusion plate 31 and the electronic component 2. This can result in a reduction of yields.

In the present embodiment, on the other hand, positioning is achieved by inserting the lead terminals 21 of the electronic component 2 into the terminal holes HL in the printed circuit board 1. This improves yields during mounting and reduces the manufacturing cost. Besides, misalignment is less likely to occur, and the bonding materials 7*a* and 7*b* can be formed through single reflow treatment. This further reduces the manufacturing cost.

Variation 1

Figure 30:
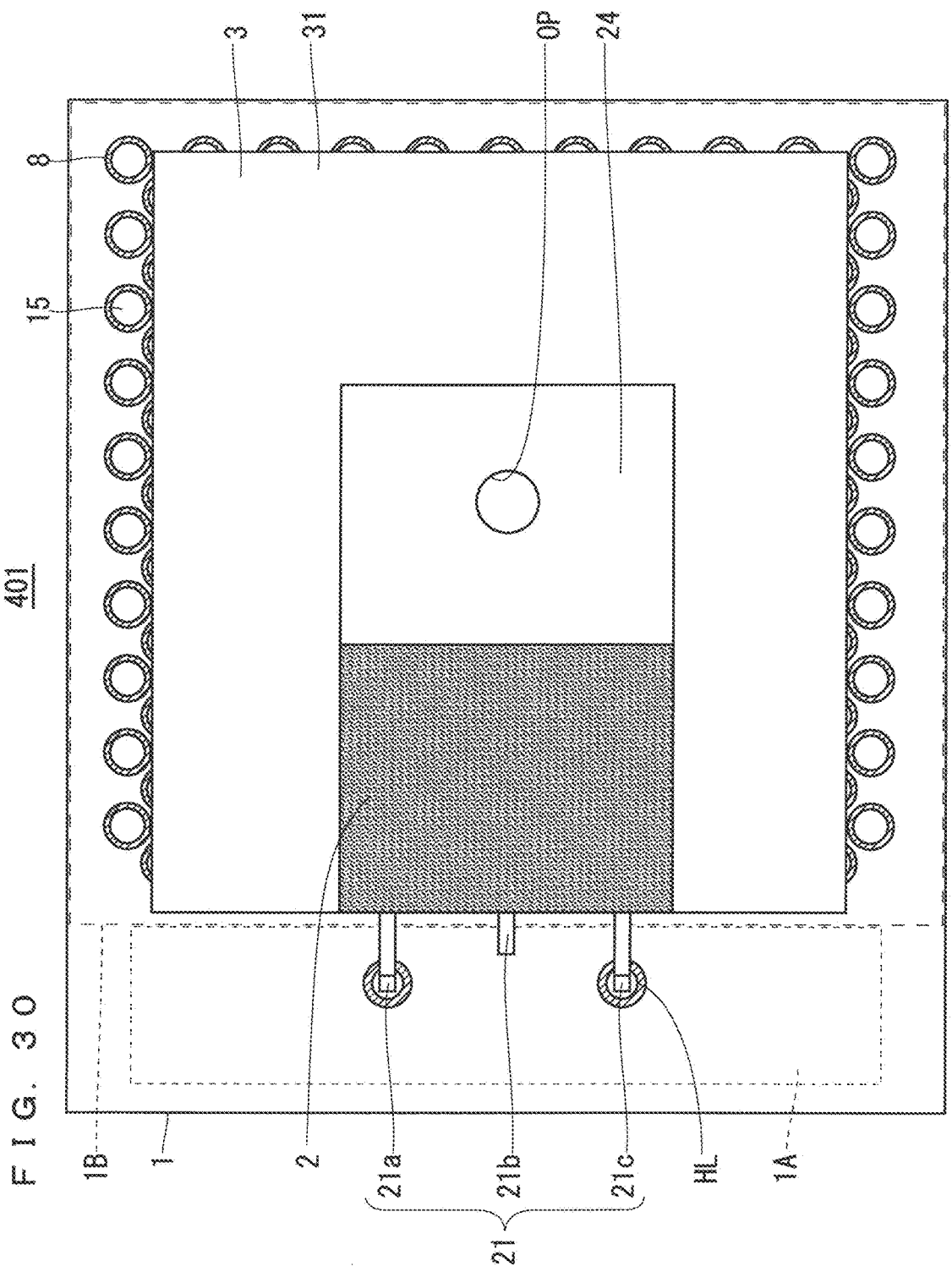
FIG. 30 is a plan view illustrating a configuration of a semiconductor device according to Variation 1 of Embodiment 4 of the present invention.

FIG. 30 is a plan view illustrating a configuration of a semiconductor device 401 according to Variation 1 of Embodiment 4 and a top view of the semiconductor device 401, viewed from above. As illustrated in FIG. 30, the semiconductor device 401 differs from the semiconductor device 400 according to Embodiment 4 in that, among three lead terminals 21*a*, 21*b*, and 21*c* of the electronic component 2, the lead terminal 21*b* in the center has a shorter length than the other lead terminals and is not in contact with the printed circuit board 1.

The electronic component 2 is assumed to be a packaged product of MOSFET such as TO-220. This variation describes a case where the lead terminal 21*b* is a drain terminal and is at the same potential as the heat radiator plate 24. In this case, the lead terminal 21b is not used, and the heat radiator plate 24 and the heat diffusion plate 31 that have lower resistance than the lead terminals are used to pass the main current. This reduction in the resistance of the main current path reduces conduction losses. Besides, since the lead terminal 21b becomes unnecessary, air clearance from the source terminal 21c and the gate terminal 21a to the drain terminal 21b can be increased by cutting the lead terminal 21b to a shorter length. Accordingly, it is possible to make a design that accommodates higher breakdown voltages of the electronic component 2. This variation describes an example in which only the lead terminal 21b is not mounted, but the present embodiment is not limited to this example, and may adopt a configuration in which either one of the lead terminals 21a and 21c is also not mounted.

Variation 2

Figure 31:
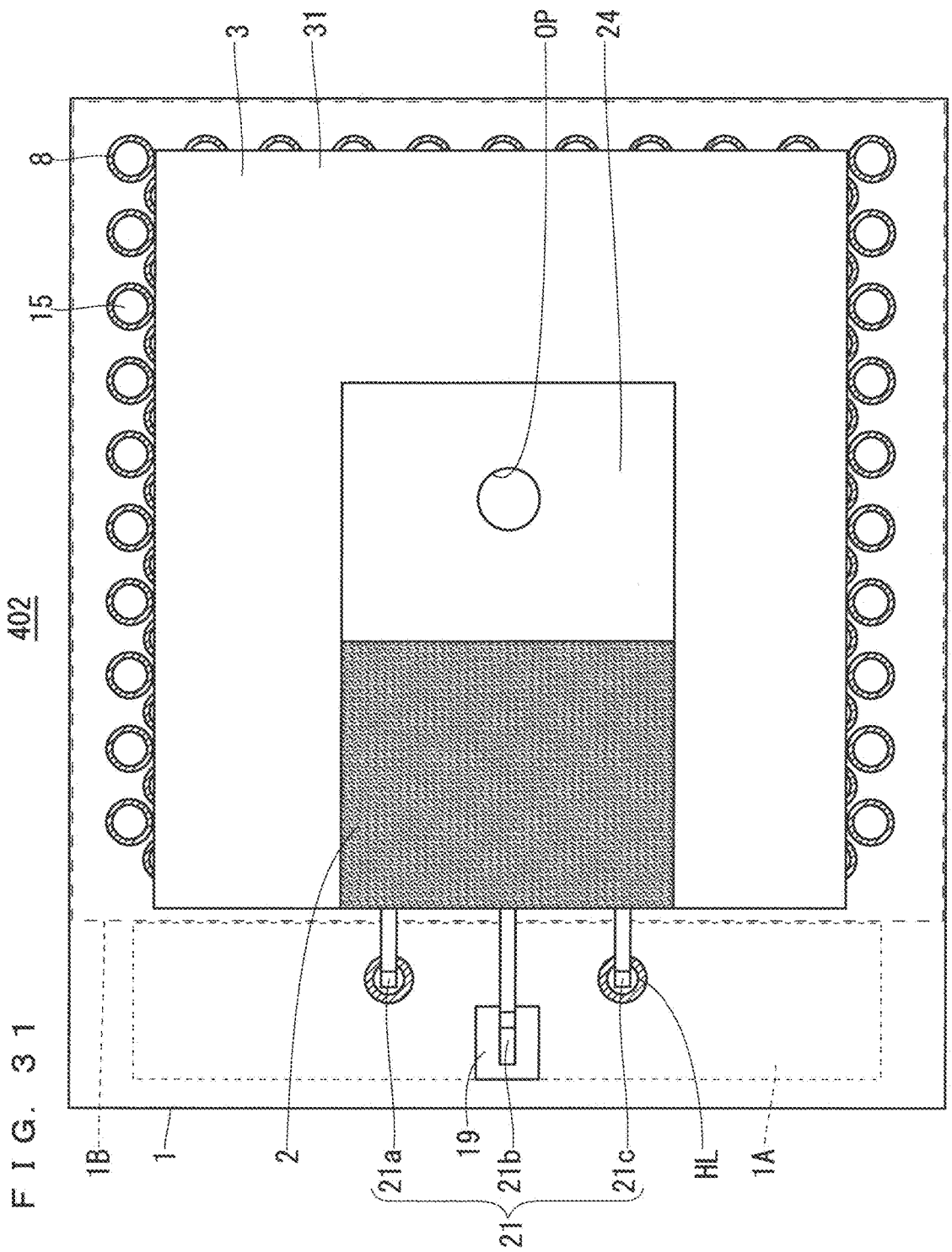
FIG. 31 is a plan view illustrating a configuration of a semiconductor device according to Variation 2 of Embodiment 4 of the present invention.

FIG. 31 is a plan view illustrating a configuration of a semiconductor device 402 according to Variation 2 of Embodiment 4 and a top view of the semiconductor device 402, viewed from above. As illustrated in FIG. 31, the semiconductor device 402 differs from the semiconductor device 401 according to Variation 1 in that, among the three lead terminals 21a, 21b, and 21c of the electronic component 2, the lead terminal 21b in the center has a longer length than the other lead terminals, and only the lead terminal 21b is mounted on a flatbed electrode 19 provided in the region 1A of the printed circuit board 1.

The electronic component 2 is assumed to be a packaged product of MOSFET such as TO-220. According to this variation, in the case of a desire to increase the interterminal distance in order to increase the breakdown voltage, the lead terminal 21b is made longer than the other lead terminals and mounted on the flatbed electrode 19 on the printed circuit board 1. This increases interterminal air clearance and creepage distance and makes the semiconductor device more favorable to higher breakdown voltage.

Alternatively, all of the lead terminals may be mounted on different flatbed electrodes 19 on the printed circuit board 1, or all of the lead terminals may be inserted into different terminal holes provided in the printed circuit board 1 for through-hole mounting.

Variation 3

Figure 32:
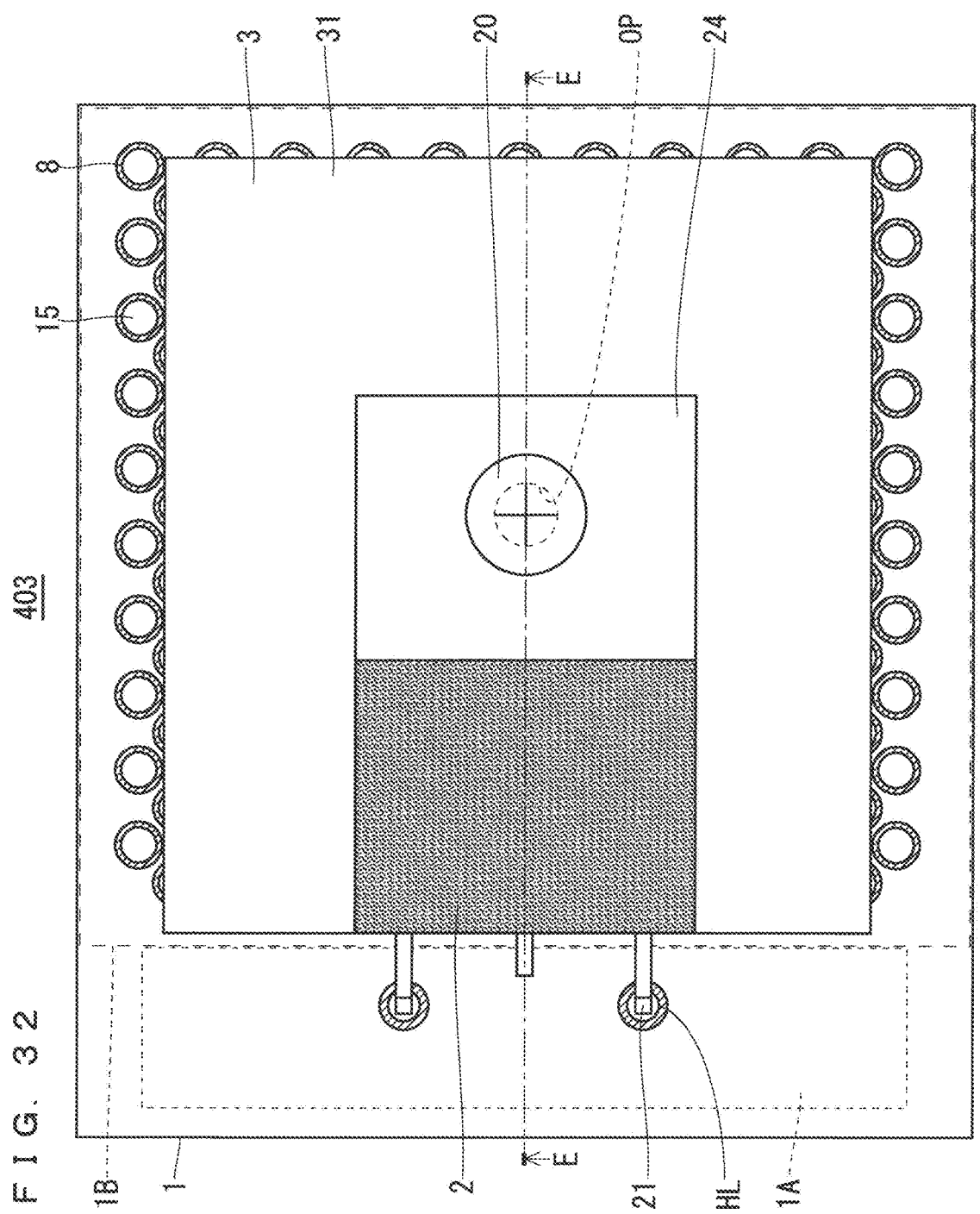
FIG. 32 is a plan view illustrating a configuration of a semiconductor device according to Variation 3 of Embodiment 4 of the present invention.
Figure 33:
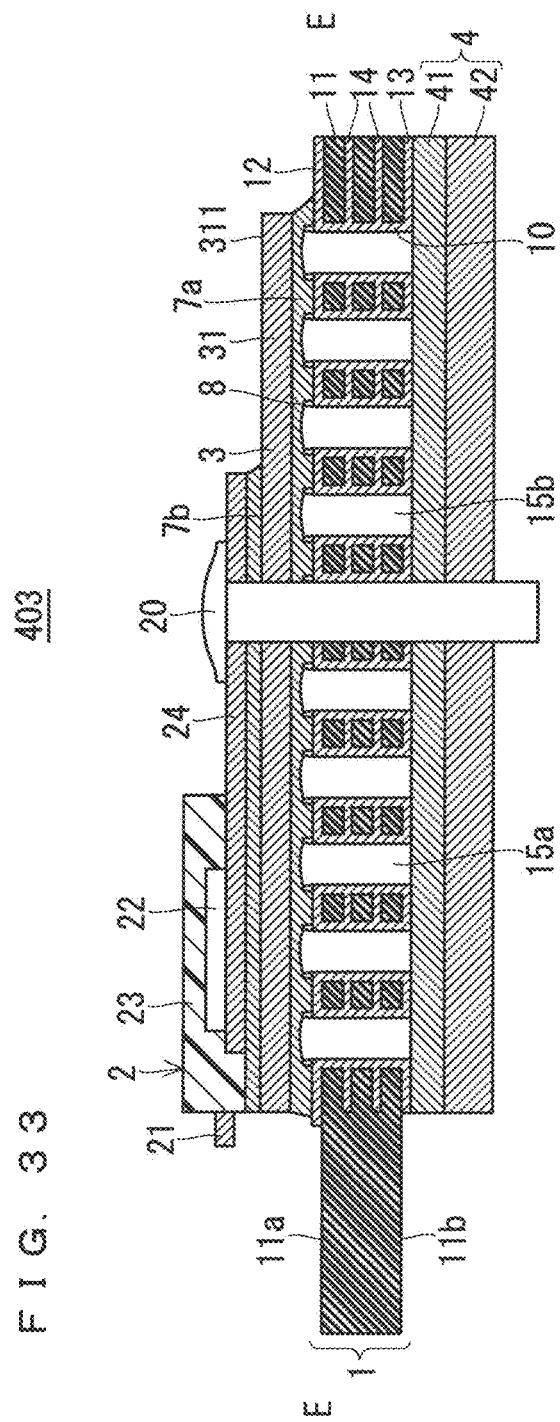
FIG. 33 is a sectional view illustrating the configuration of the semiconductor device according to Variation 3 of Embodiment 4 of the present invention.

FIG. 32 is a plan view illustrating a configuration of a semiconductor device 403 according to Variation 3 of Embodiment 4 and a top view of the semiconductor device 403, viewed from above. FIG. 33 is a sectional view taken along arrows E-E in FIG. 32. As illustrated in FIGS. 32 and 33, the semiconductor device 403 differs from the semiconductor device 401 according to Variation 1 in configuration in which the circular opening OP provided in the heat radiator plate 24 is used to fix the electronic component 2 with a screw 20 to the printed circuit board 1 via the heat radiator plate 24. This configuration reliably prevents misalignment that could occur when the electronic component 2 is mounted on the printed circuit board 1.

The screw 20 penetrates the printed circuit board 1, the heat radiation member 41, and the coolant 42 and is engaged with and fixed into a screw hole provided in the coolant 42. Thus, in the case where the heat radiator plate 24 and the coolant 42 are not at the same potential, the screw 20 is configured to have electrical isolation from the coolant 42. In this case, either the coolant 42 is processed and configured so as not to come in direct contact with the screw 20, or an insulating screw such as a plastic screw is used. This eliminates the need to provide a configuration for providing isolation from the coolant 42 and reduces the manufacturing cost. Instead of the screw 20, a rivet or the like may be used for the fixation. In this case as well, the rivet or the like is electrically isolated from the coolant 42.

Embodiment 5

Device Configuration

Figure 34:
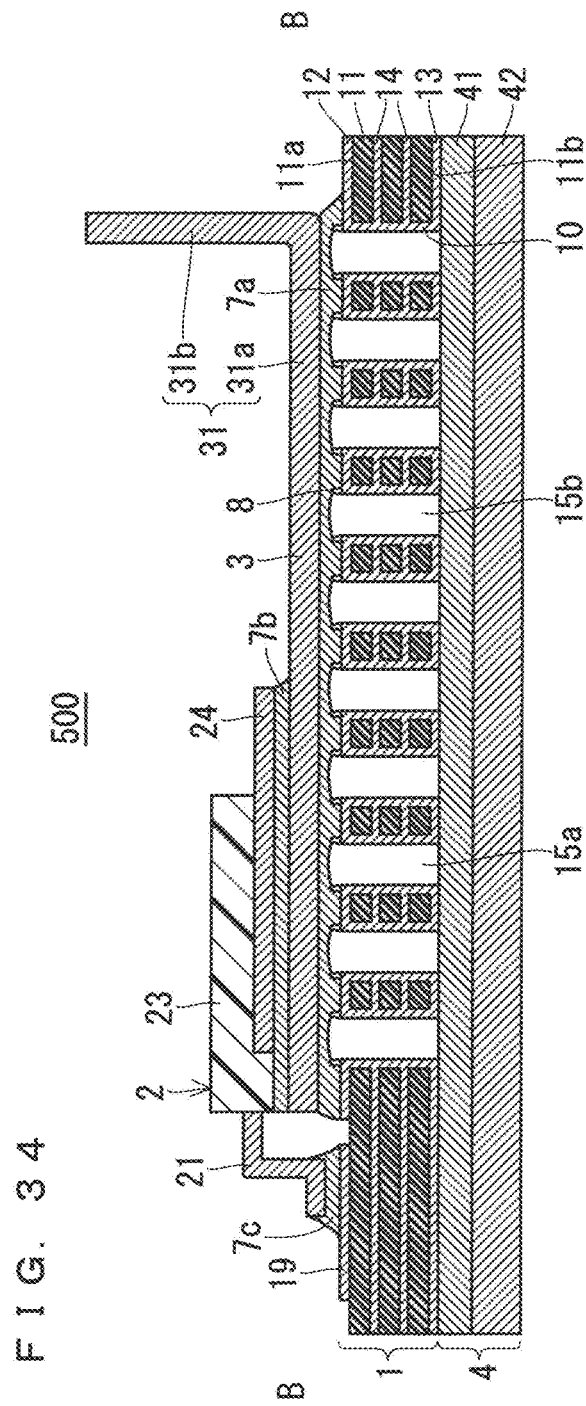
FIG. 34 is a sectional view illustrating a configuration of a semiconductor device according to Embodiment 5 of the present invention.

FIG. 34 is a sectional view illustrating a configuration of a semiconductor device 500 according to Embodiment 5 of the present invention. Note that the plan view of the semiconductor device 500, viewed from above, is identical to that of the semiconductor device 200 illustrated in FIG. 20, and FIG. 34 corresponds to the sectional view taken along arrows B-B in FIG. 20.

In the following description, the face of the printed circuit board 1 on which the electronic component 2 is mounted is referred to as an upper face, and the face on the opposite side thereof as a lower face, and the upper side of the semiconductor device 500 is referred to as the upper face side on which the electronic component 2 is mounted.

FIG. 34 illustrates a characteristic part of the semiconductor device 500, and this characteristic part does not necessarily have to be an overall configuration of the semiconductor device 500, but it is also possible to configure the semiconductor device 500 of only this characteristic part.

In FIG. 34, constituent elements identical to those of the semiconductor device 200 according to Embodiment 2 described with reference to FIGS. 20 and 21 are given the same reference signs, and redundant descriptions thereof will not be given.

As illustrated in FIG. 34, in the semiconductor device 500, the heat diffusion plate 31 of the heat diffusion part 3 has two portions, namely a first portion 31a and a second portion 31b. That is, the first portion 31a is flat plate-like portion provided along the upper main face 11a of the printed circuit board 1 and bonded to the upper main face 11a, and the second portion 31b is a flat plate-like portion extending on the side opposite to the printed circuit board 1, i.e., upward above the printed circuit board 1, in a direction intersecting with the first portion 31a from the edge of the first portion 31a on the side opposite to the side on which the electronic component 2 is mounted. The second portion 31b is integrally formed with the first portion 31a. Accordingly, the second portion 31b is not bonded to the upper main face 11a of the printed circuit board 1.

The second portion 31b bends to an angle of about 90 degrees at the boundary between the first portion 31a and the second portion 31b, but the present embodiment is not limited to this example. For example, the angle formed by the first portion 31a and the second portion 31b may be less than 90 degrees, or may exceed 90 degrees.

In this way, the semiconductor device 500 differs from the semiconductor device 200 according to Embodiment 2 in that a partial region of the heat diffusion plate 31 is bonded to the upper main face 11a, and a region that is not bonded to the upper main face 11a bends to an angle of about 90 degrees with respect to the upper main face 11a.

The sectional configuration illustrated in FIG. 34, except the heat diffusion plate 31, is the same as the sectional configuration of the semiconductor device 200 illustrated in FIG. 21, but it may be configured to become the same as the sectional configuration of the semiconductor device 100 illustrated in FIG. 2. That is, the sectional configuration illustrated in FIG. 34 does not necessarily have to include the projections 8 on the upper conductor layer 12.

Actions and Effects

Next, actions and effects of the present embodiment will be described. The present embodiment achieves actions and effects described below, in addition to the effects similar to those of Embodiment 1.

The presence of the second portion 31b of the heat diffusion plate 31 improves the heat radiation effect, in addition to the improvement of the heat diffusion effect. That is, the first portion 31a bonded to the printed circuit board 1 achieves the heat diffusion effect, and the second portion 31b whose entire surface is in touch with outside air achieves the heat radiation effect. Accordingly, it is possible to further enhance the effect of radiating the heat generated by the electronic component 2 to the outside.

In the case where the electronic component 2 includes a switching device such as an MOSFET, the electronic component 2 emits radiation noise (electromagnetic waves) during switching. However, since the electronic component 2 is blocked by the second portion 31b of the heat diffusion plate 31, the radiation of noise to the outside can be reduced.

In the case where the electronic component 2 is, for example, a control IC or an IC that processes weak signals, the second portion 31b of the heat diffusion plate 31 has the effect of reducing the radiation of noise from the outside. Accordingly, malfunctions in the IC can be prevented.

The second portion 31b of the heat diffusion plate 31 also has a dust-proof effect against dust or the like from the outside. The presence of the second portion 31b of the heat diffusion plate 31 increases the rigidity of the heat diffusion plate 31, and even if the printed circuit board 1 is stressed, the second portion 31b can absorb that stress. This increases the strength of the printed circuit board 1 and prevents warpage of the printed circuit board 1.

The presence of the second portion 31b of the heat diffusion plate 31 can also improve the thermo cycle performance of the bonding material 7a and improve the reliability of the semiconductor device 500.

The second portion 31b of the heat diffusion plate 31 may, for example, be used as a heatsink by attaching air cooling fins.

Alternatively, the first portion 31a of the heat diffusion plate 31 may be used as a heatsink by attaching fins to a region where the electronic component 2 is not provided. In general, heatsinks are usually used in vertically upright positions with respect to printed circuit boards, together with through-hole-mounted type electronic components such as TO-220, but they may be used in horizontally lying positions. Note that using general-purpose fins can reduce the manufacturing cost.

Variation 1

Figure 35:
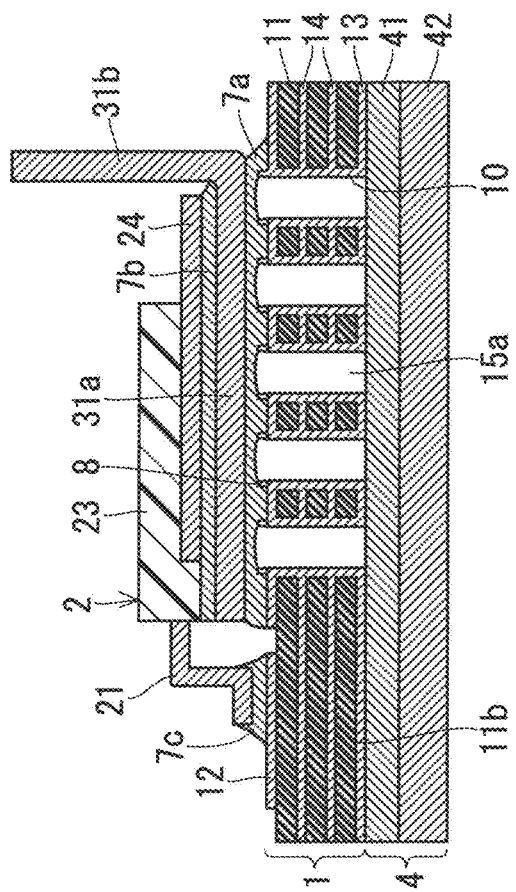
FIG. 35 is a sectional view illustrating a configuration a semiconductor device according to Variation 1 of Embodiment 5 of the present invention.

FIG. 35 is a sectional view illustrating a configuration of a semiconductor device 501 according to Variation 1 of Embodiment 5. As illustrated in FIG. 35, the semiconductor device 501 differs from the semiconductor device 500 according to Embodiment 5 in that the first portion 31a of the heat diffusion plate 31 has a shorter length in the horizontal direction.

Since the heat diffusion plate 31 has the second portion 31b, even if the area of the first portion 31a is reduced in plan view, it is possible to suppress a reduction in the heat radiation capability. Accordingly, the semiconductor device 501 can be reduced in size with a reduced dimension in the direction of a plane.

As illustrated in FIG. 35, misalignment that could occur when the electronic component 2 is mounted can be reduced by making the horizontal length of the first portion 31a of the heat diffusion plate 31 approximately the same as the length of the electronic component 2.

Variation 2

Figure 36:
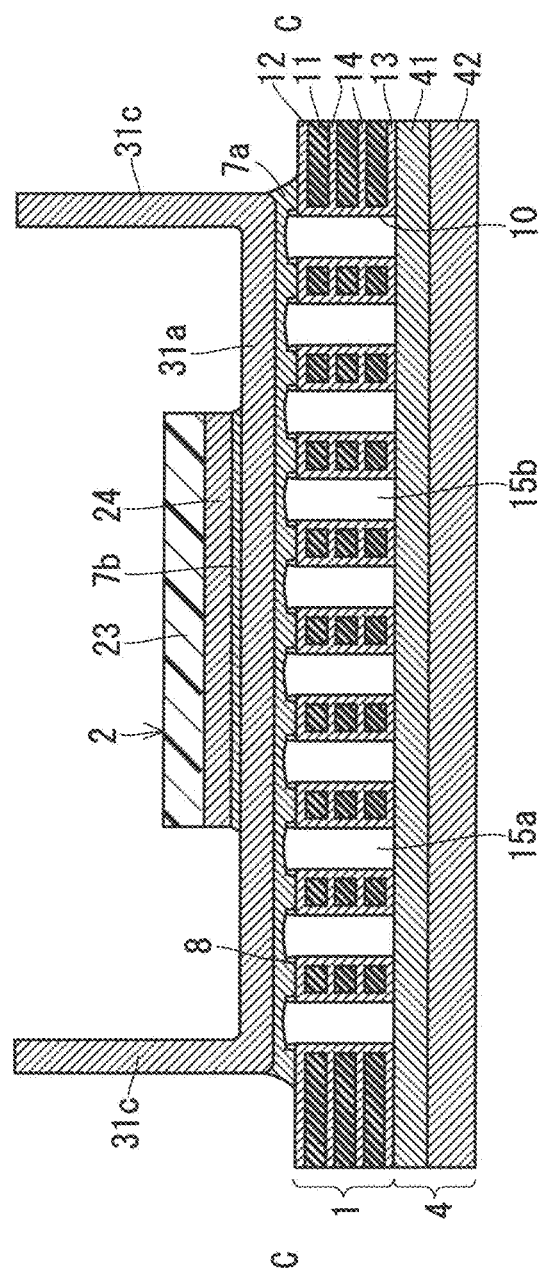
FIG. 36 is a sectional view illustrating a configuration of a semiconductor device according to Variation 2 of Embodiment 5 of the present invention.

FIG. 36 is a sectional view illustrating a configuration of a semiconductor device 502 according to Variation 2 of Embodiment 5. Note that the top view of the semiconductor device 502 viewed from above is identical to that of the semiconductor device 200 illustrated in FIG. 20, and FIG. 36 corresponds to the sectional view taken along arrows C-C in FIG. 20.

As illustrated in FIG. 36, in the semiconductor device 502, the heat diffusion plate 31 of the heat diffusion part 3 has two portions, namely a first portion 31a and second portions 31c. That is, the first portion 31a is a flat plate-like portion provided along the upper main face 11a of the printed circuit board 1 and bonded to the upper main face 11a, and the second portions 31c are flat plate-like portions extending on the side opposite to the printed circuit board 1, i.e., upward above the printed circuit board 1, in a direction intersecting with the first portion 31a from two edges of the first portion 31a that are orthogonal to the edge on the side on which the electronic component 2 is mounted. The second portions 31c are integrally formed with the first portion 31a. Accordingly, the second portions 31c are not bonded to the upper main face 11a of the printed circuit board 1.

The second portions 31c bend to an angle of about 90 degrees at the boundaries between the first portion 31a and the second portions 31c, but this variation is not limited to this example. For example, the angle formed by the first portion 31a and each second portion 31c may be less than 90 degrees, or may exceed 90 degrees.

In this way, the semiconductor device 502 differs from the semiconductor device 200 according to Embodiment 2 in that a partial region of the heat diffusion plate 31 is bonded to the upper main face 11a, and a region that is not bonded to the upper main face 11a bends to an angle of about 90 degrees with respect to the upper main face 11a.

The presence of the two second portions 31c of the heat diffusion plate 31 further improves the heat radiation effect, in addition to the improvement of the heat diffusion effect. In the case where the electronic component 2 emits radiation noise (electromagnetic waves), the effect of reducing the radiation of noise to the outside can be further enhanced. The dust-proof effect against dust or the like from the outside can also be enhanced.

The semiconductor device 502 may also be configured such that the heat diffusion plate 31 further has a flat plate-like portion that extends upward above the printed circuit board 1 in a direction intersecting with the first portion 31a from the edge of the first portion 31a on the side opposite to the side on which the electronic component 2 is mounted, like the second portion 31b of the semiconductor device 500 illustrated in FIG. 34. In this case, the second portions 31c are referred to as third portions 31c. Since the three sides of the electronic component 2 are surrounded by the heat diffusion plate, the heat radiation effect, the effect of reducing the radiation of noise to the outside, and the dust-proof effect are dramatically enhanced.

Variation 3

Figure 37:
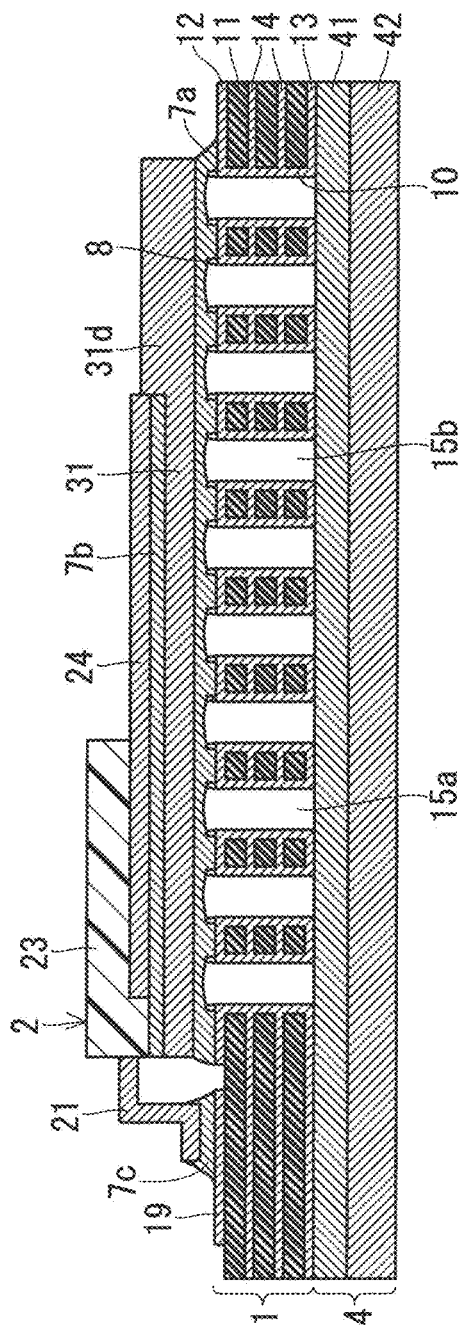
FIG. 37 is a sectional view illustrating a configuration of a semiconductor device according to Variation 3 of Embodiment 5 of the present invention.

FIG. 37 is a sectional view illustrating a configuration of a semiconductor device 503 according to Variation 3 of Embodiment 5. In the semiconductor device 503, the heat diffusion plate 31 of the heat diffusion part 3 has a stepped portion 31d with a greater thickness than the other portions on the side opposite to the side on which the electronic component 2 is mounted. An end face of the heat radiator plate 24 of the electronic component 2 has a size that can engage with this stepped portion 31d. This reduces misalignment that could occur when the electronic component 2 is mounted. Note that the height of the stepped portion 31d of the heat diffusion plate 31 is set such that a height up to the upper face of the heat radiator plate 24 and a height up to the upper face of the stepped portion 31d become approximately equal when the electronic component 2 is mounted on the heat diffusion plate 31.

The presence of the stepped portion 31d of the heat diffusion plate 31 enables accurate positioning of the electronic component 2 and improves yields during manufacture. In the case where the heat radiator plate 24 of the electronic component 2 has an opening, the heat diffusion plate 31 may have a projection of a size suited to the opening, and this projection may be inserted into the opening when the electronic component 2 is mounted in order to enable further accurate positioning of the electronic component 2.

Embodiment 6

Device Configuration

Figure 38:
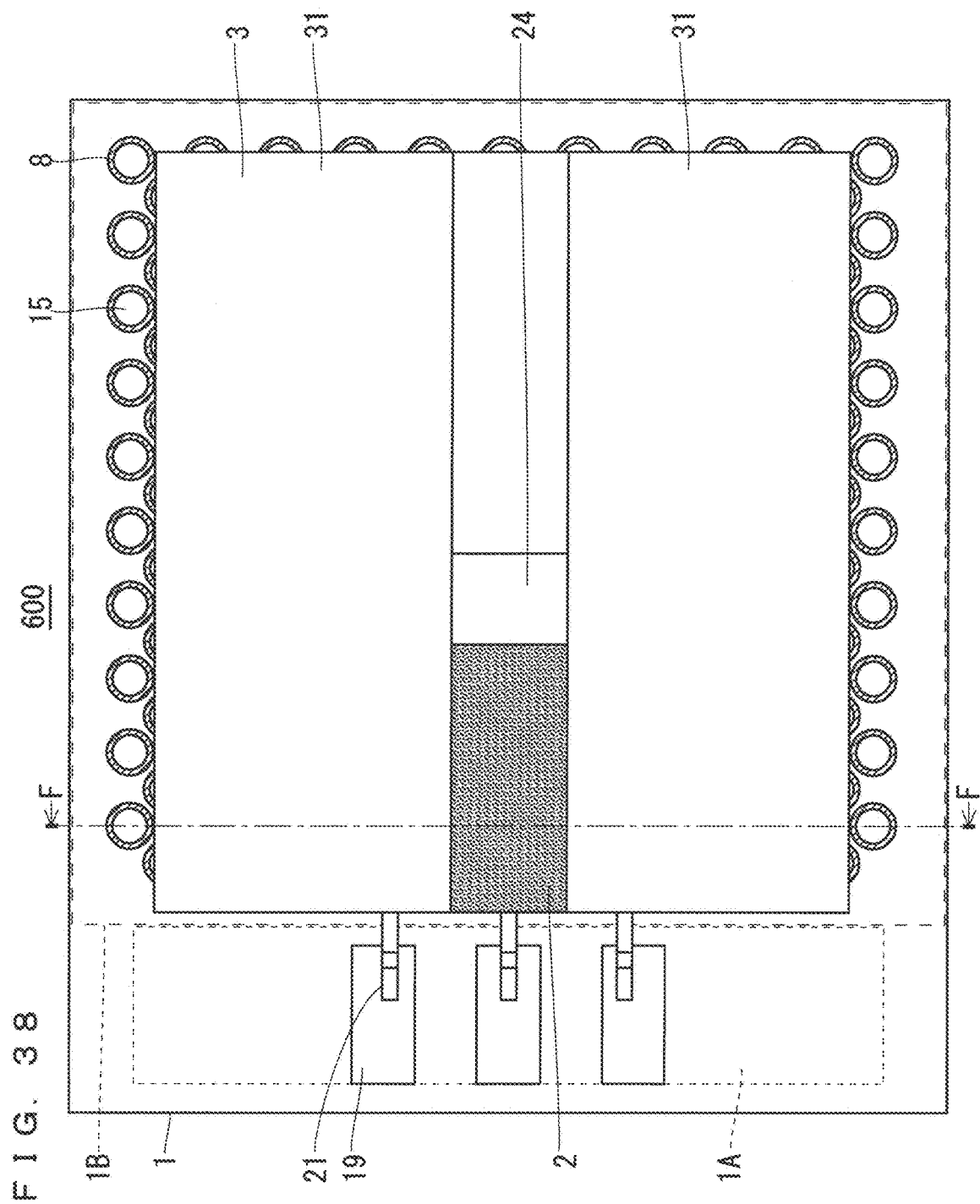
FIG. 38 is a plan view illustrating a configuration of a semiconductor device according to Embodiment 6 of the present invention.
Figure 39:
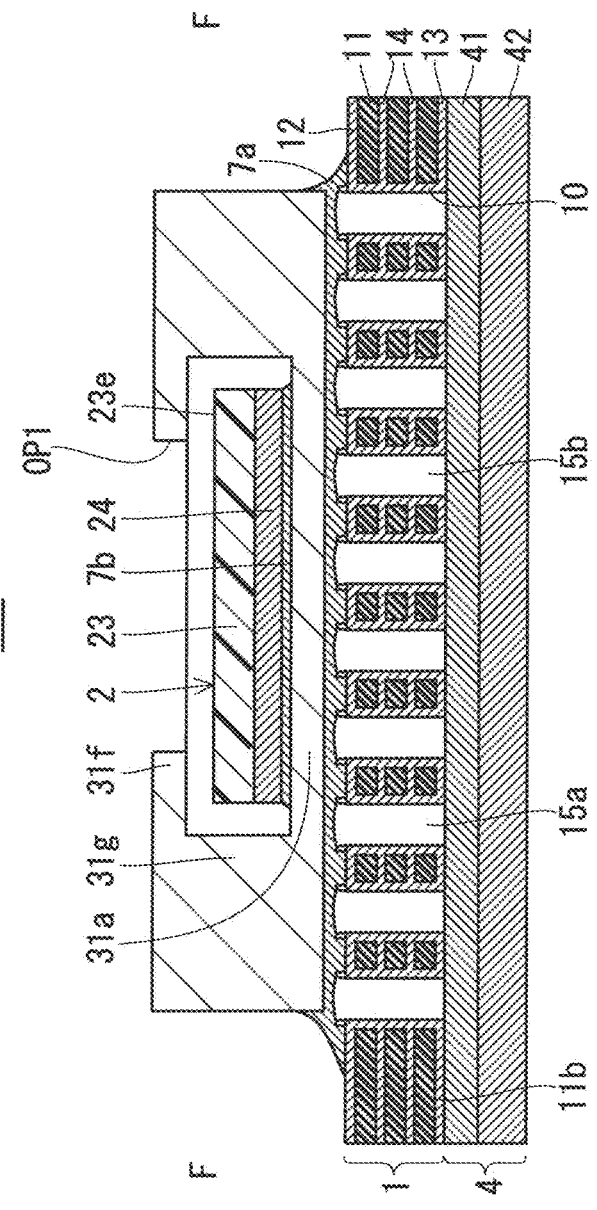
FIG. 39 is a sectional view illustrating the configuration of the semiconductor device according to Embodiment 6 of the present invention.

FIG. 38 is a plan view illustrating a configuration of a semiconductor device 600 according to Embodiment 6 of the present invention and a top view of the semiconductor device 600 viewed from above. FIG. 39 is a sectional view taken along arrows F-F in FIG. 38. In the following description, the face of the printed circuit board 1 on which the electronic component 2 is mounted is referred to as an upper face, and the face on the opposite side thereof as a lower face, and the upper side of the semiconductor device 600 is referred to as the upper face side on which the electronic component 2 is mounted.

FIGS. 38 and 39 illustrate a characteristic part of the semiconductor device 600, and this characteristic part does not necessarily have to be an overall configuration of the semiconductor device 600, but it is also possible to configure the semiconductor device 600 of only this characteristic part.

In FIGS. 38 and 39, constituent elements identical to those of the semiconductor device 200 according to Embodiment 2 described with reference to FIGS. 20 and 21 are given the same reference signs, and redundant descriptions thereof will not be given.

As illustrated in FIGS. 38 and 39, in the semiconductor device 600, the heat diffusion plate 31 is configured to cover part of the upper face of the electronic component 2. As illustrated in FIG. 39, the heat diffusion plate 31 in the semiconductor device 600 has a first portion 31a bonded to the printed circuit board 1, second portions 31g extending upward above the printed circuit board 1 in a direction intersecting with the first portion 31a from two edges of the first portion 31a that are orthogonal to the edge on the side on which the electronic component 2 is mounted, and two third portions 31f extending from the upper portions of the two second portions 31g toward the electronic component 2 in a direction along the upper main face 11a.

The second portions 31g have a height that exceeds the upper face of the electronic component 2 when the electronic component 2 is mounted on the printed circuit board 1. The two third portions 31f are provided not in contact with the electronic component 2 so as to cover part of the electronic component 2 from above. The two opposing third portions 31f form an opening OP1 therebetween, so that part of the electronic component 2 can be viewed from above the semiconductor device 600 as illustrated in FIG. 38.

Actions and Effects

Next, actions and effects of the present embodiment will be described. The present embodiment achieves actions and effects described below, in addition to the effects similar to those of Embodiment 1.

This semiconductor device differs from the semiconductor device 200 according to Embodiment 2 in that the heat diffusion plate 31 has the third portions 31f that cover part of the upper face of the electronic component 2 and overlap part of the upper face of the electronic component 2.

In the presence of the second portions 31g and the third portions 31f of the heat diffusion plate 31, the electronic component 2 is half encircled by the heat diffusion plate 31. This dramatically enhances the heat radiation effect, the effect of reducing the radiation of noise to the outside, and the dust-proof effect.

The heat diffusion plate 31 having the second portions 31g and the third portions 31f can be formed at low manufacturing cost by, for example, subjecting a copper plate to well-known press working. The heat diffusion plate 31 can also be formed by, for example, subjecting a copper plate to well-known shaving or extrusion. The use of copper reduces the heat resistance between the electronic component 2 and the heat diffusion plate 31 and further increases the heat diffusion efficiency of the heat diffusion plate 31.

In FIG. 39, the third portions 31f of the heat diffusion plate 31 and the upper surface 23e of the resin molding part 23 of the electronic component 2 are not in contact with each other and have a space therebetween. However, in the case where they are configured in intimate contact with each other, heat can be conducted between the resin molding part 23 and the third portions 31f, and this increases the efficiency of radiating the heat generated by the electronic component 2.

Variation

Figure 40:
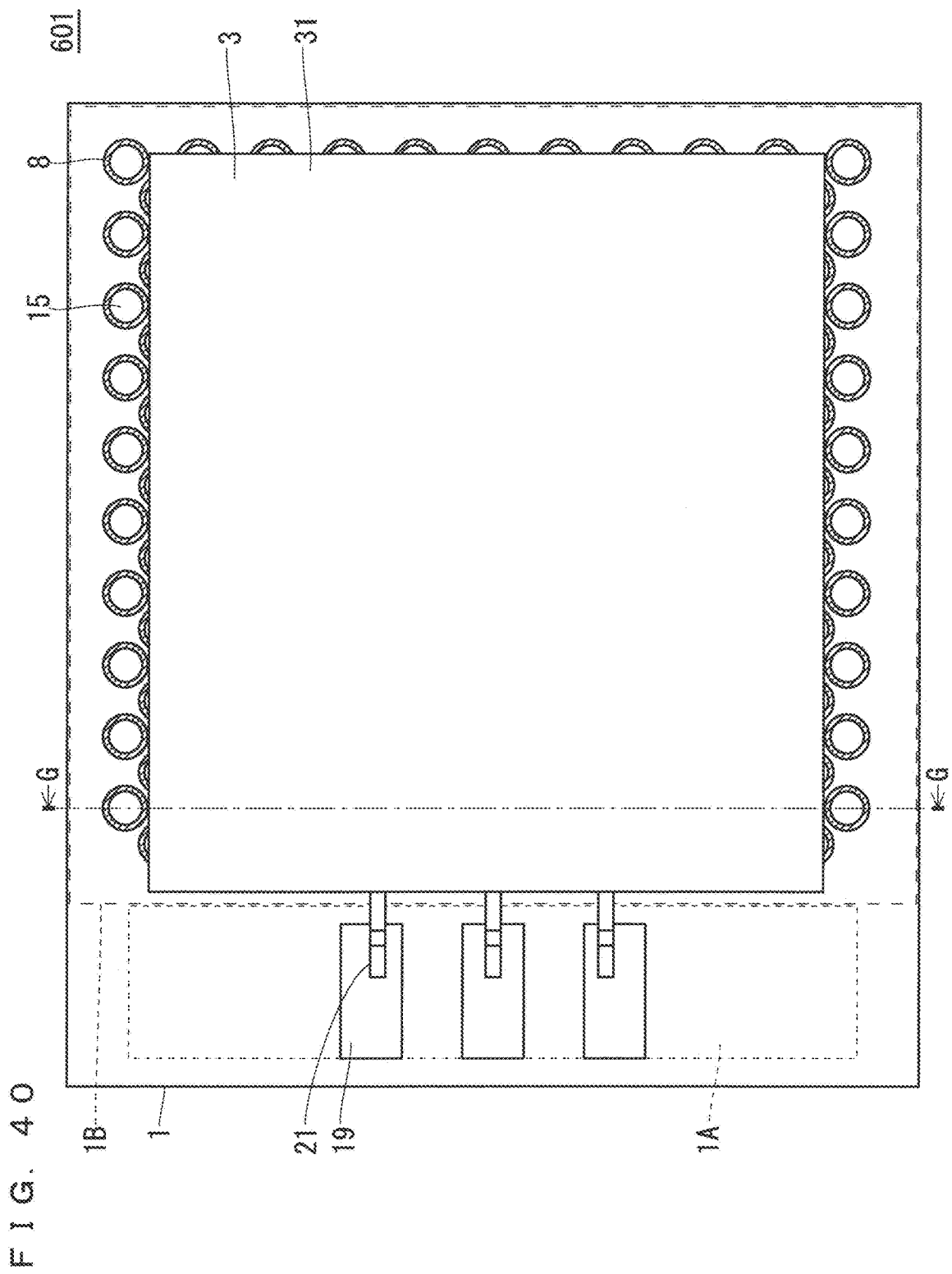
FIG. 40 is a plan view illustrating a configuration of a semiconductor device according to Variation 1 of Embodiment 6 of the present invention.
Figure 41:
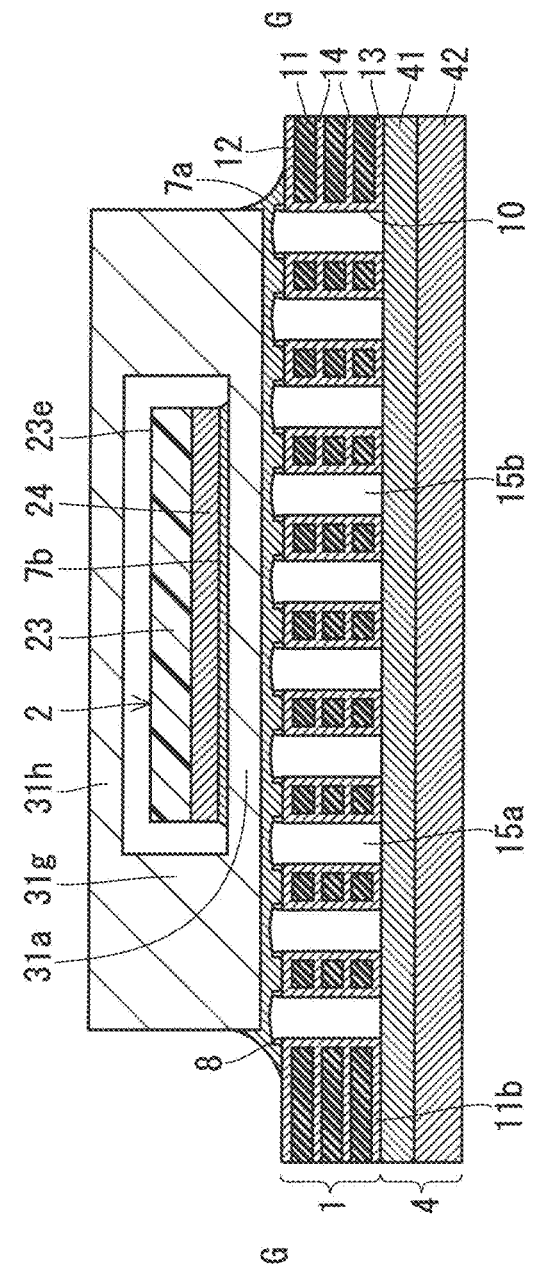
FIG. 41 is a sectional view illustrating the configuration the semiconductor device according to Variation 1 of Embodiment 6 of the present invention.

FIG. 40 is a plan view illustrating a configuration of a semiconductor device 601 according to a variation of Embodiment 6 and a top view of the semiconductor device 601, viewed from above. FIG. 41 is a sectional view taken along arrows G-G in FIG. 40.

As illustrated in FIGS. 40 and 41, in the semiconductor device 601, the heat diffusion plate 31 of the heat diffusion part 3 has a first portion 31a bonded to the printed circuit board 1 as in Embodiment 6, second portions 31g that extend upward above the printed circuit board 1 in a direction intersecting with the first portion 31a from two edges of the first portion 31a that are orthogonal to the edge thereof on the side on which the electronic component 2 is mounted, and a third portion 31h provided across the two second portions 31g.

The third portion 31h completely covers the electronic component 2 from above, so that the four sides of the electronic component 2 are surrounded by the tubular heat diffusion plate 31. However, two opposing side faces of the electronic component 2 are not covered with the heat diffusion plate 31 as illustrated in FIG. 41. Therefore, the electronic component 2 can be efficiently cooled by blowing air into an air course formed in the heat diffusion plate 31.

The heat diffusion plate 31 having the second portions 31g and the third portion 31h can be formed at low manufacturing cost by, for example, subjecting a copper plate to well-known press working. The heat diffusion plate 31 can also be formed by, for example, subjecting a copper plate to well-known shaving or extrusion. The use of copper reduces the heat resistance between the electronic component 2 and the heat diffusion plate 31 and further increases the heat diffusion efficiency of the heat diffusion plate 31.

In FIG. 41, the third portion 31h of the heat diffusion plate 31 and an upper face 23e of the resin molding part 23 of the electronic component 2 are not in contact with each other and have a space therebetween. However, in the case where they are configured in intimate contact with each other, heat can be conducted between the resin molding part 23 and the third portion 31h, and this increases the efficiency of radiating the heat generated by the electronic component 2.

Embodiment 7

Device Configuration

Figure 43:
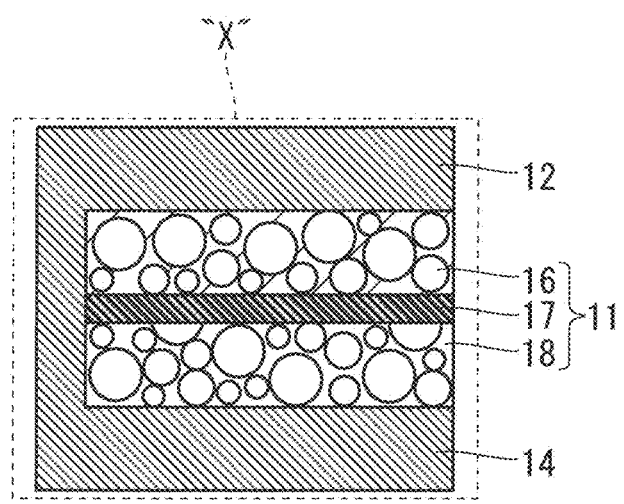
FIG. 43 is a partial enlarged view illustrating the configuration of the semiconductor device according to Embodiment 7 of the present invention.

FIG. 42 is a sectional view illustrating a configuration of a semiconductor device 700 according to Embodiment 7 of the present invention. Note that the top view of the semiconductor device 700, viewed from above, is identical to that of the semiconductor device 100 illustrated in FIG. 1, and FIG. 42 shows a partial region of the printed circuit board 1 in enlarged dimension. FIG. 43 is an enlarged sectional view of a region X enclosed by the broken line in FIG. 42, i.e., one section of an insulation layer 11.

In the following description, the face of the printed circuit board 1 on which the electronic component 2 is mounted is referred to as an upper face, and the face on the opposite side thereof as a lower face, and the upper side of the semiconductor device 700 is referred to as the upper face side on which the electronic component 2 is mounted.

In FIGS. 42 and 43, constituent elements identical to those of the semiconductor device 100 according to Embodiment 1 described with reference to FIGS. 1 and 2 are given the same reference signs, and redundant descriptions thereof will not be given.

As illustrated in FIG. 42, the semiconductor device 700 according to Embodiment 7 differs from the semiconductor device 100 according to Embodiment 1 in that the insulation layers 11 in the printed circuit board 1 include fillers 16.

As illustrated in FIG. 43, the insulation layer 11 between the upper conductor layer 12 and an internal conductor layer 14 is partitioned by a partition plate 17 of glass fibers, and the partitioned spaces are filled with the fillers 16 and an epoxy resin 18. The same structure is also found between two internal conductor layers 14 and between an internal conductor layer 14 and the lower conductor layer 13.

The fillers 16 are inorganic filler particles, which are preferably aluminum oxide particles, but the present embodiment is not limited to this example, and the fillers 16 may be ceramic particles such as aluminum nitride or boron nitride. Alternatively, the fillers 16 may be formed by mixing several types of particles together, and for example, may be formed by mixing aluminum hydroxide into aluminum oxide.

In this way, in the semiconductor device 700, each of the insulation layers 11 included in the printed circuit board 1 contains inorganic filler particles. This improves the thermal conductivity and heat resistance of the insulation layers 11. The insulation layers 11 containing inorganic filler particles as the fillers 16 allow heat conduction via the fillers 16. Accordingly, it is possible to improve heat conduction in the insulation layers 11 and to reduce the heat resistance of the printed circuit board 1.

Here, the heat resistance value of the semiconductor device 700, which includes the printed circuit board 1 including the insulation layers 11 that contain 70 percent by weight of the fillers 16 of aluminum oxide, is simulated using Expression (1) described previously and the model described in Embodiment 1. The result of the simulation indicates that the heat resistance value is further reduced by about 5%, as compared to the heat resistance value of "Embodiment 1" illustrated in FIG. 16.

Note that the model used in this simulation adopted entirely the same dimensions and configuration of the model of the semiconductor device 100 according to Embodiment 1, except the presence of the fillers 16.

In order to improve heat conduction in the insulation layers 11, it is essential to increase the packing density of the fillers 16 contained in the insulation layers 11. Specifically, it is more preferable that the packing density of the fillers 16 is increased up to 80 percent by weight. Thus, the shape of the fillers 16 is not limited to a shape close to a spherical shape as illustrated in FIG. 43, and may be a cubic shape based on a polygon such as a tetrahedron or a hexagonal crystal.

The sizes of the fillers 16 used to fill the insulation layers 11 do not necessarily have to be constant. That is, the fillers 16 in the insulation layers 11 may be configured of only a single type of particles, or may be configured of a mixture of particles of different sizes. In this case, filler particles with smaller sizes enter regions sandwiched by particles with larger sizes, so that the higher packing density of the fillers 16 can be achieved. This further improves heat conduction in the insulation layers 11.

Embodiment 8

Device Configuration

Figure 44:
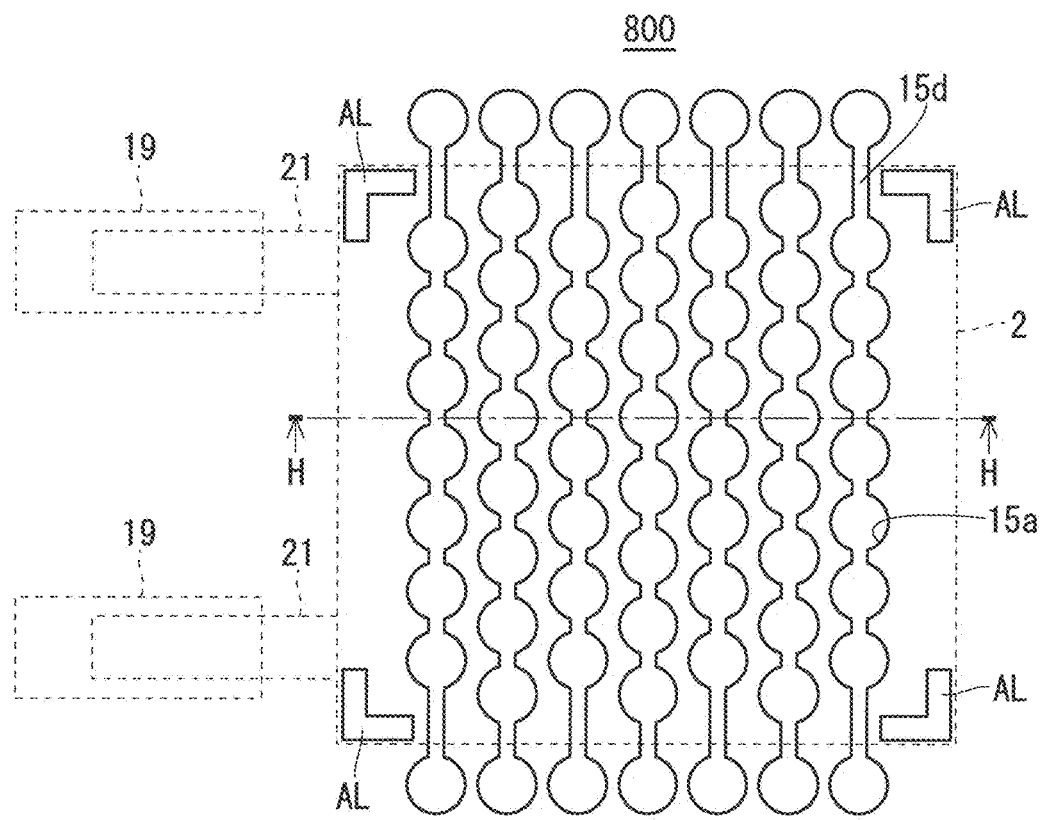
FIG. 44 is a partial plan view illustrating a configuration of a semiconductor device according to Embodiment 8 of the present invention.
Figure 45:
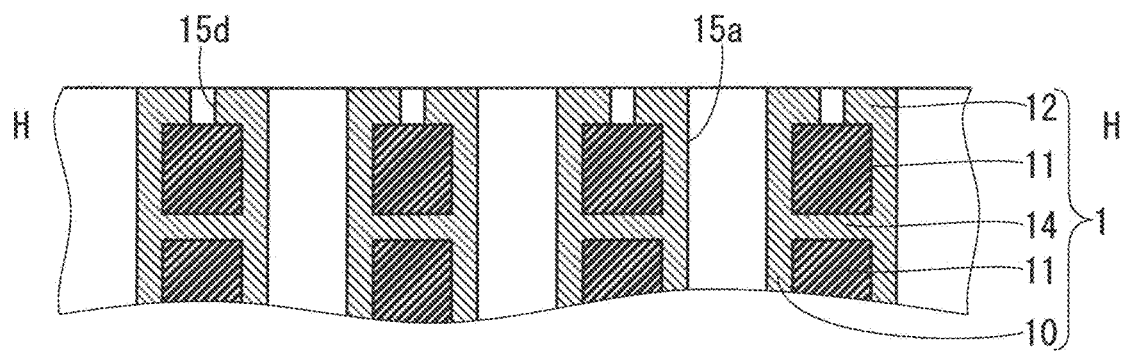
FIG. 45 is a partial sectional view illustrating the configuration of the semiconductor device according to Embodiment 8 of the present invention.

FIG. 44 is a plan view illustrating a configuration of a semiconductor device 800 according to Embodiment 8 of the present invention and illustrates a portion of the first region of the printed circuit board 1. Components such as the electronic component 2, the electrodes 19, and the lead terminals 21 are indicated by broken lines for the sake of convenience, and the heat diffusion plate 31 is not shown. FIG. 45 is a sectional view taken along arrows H-H in FIG. 44 and illustrates only a partial region of the printed circuit board 1.

In the following description, the face of the printed circuit board 1 on which the electronic component 2 is mounted is referred to as an upper face, and the face on the opposite side thereof as a lower face, and the upper side of the semiconductor device 800 is referred to as the upper face side on which the electronic component 2 is mounted.

In FIGS. 44 and 45, constituent elements identical to those of the semiconductor device 100 according to Embodiment 1 described with reference to FIGS. 1 and 2 are given the same reference signs, and redundant descriptions thereof will not be given.

As illustrated in FIG. 44, the semiconductor device 800 according to Embodiment 8 differs from the semiconductor device 100 according to Embodiment 1 in that a groove 15d is provided across the holes of adjacent first heat radiation vias 15a in a region of the upper conductor layer 12 that is sandwiched between the first heat radiation vias 15a. FIG. 44 shows an example in which four alignment marks AL for positioning the electronic component 2 are provided at positions corresponding to the four corners of the electronic component 2. These alignment marks may, for example, be the projections 8 described in Embodiment 2. Note that the projections 8 around the heat radiation vias 15 are not shown.

As illustrated in FIG. 45, the groove 15d is provided by removing part of the upper conductor layer 12 in the insulation layer 11 between the upper conductor layer 12 and the internal conductor layer 14.

Note that the groove 15*d* may be formed simultaneously when the upper conductor layer 12 in the printed circuit board 1 is patterned by etching through a well-known photoengraving technique.

With the presence of the grooves 15*d* as described above, in the semiconductor device 800, expanded air in the first heat radiation vias 15*a* can be exhausted to the outside through the grooves 15*d* by heating for melting solder in the manufacture of the semiconductor device. Accordingly, solder can be easily charged by suppressing a rise in pressure in the first heat radiation vias 15*a*.

In FIGS. 44 and 45, the grooves 15*d* are provided only in the first region, but the present embodiment is not limited to this example, and the grooves 15*d* may be provided across the holes of adjacent heat radiation vias 15 in the second region. In other words, the printed circuit board 1 of the semiconductor device 800 is configured such that the grooves 15*d* are provided across adjacent heat radiation vias 15 among the plurality of heat radiation vias 15 in plan view viewed from above the upper main face 11*a* of the printed circuit board 1.

Embodiment 9

Device Configuration

Figure 46:
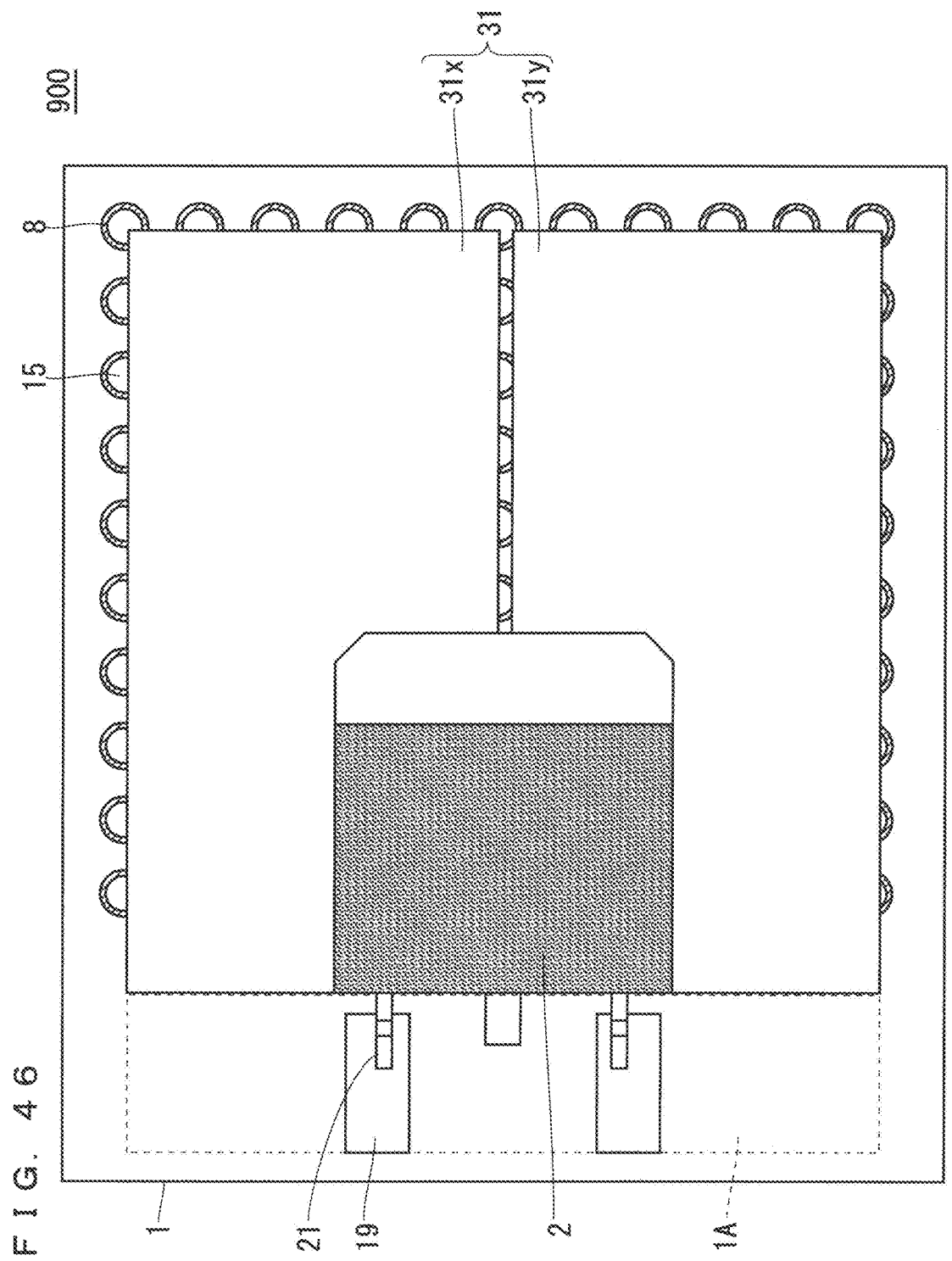
FIG. 46 is a plan view illustrating a configuration of a semiconductor device according to Embodiment 9 of the present invention.

FIG. 46 is a plan view illustrating a configuration of a semiconductor device 900 according to Embodiment 9 of the present invention and a top view of the semiconductor device 900 viewed from above. In the following description, the face of the printed circuit board 1 on which the electronic component 2 is mounted is referred to as an upper face, and the face on the opposite side thereof as a lower face, and the upper side of the semiconductor device 900 is referred to as the upper face side on which the electronic component 2 is mounted.

FIG. 46 illustrate a characteristic part of the semiconductor device 900, and this characteristic part does not necessarily have to be an overall configuration of the semiconductor device 900, but it is also possible to configure the semiconductor device 900 of only this characteristic part.

In FIG. 46, constituent elements identical to those of the semiconductor device 200 according to Embodiment 2 described with reference to FIGS. 20 and 21 are given the same reference signs, and redundant descriptions thereof will not be given.

As illustrated in FIG. 46, the semiconductor device 900 differs from the semiconductor device 200 according to Embodiment 2 in that, in plan view viewed from above the upper main face 11*a* of the printed circuit board 1, the heat diffusion plate 31 disposed on the underside of the electronic component 2 is configured of two heat diffusion plates 31*x* and 31*y*, and the electronic component 2 is disposed across the two heat diffusion plates 31*x* and 31*y*.

The heat diffusion plates 31*x* and 31*y* are preferably disposed at an interval, but the present embodiment is not limited to this example, and they may be disposed with their end faces in contact with each other.

For example, if the size of the heat diffusion plate increases in plan view, like the heat diffusion plate 31 of the semiconductor device 100 according to Embodiment 1, it becomes difficult to use a mounter to mount the heat diffusion plate. Also, if the heat diffusion plate 31 has a rectangular or square shape with its center and center of gravity located at the same position in plan view, the percent defective during the mounting step using a mounter will decrease, as compared to the case where the heat diffusion plate 31 has an asymmetrical shape in plan view. Accordingly, if the heat diffusion plate 31 is divided into a plurality of rectangular heat diffusion plates and disposed as in the present embodiment, it is possible to easily mount the heat diffusion plate 31 by using a mounter and to reduce the mounting cost. In this way, according to the present embodiment, the mounting cost can be reduced by making the shape and size of the heat diffusion plate 31 suitable for automatic mounting.

FIG. 46 illustrates, as one example, a configuration in which the heat diffusion plate 31 is divided into two plates, but the number of plates into which the heat diffusion plate 31 is divided is not limited to this example, and the heat diffusion plate 31 may be divided into three or four plates, for example. It is however noted that each divided plate of the heat diffusion plate 31 is preferably bonded at least in part to the electronic component 2 with a bonding material.

Embodiment 10

Device Configuration

Figure 47:
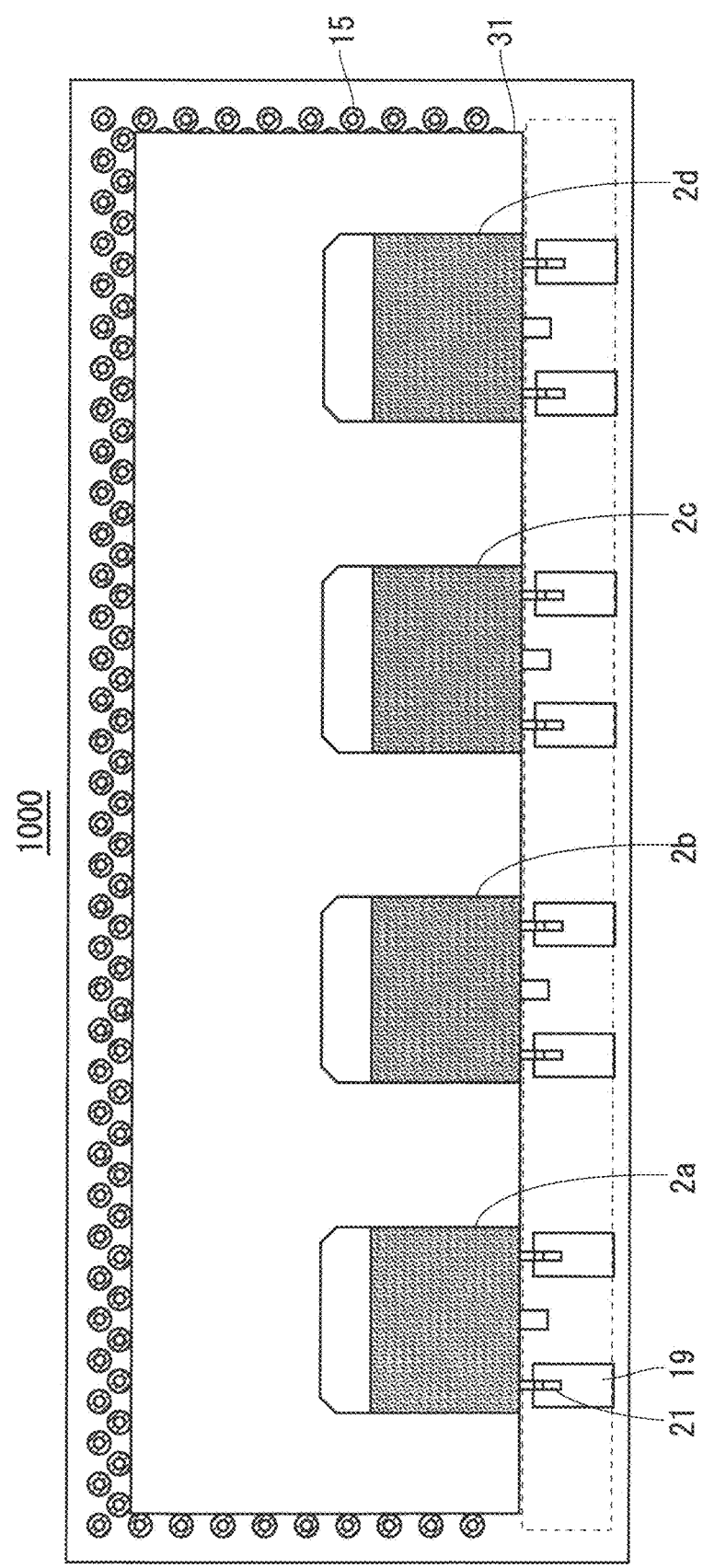
FIG. 47 is a plan view illustrating a configuration of a semiconductor device according to Embodiment 10 of the present invention.

FIG. 47 is a plan view illustrating a configuration of a semiconductor device 1000 according to Embodiment 10 of the present invention and a top view of the semiconductor device 1000, viewed from above. In the following description, the face of the printed circuit board 1 on which electronic components 2 are mounted is referred to as an upper face, and the face on the opposite side thereof as a lower face, and the upper side of the semiconductor device 1000 is referred to as the upper face side on which the electronic components 2 are mounted.

FIG. 47 illustrates a characteristic part of the semiconductor device 1000, and this characteristic part does not necessarily have to be an overall configuration of the semiconductor device 1000, but it is also possible to configure the semiconductor device 1000 of only this characteristic part.

In FIG. 47, constituent elements identical to those of the semiconductor device 200 according to Embodiment 2 described with reference to FIGS. 20 and 21 are given the same reference signs, and redundant descriptions thereof will not be given.

As illustrated in FIG. 47, in plan view of the semiconductor device 1000 viewed from above the printed circuit board 1, four electronic components 2*a*, 2*b*, 2*c* and 2*d* are disposed at intervals along one long side of a heat diffusion plate 31 having a long and narrow shape in plan view. In this way, the semiconductor device 1000 differs from the semiconductor device 200 according to Embodiment 2 in that the four electronic components 2*a* to 2*d* are disposed in a line in the left-right direction in the drawing.

In this way, in the case where a single semiconductor device includes a plurality of electronic components 2, the heating value may vary due to variations of properties such as the internal resistances of the electronic components 2. In the case where the four electronic components 2*a* to 2*d* are connected in parallel, if the electronic components 2*a* to 2*d* are respectively disposed on individual heat diffusion plates, an electronic component having a large heating value may have a higher heating value due to a temperature rise caused by self-heating and exhibit thermal runaway. However, if the electronic components 2*a* to 2*d* are disposed on the common heat diffusion plate 31 as in the present embodiment, the electronic component 2*a* to 2*d* will not have varying temperatures and will be less likely to exhibit thermal runaway. Accordingly, a semiconductor device with high reliability can be provided. This is because the radiation of heat generated by each of the electronic component 2*a* to 2*d* is made uniform by disposing the electronic components 2a to 2d on the common heat diffusion plate 31.

It goes without saying that the number of electronic components that can be mounted on the heat diffusion plate 31 is not limited to four.

Variation

Figure 48:
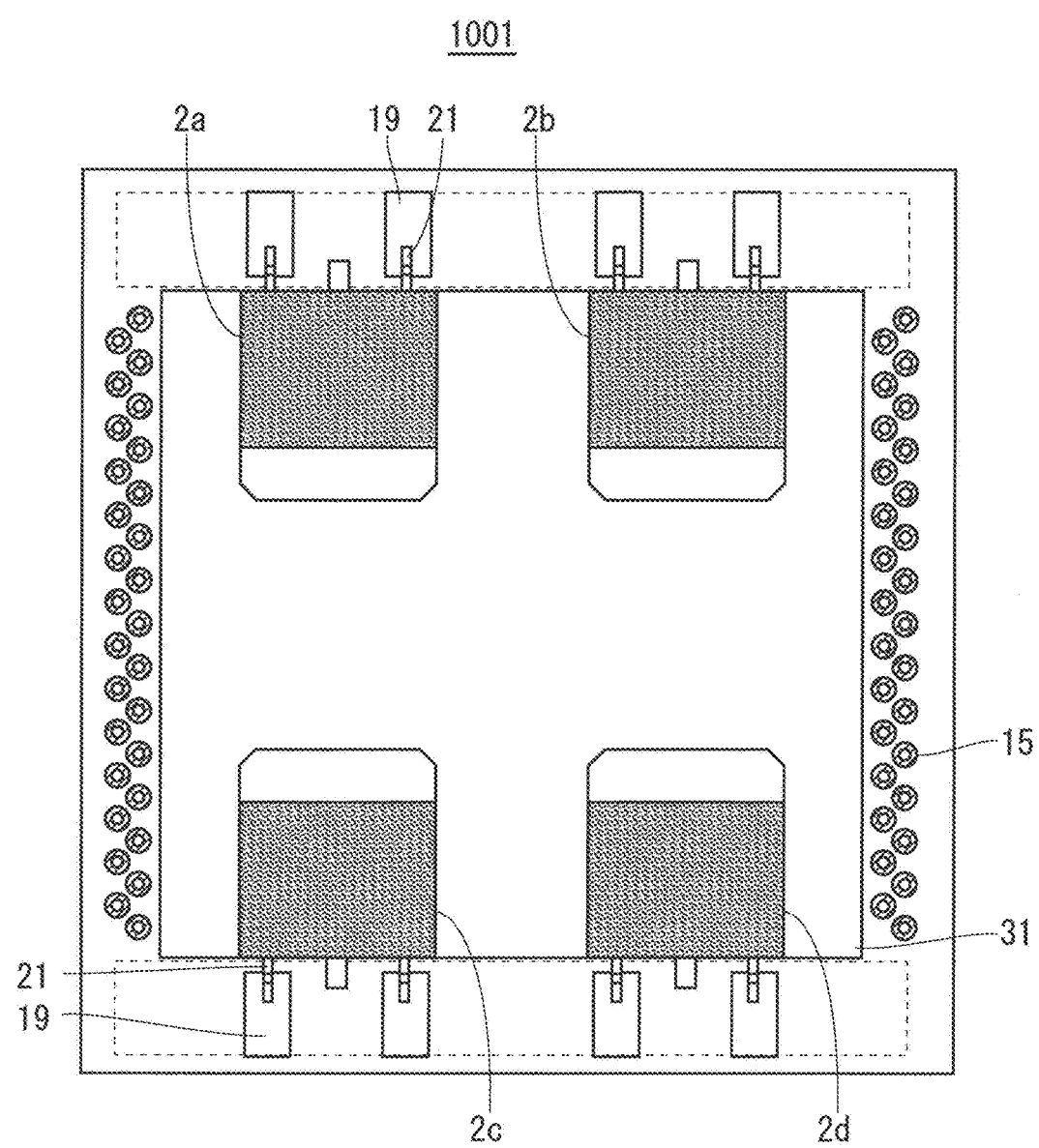
FIG. 48 is a plan view illustrating a configuration of a semiconductor device according to a variation of Embodiment 10 of the present invention.

FIG. 48 is a plan view illustrating a configuration of a semiconductor device 1001 according to a variation of Embodiment 10 and a top view of the semiconductor device 1001 viewed from above.

As illustrated in FIG. 48, in plan view of the semiconductor device 1001 viewed from above the printed circuit board 1, four electronic components 2a, 2b, 2c, and 2d are disposed at intervals such that each pair of electronic components is disposed along each of two opposing sides of the heat diffusion plate 31 having a rectangular shape in plan view.

This arrangement reduces the possibility that the amount of heat generated by the electronic components 2a to 2d becomes unbalanced on the heat diffusion plate 31, and enables uniform heat diffusion in the heat diffusion plate 31. Accordingly, the heat radiation capability is improved.

Embodiment 11

Device Configuration

Figure 49:
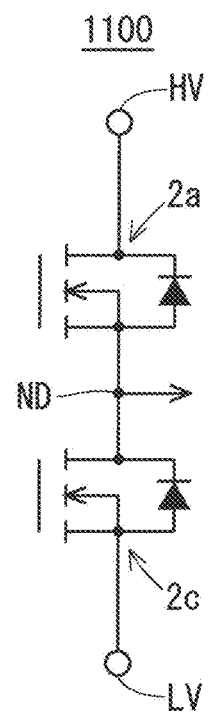
FIG. 49 is a circuit diagram illustrating a configuration of a semiconductor device according to Embodiment 11 of the present invention.
Figure 50:
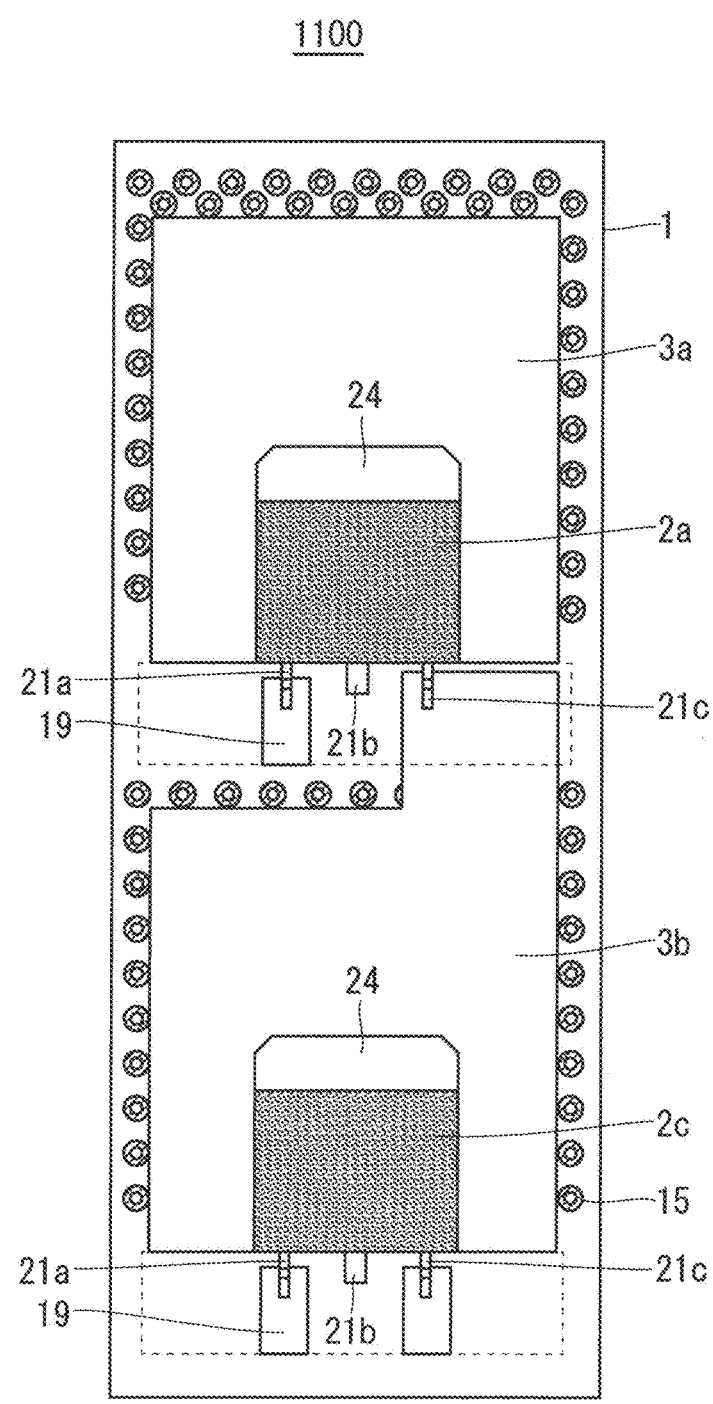
FIG. 50 is a plan view illustrating the configuration of the semiconductor device according to Embodiment 11 of the present invention.

FIG. 49 is a circuit diagram illustrating a configuration of a semiconductor device 1100 according to Embodiment 11 of the present invention, and FIG. 50 is a plan view illustrating the configuration of the semiconductor device 1100 and a top view of the semiconductor device 1100, viewed from above. In the following description, the face of the printed circuit board 1 on which electronic components are mounted is referred to as an upper face, and the face on the opposite side thereof as a lower face, and the upper side of the semiconductor device 1100 is referred to as the upper side face on which the electronic components are mounted.

FIG. 50 illustrates a characteristic part of the semiconductor device 1100, and this characteristic part does not necessarily have to be an overall configuration of the semiconductor device 1100, but it is also possible to configure the semiconductor device 1100 of only this characteristic part.

In FIG. 50, constituent elements identical to those of the semiconductor device 200 according to Embodiment 2 described with reference to FIGS. 20 and 21 are given the same reference numerals, and redundant descriptions thereof will not be given.

As illustrated in FIG. 49, the semiconductor device 1100 is a half-bridge circuit in which electronic components 2a and 2c are connected in series between a high-potential terminal HV and a low-potential terminal LV. That is, the source terminal of the electronic component 2a on the high side and the drain terminal of the electronic component 2c on the low side are connected, and a connection node ND serves as an output node of the half-bridge circuit. As one example, the electronic components 2a and 2c have a configuration in which a diode is connected in inverse-parallel to an N-type MOSFET, but the present embodiment is not limited to this example.

FIG. 50 is a top view illustrating a state in which this half-bridge circuit is mounted on the printed circuit board 1. As illustrated in FIG. 50, in plan view viewed from above the printed circuit board 1 in the semiconductor device 1100, the electronic component 2a is disposed on a heat diffusion plate 3a, the electronic component 2c is disposed on a heat diffusion plate 3b, and part of a source terminal 21c of the electronic component 2a is connected to the heat diffusion plate 3b. That is, the heat diffusion plates 3a and 3b are disposed at intervals on the printed circuit board 1 in order to maintain electrical isolation, but part of the heat diffusion plate 3b has a shape protruding into the vicinity of the heat diffusion plate 3a, and this protrusion is connected to part of the source terminal 21c of the electronic component 2a. A lead terminal 21b of the electronic component 2c is not used as a drain terminal, and the heat radiator plate 24 and the heat diffusion plate 3b that have lower resistances than the lead terminals are used to pass the main current. Accordingly, the main current flows from the source terminal of the electronic component 2a via the heat diffusion plate 3b to the drain terminal of the electronic component 2c.

The parasitic inductance component decreases as the wiring distance between the electronic components 2a and 2c becomes shorter. Therefore, by connecting the source terminal and the drain terminal as illustrated in FIG. 50, it is possible to suppress oscillations of voltage and current during switching of the electronic components 2a and 2c and to improve the reliability of the circuit. Besides, by using the heat diffusion plate 3b as wiring when a large current flows through the electronic components 2a and 2c, it is possible to reduce conduction losses and to reduce power losses.

If the half-bridge circuit illustrated in FIG. 49 has an insufficient heat capacity and an insufficient current capacity, a plurality of electronic components can be connected in parallel to increase the capacities as a whole.

Variation

Figure 51:
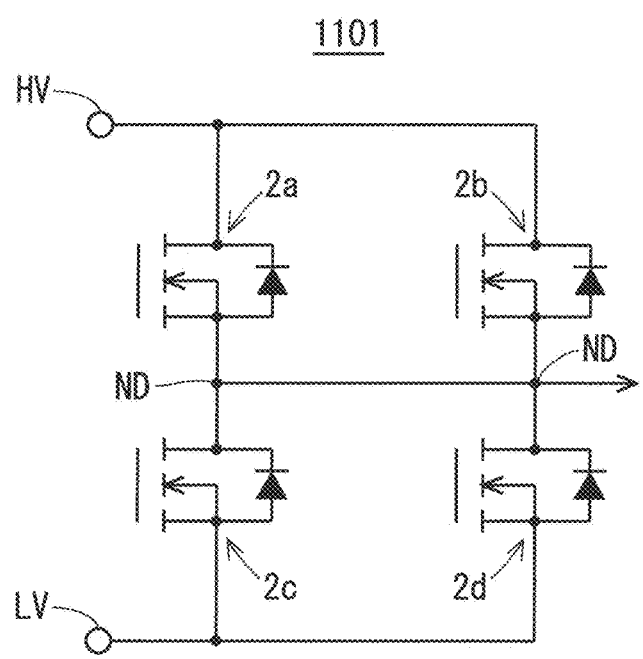
FIG. 51 is a circuit diagram illustrating a configuration of a semiconductor device according to Variation 1 of Embodiment 11 of the present invention.

FIG. 51 is a circuit diagram illustrating a configuration of a semiconductor device 1101 according to a variation of Embodiment 11 and illustrates a configuration in which a half-bridge circuit configured of electronic components 2a and 2c is connected in parallel with a half-bridge circuit configured of electronic components 2b and 2d. The connection nodes ND of the half-bridge circuits serve as common output nodes. FIG. 51 illustrates the two parallel half-bridge circuits, but this is merely one example and the number of circuits that are connected in parallel is not limited.

Figure 52:
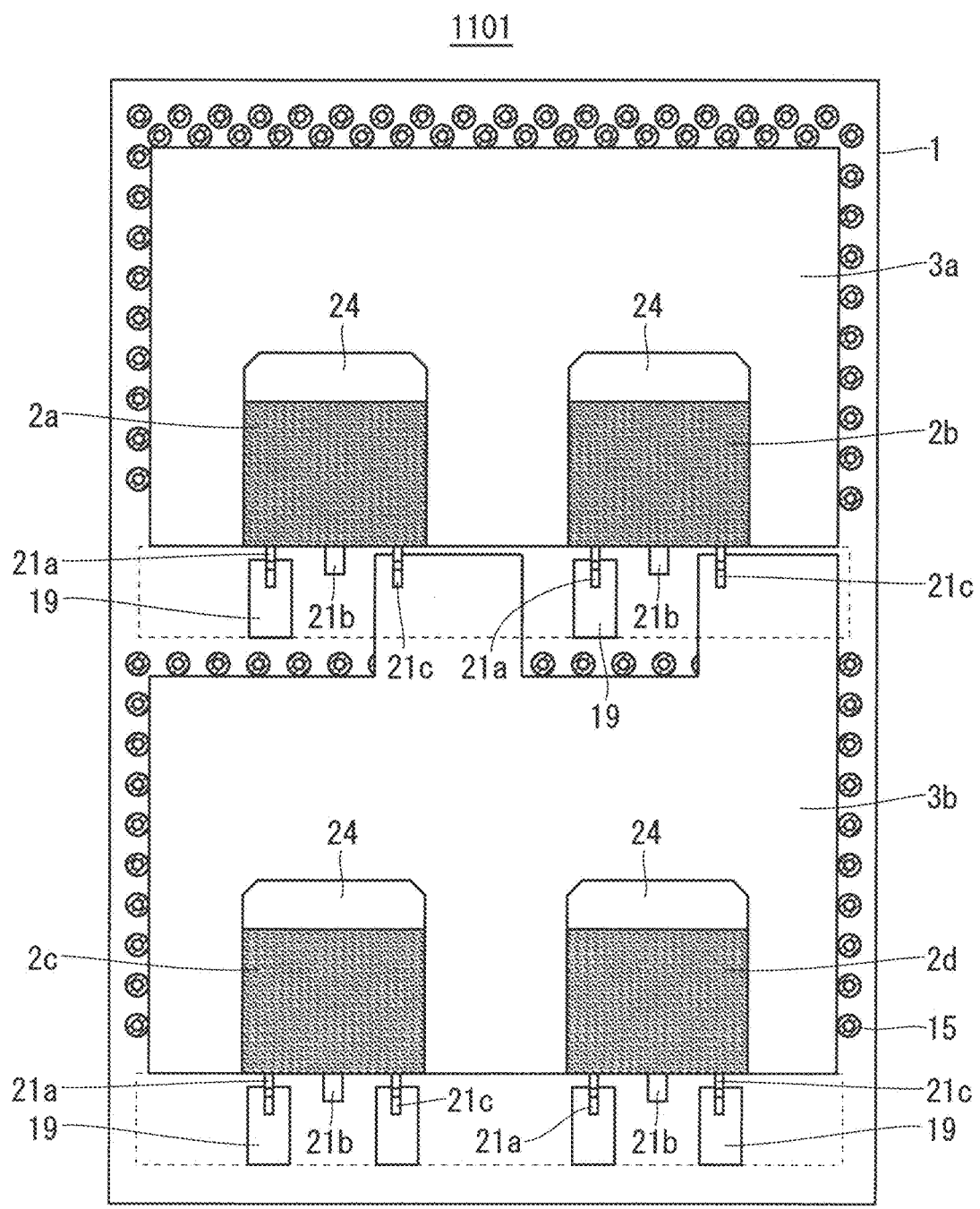
FIG. 52 is a plan view illustrating the configuration of the semiconductor device according to Variation 1 of Embodiment 11 of the present invention.

FIG. 52 is a top view illustrating a state in which the two parallel half-bridge circuits are mounted on the printed circuit board 1. As illustrated in FIG. 52, in plan view viewed from above the printed circuit board 1 in the semiconductor device 1101, the electronic components 2a and 2b are disposed on a heat diffusion plate 3a, the electronic components 2c and 2d are disposed on a heat diffusion plate 3b, and parts of the source terminal 21c of the electronic components 2a and 2b are connected to the heat diffusion plate 3b. Lead terminals 21b of the electronic components 2c and 2d are not used as drain terminals, and the heat radiator plates 24 and the heat diffusion plate 3b that have lower resistances than the lead terminals are used to pass the main current. Accordingly, the main current flows from the source terminals of the electronic components 2a and 2b via the heat diffusion plate 3b to the drain terminals of the electronic components 2c and 2d. The effect achieved by this configuration is the same as the effect achieved by the semiconductor device 1100 according to Embodiment 11.

Embodiment 12

Device Configuration

Figure 53:
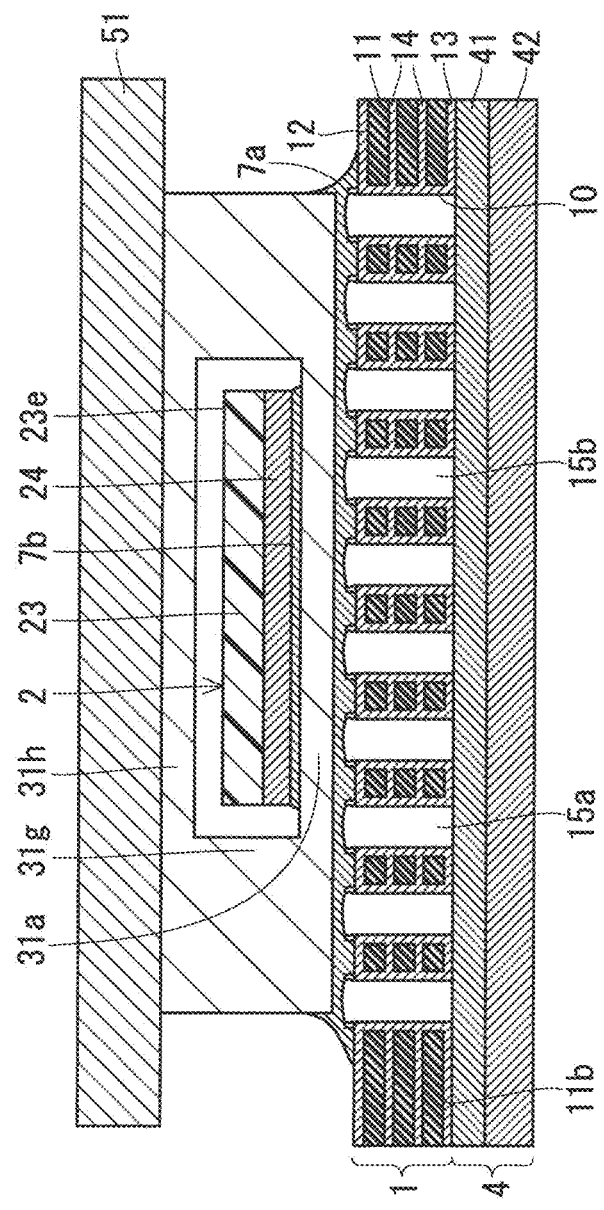
FIG. 53 is a sectional view illustrating a configuration of a semiconductor device according to Embodiment 12 of the present invention.

FIG. 53 is a sectional view illustrating a configuration of a semiconductor device 1200 according to Embodiment 12 of the present invention. In the following description, the face of the printed circuit board 1 on which the electronic component 2 is mounted is referred to as an upper face, and the face on the opposite side thereof as a lower face, and the upper side of the semiconductor device 1200 is referred to as the upper face side on which the electronic component 2 is mounted.

FIG. 53 illustrates a characteristic part of the semiconductor device 1200, and this characteristic part does not necessarily have to be an overall configuration of the semiconductor device 1200, but it is also possible to configure the semiconductor device 1200 of only this characteristic part.

In FIG. 53, constituent elements identical to those of the semiconductor device 200 according to Embodiment 2 described with reference to FIGS. 20 and 21 are given the same reference signs, and redundant descriptions thereof will not be given.

As illustrated in FIG. 53, in the semiconductor device 1200, a case 51 is disposed in intimate contact on the third portion 31$h$ of the heat diffusion plate 31 in the semiconductor device 601 according to Variation 1 of Embodiment 6 described with reference to FIGS. 40 and 41.

In this way, the semiconductor device differs from the semiconductor device 600 according to Embodiment 6 in that the case 51 is deposed on the third portion 31$h$ of the heat diffusion plate 31.

The case 51 is a box-like member that protects the entire semiconductor device 1200 from outside, and FIG. 53 illustrates a flat plate-like portion that is part of the case. The case 51 is preferably formed of aluminum. This is because aluminum with excellent thermal conductivity is capable of conducting internal heat of the semiconductor device to the outside and is also lighter than other materials such as copper. Alternatively, the case 51 may be formed of a ceramic material with excellent thermal conductivity, such as aluminum oxide or aluminum nitride, with a metal film such as copper formed on the surface. As another alternative, the case 51 may be configured by forming a nickel- or gold-plated film on the surface of an alloy selected from the group consisting of, for example, a copper alloy, an aluminum alloy, and a magnesium alloy. The case 51 formed of such a material with excellent thermal conductivity can improve the thermal conductivity (heat radiation capability) of the semiconductor device 1200.

In this way, according to the present embodiment, the semiconductor device has the route for radiating the heat generated by the electronic component 2 from the heat diffusion plate 31 via the case 51 to the outside, in addition to the route for radiating the heat generated by the electronic component 2 from the heat diffusion plate 31 through the second heat radiation vias 15$b$ toward the heat radiation part 4. Accordingly, the semiconductor device has a more excellent heat radiation capability than in the case where the case 51 is not provided.

Variation 1

Figure 54:
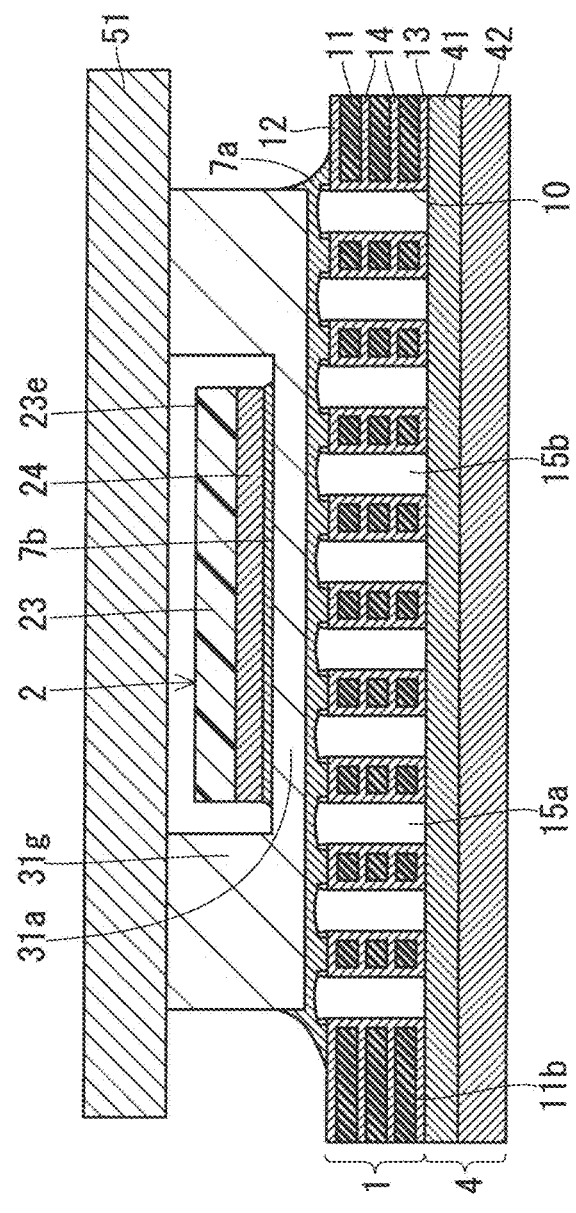
FIG. 54 is a sectional view illustrating a configuration of a semiconductor device according to Variation 1 of Embodiment 12 of the present invention.

FIG. 54 is a sectional view illustrating a configuration of a semiconductor device 1201 according to Variation 1 of Embodiment 12. As illustrated in FIG. 54, in the semiconductor device 1201, the case 51 is disposed across over the two second portions 31$g$ in a configuration obtained by removing the third portion 31$h$ of the heat diffusion plate 31 from the semiconductor device 601 according to Variation 1 of Embodiment 6 described with reference to FIGS. 40 and 41.

Therefore, the case 51 becomes closer to the electronic component 2, and the heat generated by the electronic component 2 can be received as radiant heat. This improves the heat radiation capability, as compared to the case where heat is conducted via the third portion 31$h$.

Variation 2

Figure 55:
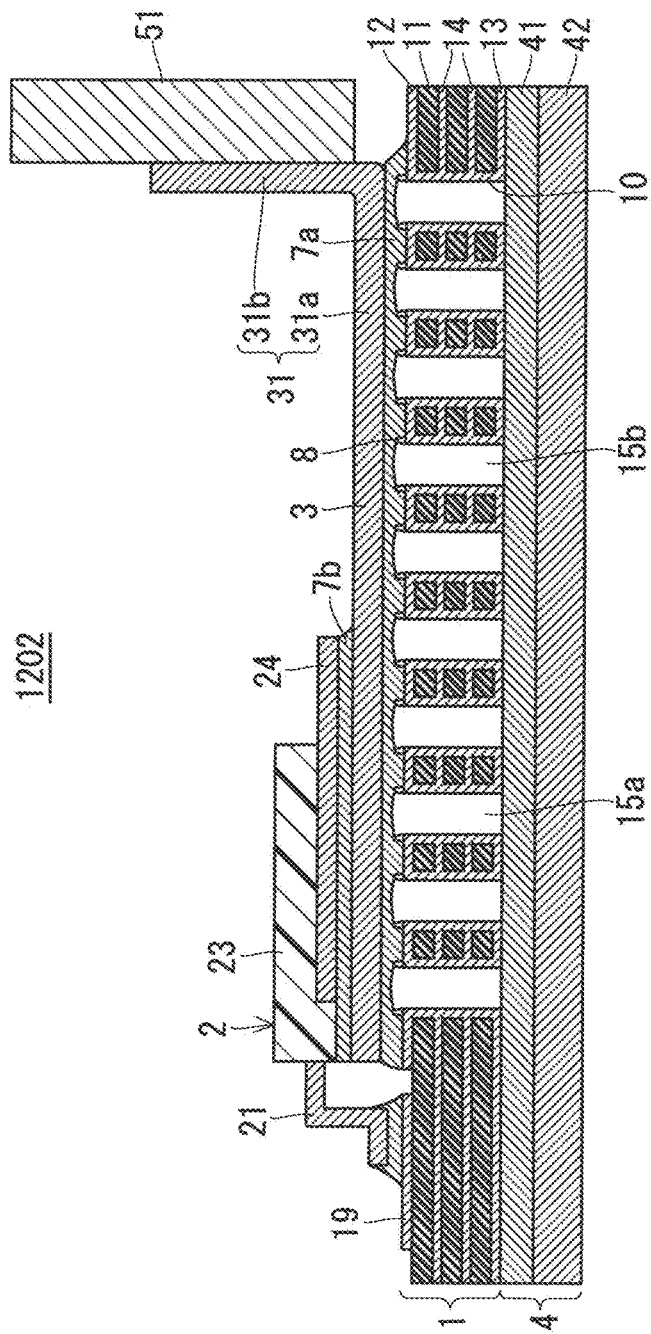
FIG. 55 is a sectional view illustrating a configuration of a semiconductor device according to Variation 2 of Embodiment 12 of the present invention.

FIG. 55 is a sectional view illustrating a configuration of a semiconductor device 1202 according to Variation 2 of Embodiment 12. As illustrated in FIG. 55, the semiconductor device 1202 differs from the semiconductor device 500 according to Embodiment 5 in that the case 51 is disposed in intimate contact on the second portion 31$b$ of the heat diffusion plate 31 on the side opposite to the electronic component 2 in the semiconductor device 500 according to Embodiment 5 described with reference to FIG. 34. The case 51 is a box-like member, and FIG. 55 illustrates a flat plate-like portion, which is part of the case.

Disposing the case 51 in intimate contact on the second portion 31$b$ of the heat diffusion plate 31 brings about the effect of further improving the heat radiation capability, in addition to the effects of Embodiment 5.

Variation 3

Figure 56:
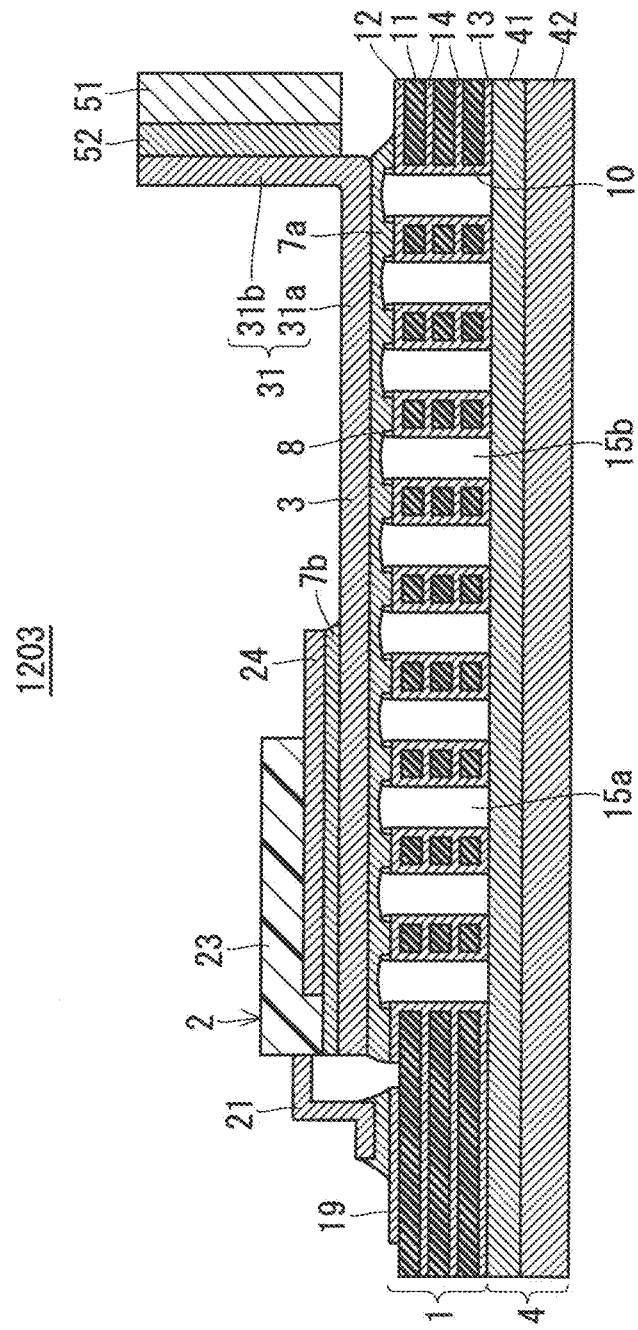
FIG. 56 is a sectional view illustrating a configuration of a semiconductor device according to Variation 3 of Embodiment 12 of the present invention.

FIG. 56 is a sectional view illustrating a configuration of a semiconductor device 1203 according to Variation 3 of Embodiment 12. As illustrated in FIG. 56, the semiconductor device 1203 differs from the semiconductor device 500 according to Embodiment 5 in that a heat radiation member 52 and the case 51 are disposed in this order on the second portion 31$b$ of the heat diffusion plate 31 on the side opposite to the electronic component 2 in the semiconductor device 500 according to Embodiment 5 described with reference to FIG. 34.

The heat radiation member 52 is disposed in intimate contact with both of the case 51 and the second portion 31$b$ of the heat diffusion plate 31. The heat radiation member 52 is preferably a sheet-like member formed of a material similar to that of the heat radiation member 41 and having electrical insulating properties and excellent thermal conductivity.

In the case where the heat diffusion plate 31 and the case 51 are at different potentials, the heat radiation member 52 having electrical insulating properties is sandwiched therebetween in order to radiate the heat generated by the electronic component 2 with high efficiently from the heat diffusion plate 31 and the case 51 to the outside while preventing electrical short-circuit between the heat diffusion plate 31 and the case 51.

Note that the case 51 may be disposed in intimate contact with the heat diffusion plate 31 in the semiconductor device according to each embodiment, although not described above.

Embodiment 13

Figure 57:
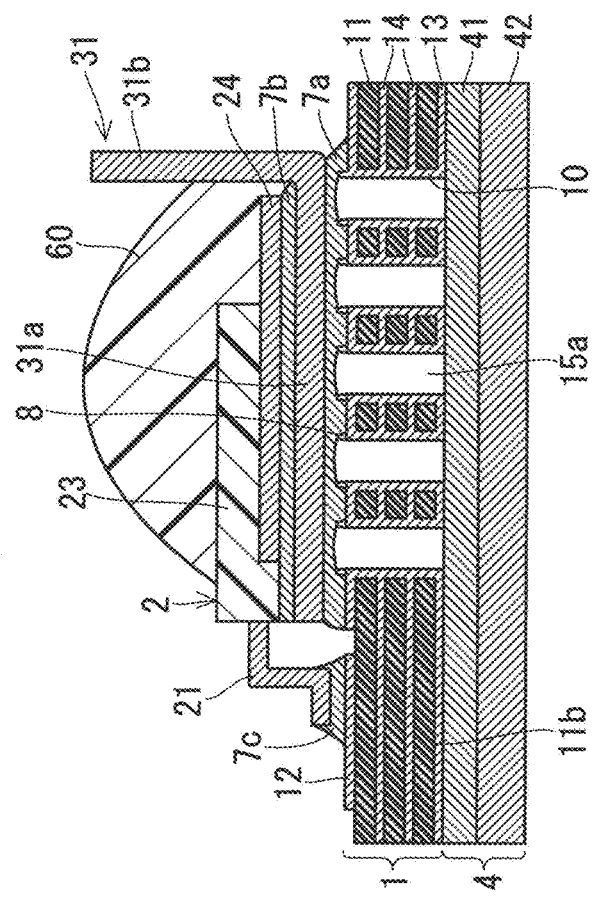
FIG. 57 is a sectional view illustrating a configuration of a semiconductor device according to Embodiment 13 of the present invention.

FIG. 57 is a sectional view illustrating a configuration of a semiconductor device 1300 according to Embodiment 13 of the present invention. As illustrated in FIG. 57, the semiconductor device 1300 includes a heat diffusion material 60 provided so as to cover at least part of the electronic component 2 and the heat diffusion part 3. In FIG. 57, constituent elements identical to those of the semiconductor device 501 described with reference to FIG. 35 are given the same reference signs, and redundant descriptions thereof will not be given.

The heat diffusion material 60 is preferably a material that has excellent electrical characteristics and mechanical characteristics, high thermal conductivity, and excellent heat radiation capability in portions where the heating value is high. The material also preferably has a low thermal expansion coefficient, excellent resistance to cracking, low viscosity, and favorable workability. The heat diffusion material 60 is selected from materials that exhibit effects, such as being capable of reducing the amount of warpage of substrates or the like as a result of a reduction in stress during heat curing, and achieving a low weight loss rate under high temperature storage, excellent heat resistance, a low impurity ion concentration, and excellent reliability.

As one example, potting materials formed of epoxy resins are given. Examples also include acrylic resins, silicon resins, urethane resins, polyurethane resins, epoxy resins, and fluorocarbon resins. Instead of the above-described materials, grease, an adhesive, or a heat radiation sheet may be used. The material is, however, not limited to these examples.

The presence of the heat radiation material 60 that covers at least part of the electronic component 2 and the heat diffusion part 3 makes it possible not only to efficiently conduct the heat generated by the electronic component 2 to the heat diffusion part 3, but also to improve the heat radiation capability of the heat diffusion material 60 and to achieve the effect of improving the insulating properties, moisture resistance, water resistance, chlorine resistance, and oil resistance of the covered portions of the printed circuit board 1 and the electronic component 2, and the effect of preventing, for example, the entry of dust.

In the sectional view in FIG. 57, the heat diffusion plate 31 bends at the boundary between the first portion 31a and the second portion 31b so as to change its direction of extension by about 90 degrees, and the heat diffusion material 60 is charged into the upper portion of the electronic component 2, which is covered with the resin molding part 23. The presence of the second portion 31b prevents the heat diffusion material 60 from flowing out to portions that are not ought to be charged. It is also possible to cover a specific portion or entirety of the electronic component 2 with a minimum amount of heat diffusion material 60. In this way, by using the heat diffusion plate 31 to cover the electronic component 2 with the heat diffusion material 60, it is possible to obtain a high heat radiation capability at low cost.

The above-described embodiments and variations included in the embodiments may be appropriately combined within the scope of not producing inconsistencies in technology.

The embodiments disclosed above are in all aspects illustrative and not restrictive. The scope of the present invention is what is given by the claims, not by the descriptions given above, and all variations and modifications of the claims within the scope of equivalency are intended to fall within the scope of the invention.

The invention claimed is:

1. A semiconductor device comprising:
   a printed circuit board;
   a heat diffusion part bonded to a first main face of the printed circuit board with a first bonding material;
   an electronic component including a heat radiator plate bonded to the heat diffusion part with a second bonding material; and
   a heat radiation part disposed directly on a second main face of the printed circuit board,
   wherein the printed circuit board includes:
   an insulation layer;
   first and second conductor layers disposed respectively on first and second main faces of the insulation layer;
   a plurality of heat radiation vias penetrating from the first conductor layer to the second conductor layer on the insulation layer; and
   a conductor film covering inner walls of the plurality of heat radiation vias,
   the plurality of heat radiation vias is provided at positions overlapping the heat diffusion part and the electronic component in plan view viewed from the first main face of the printed circuit board, and
   the heat radiation part is disposed overlapping at least some of the plurality of heat radiation vias in plan view viewed from the second main face of the printed circuit board, and includes:
   a heat radiation member having electrical insulating properties and thermal conductivity; and
   a coolant having thermal conductivity, and
   the heat radiation member and the coolant are disposed on the second conductor layer of the printed circuit board.

2. The semiconductor device according to claim 1, wherein
   the printed circuit board further includes:
   projections provided on the first conductor layer and surrounding at least the plurality of heat radiation vias, and
   the heat diffusion part is disposed on the plurality of heat radiation vias provided with the projections.

3. The semiconductor device according to claim 1, wherein
   the first bonding material is charged in insides of at least some of the plurality of heat radiation vias to occupy one third or more of a volume of the insides.

4. The semiconductor device according to claim 1, wherein
   the second bonding material has a higher melting point than the first bonding material.

5. The semiconductor device according to claim 1, wherein
   the electronic component includes a surface-mounted type electronic component and has at least one lead terminal bonded to an electrode provided on the first main face of the printed circuit board as a same layer as the first conductor layer.

6. The semiconductor device according to claim 1, wherein
   the electronic component includes a through-hole-mounted type electronic component and has at least one lead terminal inserted into and bonded to a terminal hole that penetrates from the first main face to the second main face of the printed circuit board.

7. The semiconductor device according to claim 1, wherein
   the heat diffusion part includes a heat diffusion plate,
   the heat diffusion plate includes a first portion and a second portion,
   the first portion is provided along the first main face of the printed circuit board and bonded to the first main face with the first bonding material, and
   the second portion is provided integrally with the first portion and extends on a side opposite to the printed circuited board from at least one edge of the first portion.

8. The semiconductor device according to claim 1, wherein
   the heat diffusion part includes a heat diffusion plate,
   the heat diffusion plate has a stepped portion having a greater thickness than a remaining portion, and
   the electronic component has one end face engaging with the stepped portion.

9. The semiconductor device according to claim 1, wherein
- the heat diffusion part includes a heat diffusion plate,
- the heat diffusion plate has a first portion, a second portion, and a third portion,
- the first portion is provided along the first main face of the printed circuit board and bonded to the first main face with the first bonding material,
- the second portion is provided integrally with the first portion and extends on a side opposite to the printed circuit board from two opposing edges of the first portion, and
- the third portion extends from the second portion toward the electronic component in a direction along the first main face and covers at least part of the electronic component.

10. The semiconductor device according to claim 1, wherein
- the insulation layer of the printed circuit board includes a filler and a resin.

11. The semiconductor device according to claim 1, wherein
- the first conductor layer of the printed circuit board has a groove provided across adjacent heat radiation vias in plan view viewed from the first main face of the printed circuit board.

12. The semiconductor device according to claim 1, wherein
- the heat diffusion part includes a plurality of heat diffusion plates, and
- the electronic component is disposed across over the plurality of heat diffusion plates.

13. The semiconductor device according to claim 1, further comprising
- a plurality of other electronic components different from the electronic component, and
- the electronic component and the plurality of other electronic components are disposed on the heat diffusion part at intervals in plan view viewed from the first main face of the printed circuit board.

14. The semiconductor device according to claim 9, further comprising:
- a case provided in contact with the third portion of the heat diffusion plate and having thermal conductivity to protect the semiconductor device as a whole.

15. The semiconductor device according to claim 7, further comprising:
- a case provided in contact with a face of the second portion of the heat diffusion plate on a side opposite to the electronic component and having thermal conductivity.

* * * * *